(12) United States Patent
Shimoichi et al.

(10) Patent No.: US 9,812,412 B2
(45) Date of Patent: Nov. 7, 2017

(54) CHIP PART HAVING PASSIVE ELEMENTS ON A COMMON SUBSTRATE

(71) Applicant: ROHM CO., LTD., Kyoto (JP)

(72) Inventors: Takuma Shimoichi, Kyoto (JP); Yasuhiro Kondo, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 14/980,404

(22) Filed: Dec. 28, 2015

(65) Prior Publication Data

US 2016/0190076 A1 Jun. 30, 2016

(30) Foreign Application Priority Data

Dec. 25, 2014 (JP) ................. 2014-262842

(51) Int. Cl.
*H01L 23/66* (2006.01)
*H01L 49/02* (2006.01)
*H01L 27/01* (2006.01)

(52) U.S. Cl.
CPC ............ *H01L 23/66* (2013.01); *H01L 27/016* (2013.01); *H01L 28/10* (2013.01); *H01L 28/20* (2013.01); *H01L 28/60* (2013.01); *H01L 2223/6672* (2013.01); *H01L 2924/0002* (2013.01)

(58) Field of Classification Search
CPC ..... H01L 27/01; H01L 27/013; H01L 27/016; H01L 28/10; H01L 28/20; H01L 28/60; H01L 2223/6672; H01L 2924/0002
See application file for complete search history.

(56) References Cited

U.S. PATENT DOCUMENTS

2002/0084516 A1* 7/2002 Efland ................. H01L 23/5286
257/666
2009/0109725 A1* 4/2009 Schulte .................. G11C 17/16
365/96
2012/0175731 A1* 7/2012 Chen ..................... H01L 27/016
257/531

FOREIGN PATENT DOCUMENTS

JP H09-199365 A 7/1997

* cited by examiner

*Primary Examiner* — Charles Garber
*Assistant Examiner* — Brigitte Paterson
(74) *Attorney, Agent, or Firm* — Rabin & Berdo, P.C.

(57) ABSTRACT

A chip part includes a substrate, a first electrode and a second electrode which are formed apart from each other on the substrate and a circuit network which is formed between the first electrode and the second electrode. The circuit network includes a first passive element including a first conductive member embedded in a first trench formed in the substrate and a second passive element including a second conductive member formed on the substrate outside the first trench.

22 Claims, 55 Drawing Sheets

FIG. 8

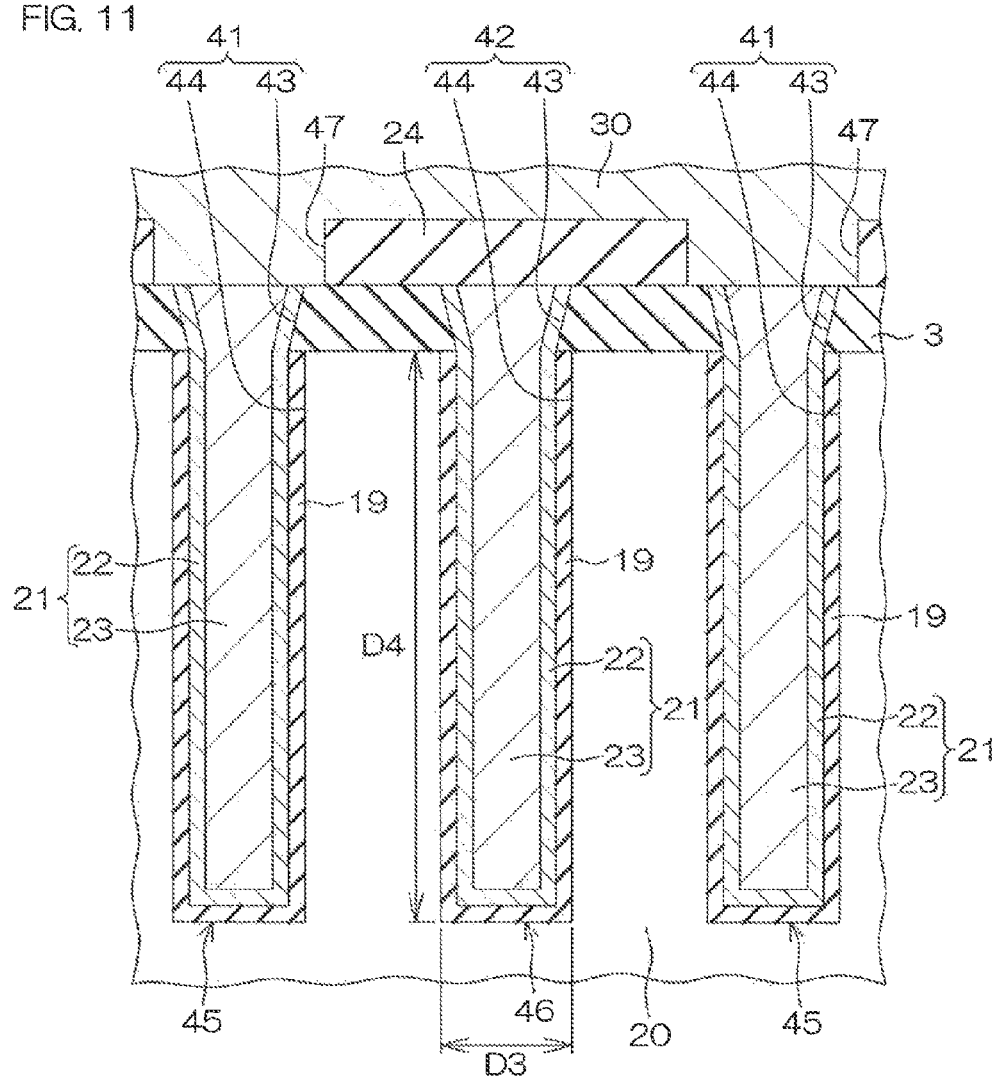

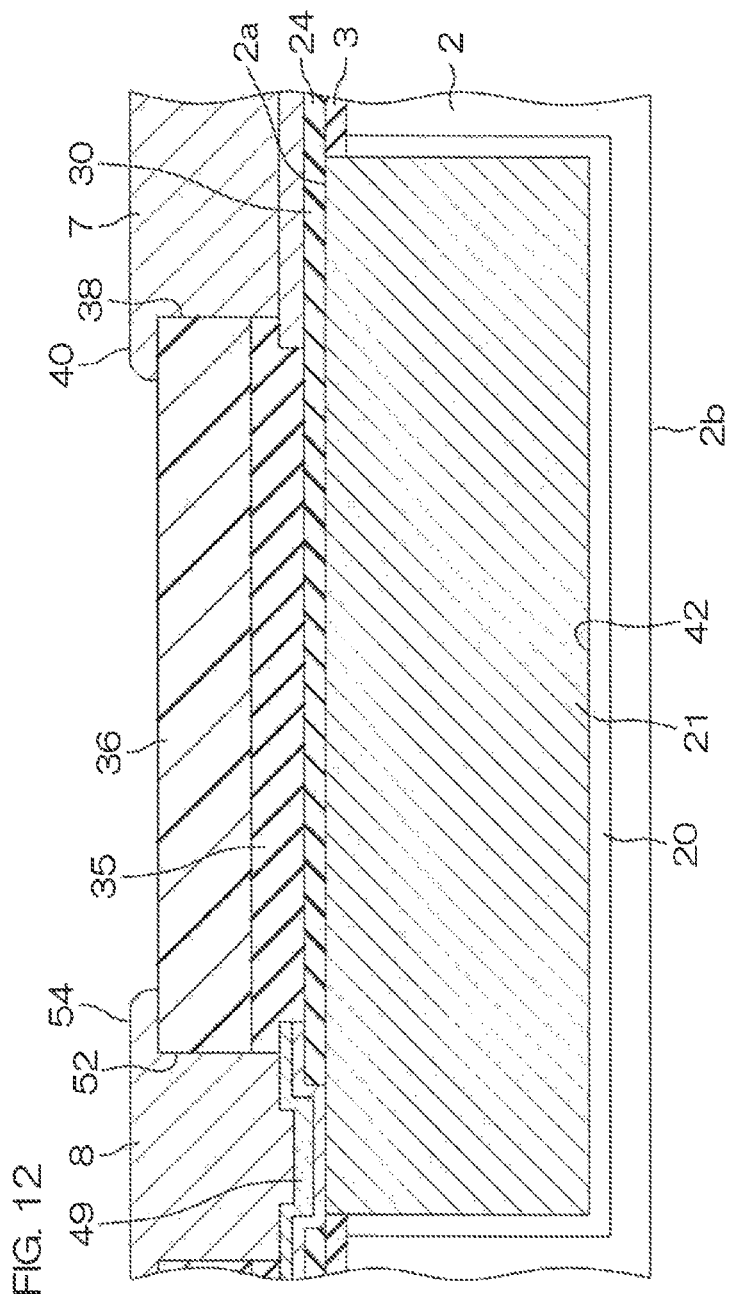

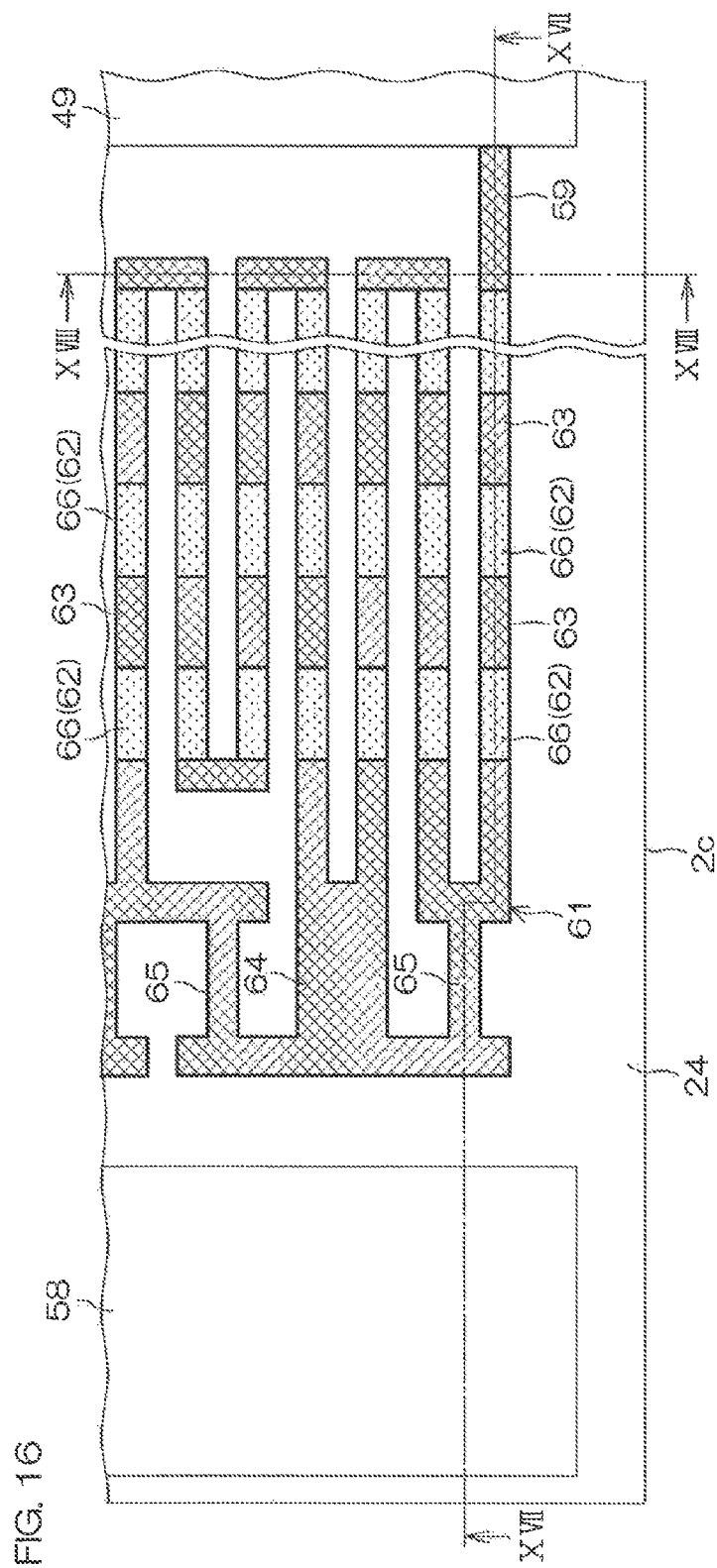

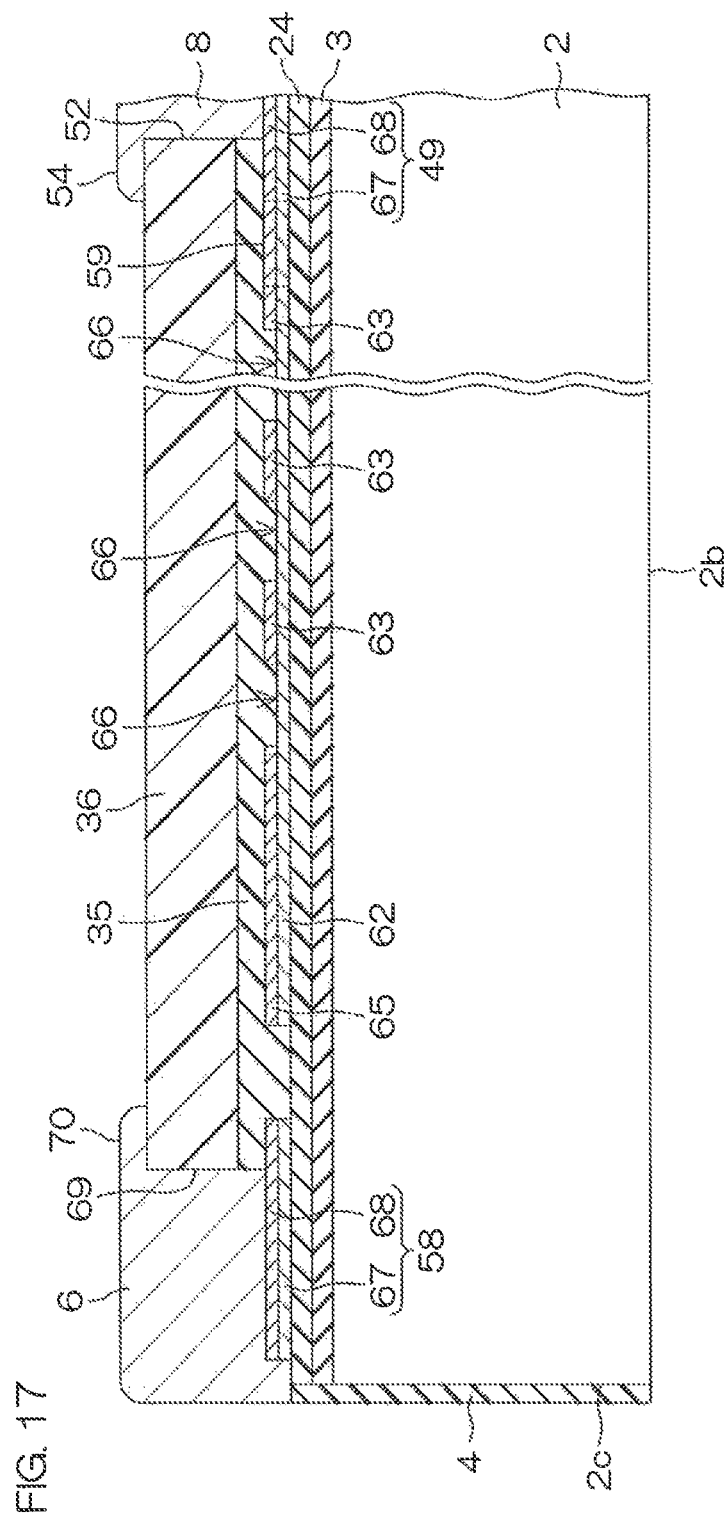

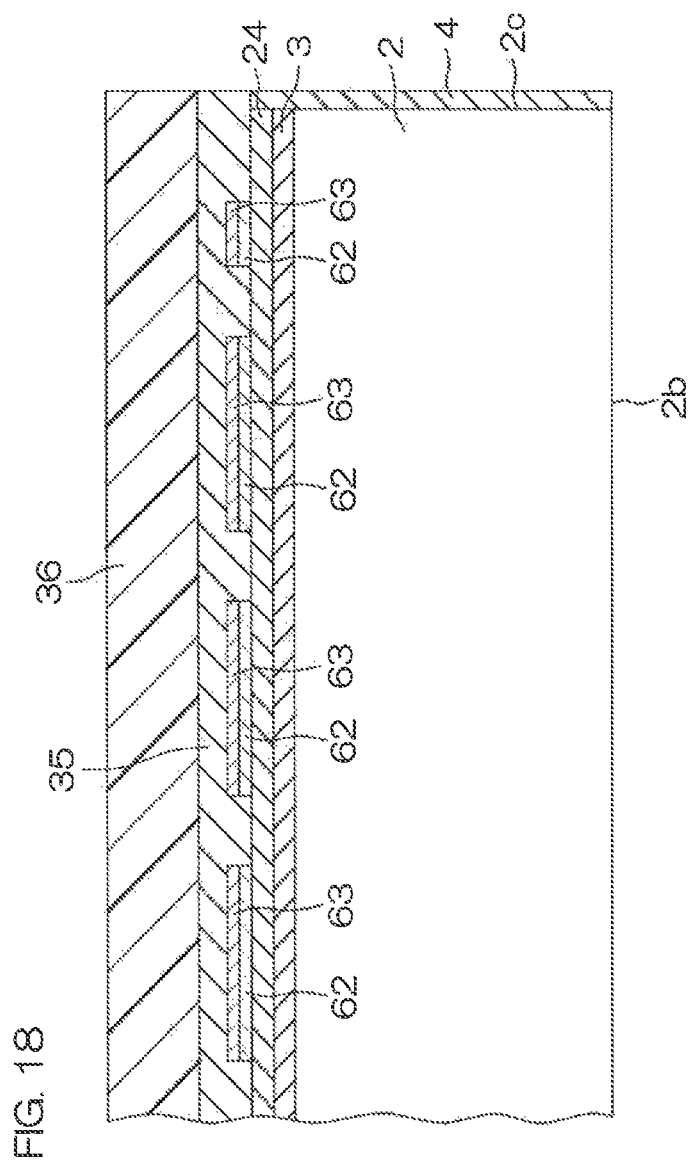

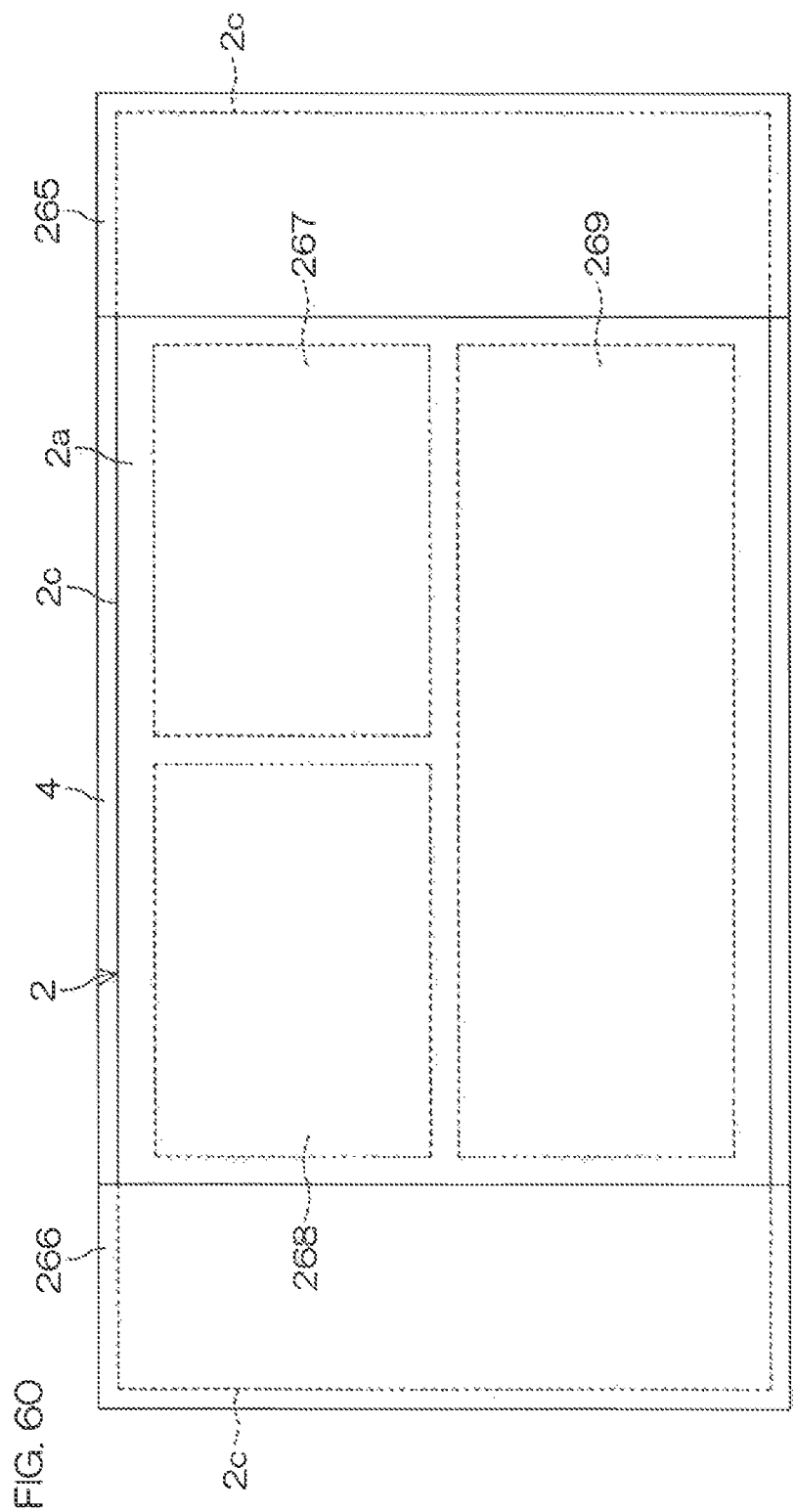

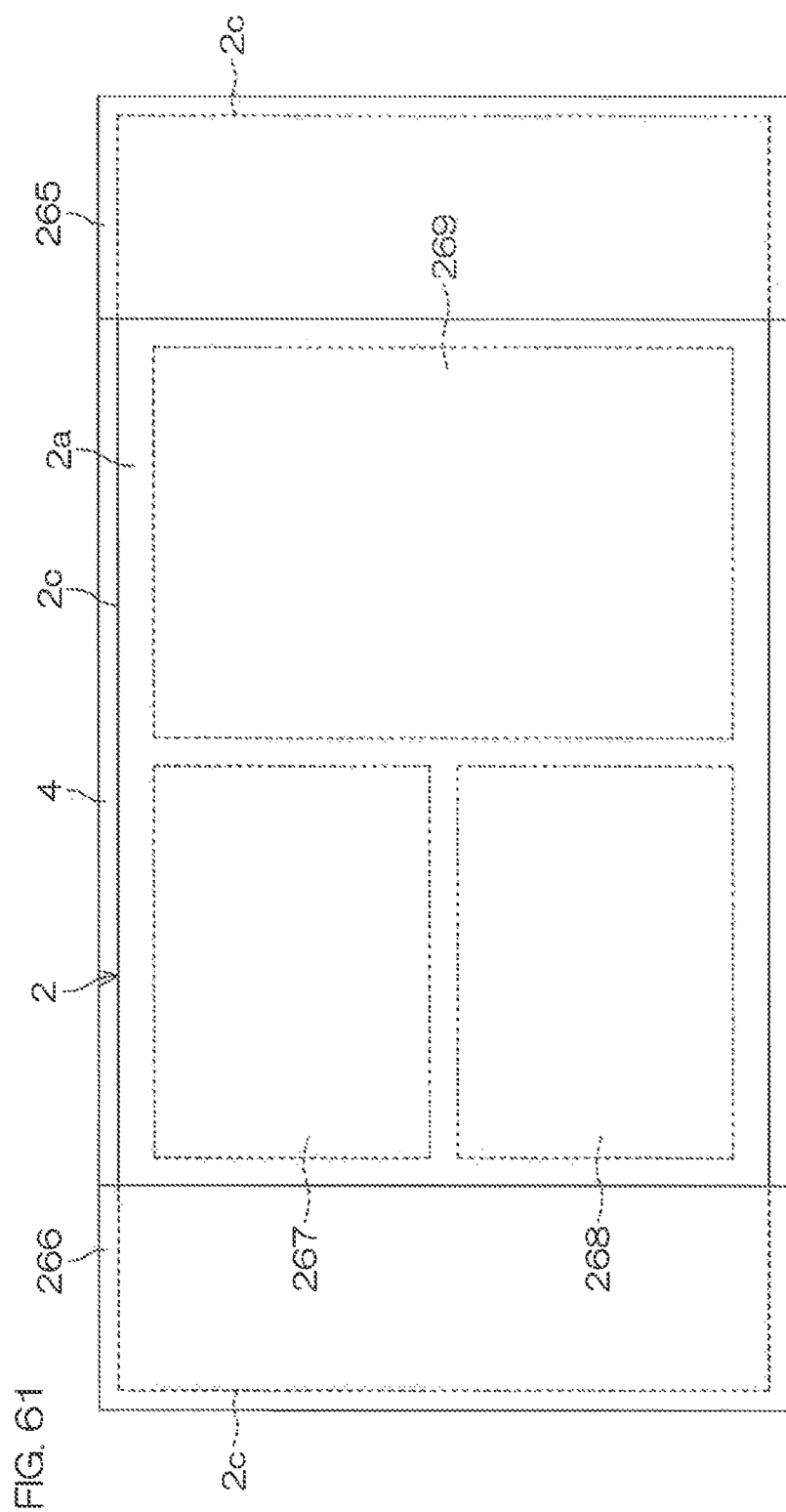

CHIP PART HAVING PASSIVE ELEMENTS ON A COMMON SUBSTRATE

BACKGROUND OF THE INVENTION

1. Field of the Invention

The present invention relates to a chip part in which a passive element is formed on a substrate.

2. Description of the Related Art

Japanese Patent Application Publication No. 9-199365 discloses an inductor in which a conductor pattern is formed in a spiral shape on a substrate. The spiral conductor pattern disclosed in this document is formed by forming a conductor film on the substrate and thereafter patterning the conductor film in a spiral shape by etching.

SUMMARY OF THE INVENTION

A preferred embodiment of the present invention provides a chip part that includes a substrate, a first electrode and a second electrode which are formed apart from each other on the substrate and a circuit network which is formed between the first electrode and the second electrode. The circuit network includes a first passive element including a first conductive member embedded in a trench formed in the substrate and a second passive element including a second conductive member formed on the substrate outside the trench.

The object, the features described above or still other features and effects in the present invention will be more apparent from the following description of preferred embodiments with reference to the accompanying drawings.

BRIEF DESCRIPTION OF THE DRAWINGS

FIG. 8 is an enlarged plan view showing a first capacitor region of the chip part shown in FIG. 1.

FIG. 11 is an enlarged cross-sectional view of an internal electrode formation trench shown in FIG. 9.

FIG. 12 is a cross-sectional view taken along line XII-XII shown in FIG. 8.

FIG. 16 is a partially enlarged plan view of an element shown in FIG. 15.

FIG. 17 is a cross-sectional view taken along line XVII-XVII shown in FIG. 16.

FIG. 18 is a cross-sectional view taken along line XVIII-XVIII shown in FIG. 16.

FIG. 60 is a plan view showing an example of the arrangement of a passive element region.

FIG. 61 is a plan view showing another example of the arrangement of the passive element region.

DETAILED DESCRIPTION OF THE PREFERRED EMBODIMENTS

Figure 1:
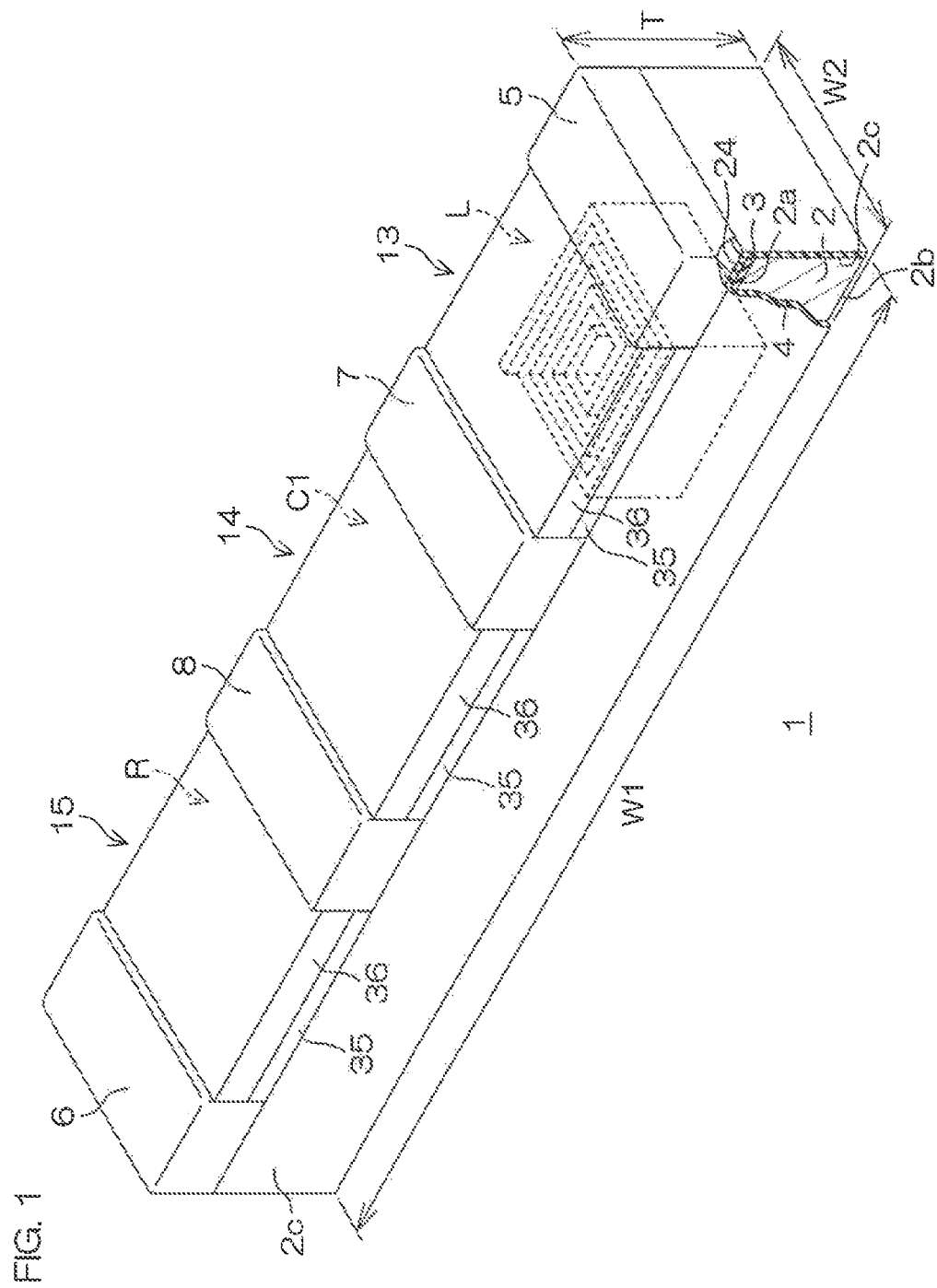
FIG. 1 is a partially cut-away perspective view of a chip part according to a first preferred embodiment of the present invention.

A chip part according to a preferred embodiment of the present invention includes a substrate, a first electrode and a second electrode formed apart from each other on the substrate and a circuit network formed between the first electrode and the second electrode. The circuit network includes a first passive element including a first conductive member embedded in a first trench formed in the substrate and a second passive element including a second conductive member formed outside the first trench on the substrate.

In this arrangement, the first conductive member embedded in the first trench formed in the substrate is utilized to form the first passive element, and the second conductive member on the substrate is used to form the second passive element. As described above, an internal region of the substrate and a region on the surface of the substrate are respectively utilized as regions for forming the first passive element and the second passive element, and thus it is possible to provide, on the common substrate, a chip part that includes a plurality of passive elements. Moreover, since the internal region of the substrate and the region on the surface of the substrate are respectively utilized, and thus it is possible to form the first passive element and the second passive element, it is possible to enhance the flexibility of the design of those passive elements.

Specifically, it is possible to acquire the significant flexibility of the arrangement of the first passive element and the second passive element, the form of connection between the first passive element and the second passive element and the first electrode and the second electrode and the like. In this way, for example, the circuit network connected between the first electrode and the second electrode can include a circuit in which the first passive element and the second passive element are connected in series or a circuit in which the first passive element and the second passive element are connected in parallel. In this way, it is possible to provide a composite element-type chip part that includes the circuit network including the first passive element and the second passive element.

The first trench may include a first coil formation trench that is formed, in plan view, in a spiral shape, and the first passive element may be a first coil that includes the first conductive member embedded in the first coil formation trench.

In this arrangement, it is possible to provide a chip part that includes, on the common substrate, a plurality of passive elements including the first coil formed within the substrate by utilizing the first coil formation trench that is formed, in plan view, in a spiral shape. As compared with a case where a coil is formed with a conductor film on the surface of a substrate, the winding wire of the first coil formed by utilizing the first conductive member within the trench can have a large cross-sectional area (cross-sectional area perpendicularly intersecting the spiral direction of the winding wire), and thus it is possible to reduce the internal resistance of the first coil. In this way, it is possible to enhance the Q value (Quality Factor) of the first coil. Hence, it is possible to provide a chip part that includes, on the common substrate, a plurality of passive elements including a coil of excellent properties. The first coil formation trench is formed in the substrate, the conductive member is embedded within the first coil formation trench and thus the winding wire of the first coil can be formed, with the result that it is easy to manufacture the first coil.

The first trench may include a first internal electrode formation trench and a second internal electrode formation trench that is formed in plan view apart from the first internal electrode formation trench. In this case, the first passive element may be a first capacitor that may include a first internal electrode formed with the first conductive member embedded in the first internal electrode formation trench and a second internal electrode formed with the first conductive member embedded in the second internal electrode formation trench.

In this arrangement, it is possible to provide a chip part that includes, on the common substrate, a plurality of passive elements which includes the first capacitor formed within the substrate by utilizing the first internal electrode formation trench and the second internal electrode formation trench. In this arrangement, the first internal electrode and the second internal electrode can be opposite to each other in a direction perpendicularly intersecting the direction of the thickness of the substrate. Thus, it is possible to increase the area of the opposite surfaces of the first internal electrode and the second internal electrode without increasing the area of the surface of the substrate. In this way, since it is possible to increase the capacitance of the first capacitor without significantly increasing the size of a chip part, it is possible to provide the chip part that includes, on the common substrate, a plurality of passive elements including the capacitor having a large capacitance.

The first internal electrode and the second internal electrode preferably have opposite surfaces parallel to each other. In this way, it is possible to increase the capacitance of the first capacitor without occupying a large area on the substrate. Hence, a plurality of passive elements including a capacitor having a large capacitance are provided on the common substrate, and it is possible to provide a small-sized chip part.

The second conductive member may include a resistor portion conductive member film, and the second passive element may be a resistor portion that has such a resistor portion conductive member film. In this arrangement, it is possible to provide a chip part that includes, on the common substrate, a plurality of passive elements including a resistor portion formed with the resistor portion conductive member film on the surface of the substrate. Since the resistor portion conductive member film is formed on the substrate, and thus it is easy to manufacture the resistor portion, it is possible to manufacture a chip part that includes, on the common substrate, a plurality of passive elements including the resistor portion without need to provide a complicated manufacturing process.

The resistor portion conductive member film may include a resistive film formed on the substrate and a plurality of conductor films formed apart on the resistive film, and in this case, the resistive film of a portion exposed between the conductor films adjacent to each other may form one resistor body. In this arrangement, the shape and/or the area of the resistive film exposed between the conductor films adjacent to each other is changed, and thus it is possible to change and adjust the resistance value of the resistor body. In the chip part including such a resistor portion, by combination with the second passive element, it is possible to realize electrical circuits having various electrical characteristics. In this way, it is possible to use, in common, the manufacturing process of the composite element-type chip parts that can achieve various electrical characteristics, to manufacture them and to provide them.

A plurality of resistor bodies described above that have an equal resistance value may be aligned in a matrix on the substrate. The second passive element may further include a fuse portion that can be blown so as to electrically connect at least one of a plurality of the resistor bodies to the first electrode and the second electrode or so as to electrically separate the at least one of the plurality of the resistor bodies from the first electrode and the second electrode. In this arrangement, it is possible to change and adjust the resistance value depending on whether or not the fuse portion is blown without changing the basic design of the chip part. In this way, it is possible to provide a composite element-type chip part that can easily incorporate a desired electrical characteristic.

The second conductive member may include a first electrode film. In this case, the second passive element may be a second capacitor that includes the first electrode film, a first dielectric film formed on the first electrode film and a second electrode film formed on the first dielectric film.

In this arrangement, it is possible to provide a chip part that includes, on the common substrate, a plurality of passive elements including the second capacitor. The first electrode film, the first dielectric film and the second electrode film are sequentially formed on the surface of the substrate, thus it is easy to manufacture the second capacitor and it is easy to manufacture a composite element-type chip part accordingly.

The first passive element and the second passive element may be aligned in a direction in which the first electrode and the second electrode are opposite to each other. The first passive element and the second passive element may be aligned in a direction intersecting a direction in which the first electrode and the second electrode are opposite to each other.

The circuit network may further include a third passive element that includes a third conductive member embedded in a second trench formed in the substrate. In this arrangement, it is possible to provide a composite element-type chip part that includes the first passive element, the second passive element and the third passive element.

The second trench may include a second coil formation trench that is formed, in plan view, in a spiral shape, and the third passive element may be a second coil including the third conductive member embedded in the second coil formation trench. In this arrangement, it is possible to provide a chip part that includes, on the common substrate, a plurality of passive elements including the second coil that is formed within the substrate by utilizing the second coil formation trench formed, in plan view, in a spiral shape.

The second trench may include a third internal electrode formation trench and a fourth internal electrode formation trench formed in plan view apart from the third internal electrode formation trench. In this case, the third passive element may be a third capacitor that includes a third internal electrode formed with the third conductive member embedded in the third internal electrode formation trench and a fourth internal electrode formed with the third conductive member embedded in the fourth internal electrode formation trench. In this arrangement, it is possible to provide a chip part that includes, on the common substrate, a plurality of passive elements including the third capacitor which is formed within the substrate by utilizing the third internal electrode formation trench and the fourth internal electrode formation trench.

The first passive element, the second passive element and the third passive element may be aligned in the direction in which the first electrode and the second electrode are opposite to each other. In this case, the first passive element, the second passive element and the third passive element may be connected in series.

The first passive element, the second passive element and the third passive element may be aligned in a direction intersecting the direction in which the first electrode and the second electrode are opposite to each other. In this case, the first passive element may include one end that can be electrically connected to the first electrode and the other end that can be electrically connected to the second electrode, the second passive element may include one end that can be electrically connected to the first electrode and the other end that can be electrically connected to the second electrode, the third passive element may include one end that can be electrically connected to the first electrode and the other end that can be electrically connected to the second electrode and a first internal connection portion that connects, on the substrate, at least two of the one ends of the first passive element, the second passive element and the third passive element and that is electrically connected to the first electrode and a second internal connection portion that connects, on the substrate, at least two of the other ends of the first passive element, the second passive element and the third passive element and that is electrically connected to the second electrode may be included.

In this arrangement, the form of the connection of the first passive element, the second passive element and the third passive element can be easily changed with the first internal connection portion and the second internal connection portion. In this way, as the circuit network connected between the first electrode and the second electrode, various types of connection forms can be adopted such as a series circuit, a parallel circuit and a bridge circuit including the first passive element, the second passive element and the third passive element.

The chip part may further include an insulating film that is formed on the substrate so as to cover the first passive element, and in this case, the second passive element is preferably formed on the insulating film. In this arrangement, since a region where the first passive element is formed and a region where the second passive element is formed can be partitioned through the insulating film, the first passive element and the second passive element can be formed without significantly interfering with each other.

The insulating film preferably has a flat surface. In this arrangement, on the insulating film, the second passive element can be formed satisfactorily. The insulating film may include a USG film (Undoped Silica Glass film) or an SOG film (Spin-On-Glass film). The insulating film may have a thickness of 8000 to 15000 angstroms.

At least a portion (a portion or the whole) of the second passive element may be formed, in plan view, in a region overlapping the region where the first passive element is formed. In this arrangement, it is possible to provide a composite element-type chip part having a laminated structure in which the first passive element and the second passive element are laminated partially or as a whole. Since it is possible to reduce the area of the substrate by the laminated structure, though the chip part is a composite element-type, it is possible to provide the chip part having a small mounting space. It is also possible to increase the number of chip parts obtained from one base substrate (original substrate including a plurality of chip parts before being separated into individual pieces).

A chip part according to another preferred embodiment of the present invention includes a substrate, a coil that includes a coil conductive member embedded in a coil formation trench which is formed in the substrate, in plan view, in a spiral shape and a resistor portion that includes a resistor portion conductive member formed outside the coil formation trench on the substrate.

In this arrangement, it is possible to provide a chip part that includes an LR circuit in which a coil and a resistor portion are formed on the common substrate.

The chip part may further include a capacitor that includes a first internal electrode which is formed with a first capacitor conductive member embedded in a first internal electrode formation trench formed in the substrate and a second internal electrode which is formed with a second capacitor conductive member embedded in a second internal electrode formation trench formed, in a plan view, in the substrate apart from the first internal electrode formation trench.

In this arrangement, it is possible to provide a chip part that includes an LRC circuit in which a coil, a resistor portion and a capacitor are formed on the common substrate.

A chip part according to still another preferred embodiment of the present invention includes a substrate, a first passive element that includes a first conductive member embedded in a trench formed in the substrate, a first insulating film that is formed on the substrate so as to cover the first passive element and a second passive element that includes a second conductive member which is formed on the first insulating film and at least part of which is laminated on the first passive element through the first insulating film.

In this arrangement, it is possible to provide a chip part having a laminated structure in which part or the whole of the second passive element is laminated on the first passive element through the first insulating film. Since it is possible to reduce the area of the substrate by the laminated structure, it is possible to reduce the mounting space of the composite element-type chip part. It is also possible to increase the number of chip parts obtained from one base substrate (original substrate including a plurality of chip parts before being separated into individual pieces).

The chip part may further include a second insulating film that is formed on the first insulating film so as to cover the second passive element and a third passive element that includes a third conductive member which is formed on the second insulating film and at least a portion of which is laminated on the second passive element through the second insulating film. In this arrangement, it is possible to provide a chip part having a laminated structure in which a portion or the whole of the third passive element is laminated on the second passive element through the second insulating film.

More specific preferred embodiments of the present invention will be described in detail below with reference to accompanying drawings.

First Preferred Embodiment

Figure 2:
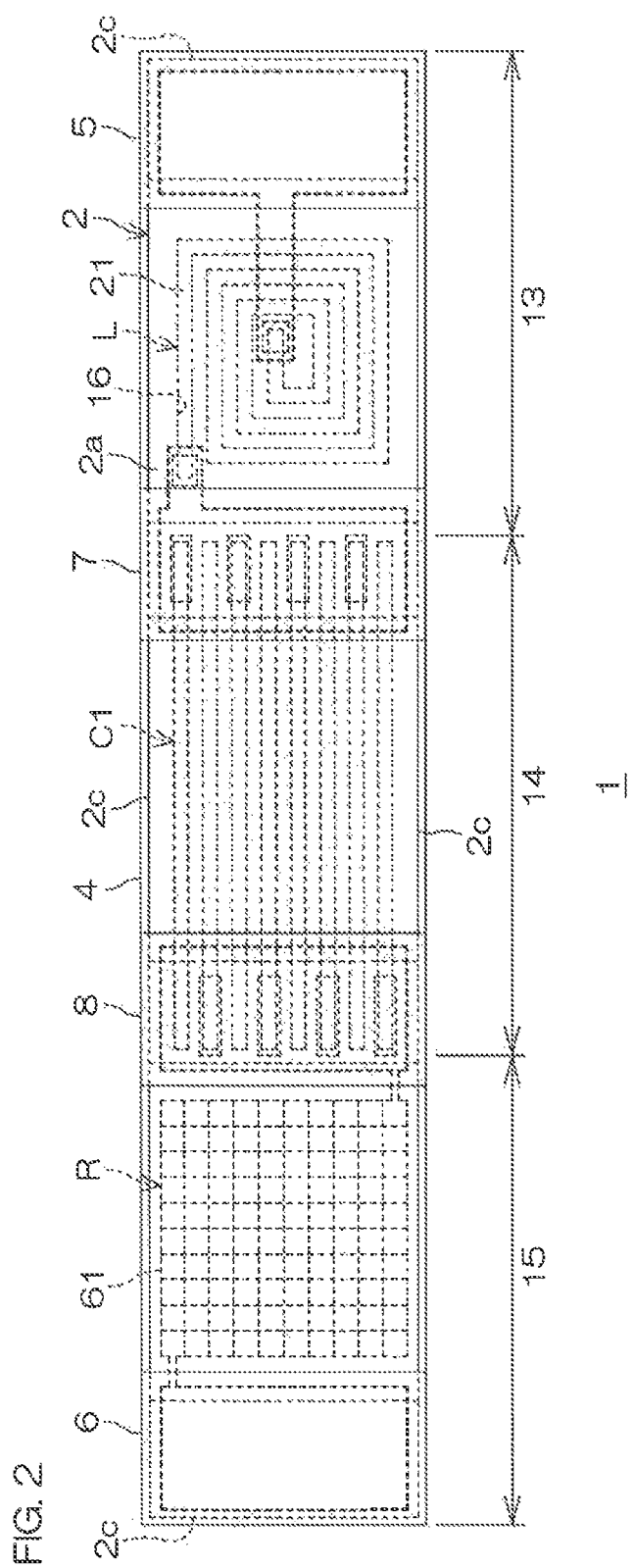
FIG. 2 is a plan view of the chip part shown in FIG. 1.

FIG. 1 is a partially cut-away perspective view of a chip part 1 according to a first preferred embodiment of the present invention. FIG. 2 is a plan view of the chip part 1 shown in FIG. 1.

As shown in FIG. 1, the chip part 1 is formed in the shape of a rectangular parallelepiped. The planar shape of the chip part 1 is rectangular, and a length W1 in the longitudinal direction thereof may be 1.0 to 1.2 mm, and a length W2 in the widthwise direction may be about 0.2 mm. The entire thickness T of the chip part 1 may be about 0.15 mm.

The chip part 1 includes a substrate 2 in the shape of a rectangular parallelepiped. The substrate 2 includes a pair of main surfaces 2a and 2b and four side surfaces 2c. One (the main surface 2a on the upper surface side of FIG. 1) of the pair of main surfaces 2a and 2b is an element formation surface. Hereinafter, the main surface 2a is referred to as an "element formation surface 2a," and the main surface 2b on the opposite side to the element formation surface 2a is referred to as a "back surface 2b." The surface (the element formation surface 2a) of the substrate 2 is covered by an insulating film 3. The four side surfaces 2c of the substrate 2 and the peripheral portion of the insulating film 3 are covered by a passivation film 4. The passivation film 4 may be a nitride film or the like.

On the substrate 2, a first external electrode 5 (first electrode) and a second external electrode 6 (second electrode) are formed apart from each other. The first external electrode 5 is arranged at one end portion of the substrate 2. The second external electrode 6 is arranged on the other end portion of the substrate 2. Between the first external electrode 5 and the second external electrode 6, a first intermediate external electrode 7 and a second intermediate external electrode 8 are arranged apart from each other. The first external electrode 5, the second external electrode 6, the first intermediate external electrode 7 and the second intermediate external electrode 8 are individually formed, in plan view, in the shape of a rectangle, and they are evenly spaced. The first external electrode 5, the second external electrode 6, the first intermediate external electrode 7 and the second intermediate external electrode 8 may be, for example, a Ni/Pd/Au laminated film that includes a Ni film, a Pd film formed on the Ni film and an Au film formed on the Pd film.

As shown in FIGS. 1 and 2, in this preferred embodiment, a plurality of passive element regions where passive elements are formed are aligned along a direction in which the first external electrode 5 and the second external electrode 6 are opposite to each other. More specifically, the passive element region is set in each of the regions between the first external electrode 5 and the first intermediate external electrode 7, the region between the first intermediate external electrode 7 and the second intermediate external electrode 8 and the region between the second intermediate external electrode 8 and the second external electrode 6.

The passive element region is a region to which any one of a coil region 13 where a coil L is formed as an example of the passive element, a first capacitor region 14 where a first capacitor C1 is formed as an example of the passive element and a resistance region 15 where a resistor portion R is formed as an example of the passive element is applied. In this preferred embodiment, an example is shown where the coil region 13 is set in the region between the first external electrode 5 and the first intermediate external electrode 7, the first capacitor region 14 is set in the region between the first intermediate external electrode 7 and the second intermediate external electrode 8 and the resistance region 15 is set in the region between the second intermediate external electrode 8 and the second external electrode 6.

<Coil Region 13>

Figure 3:
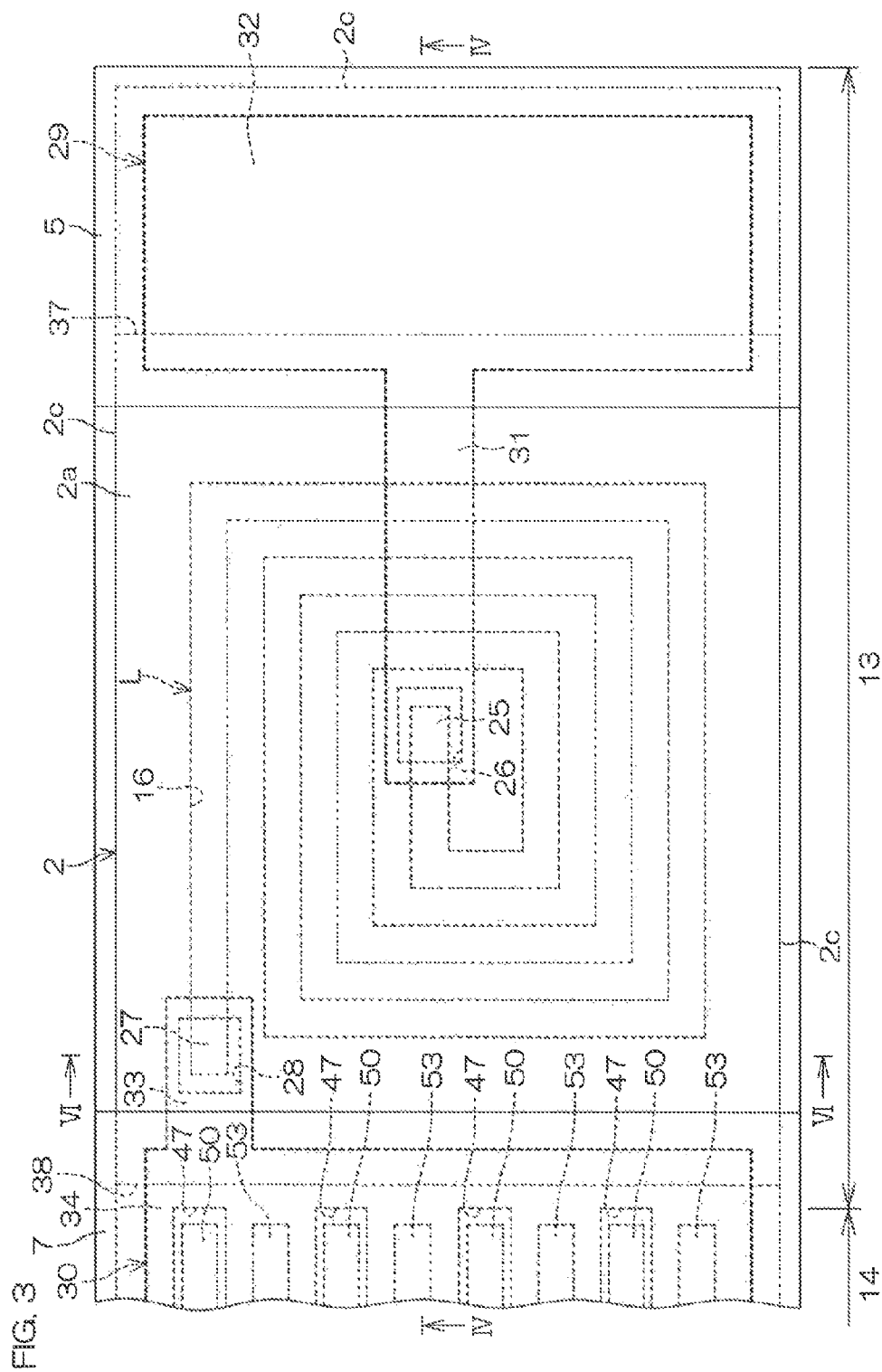
FIG. 3 is an enlarged plan view showing a coil region of the chip part shown in FIG. 1.
Figure 4:
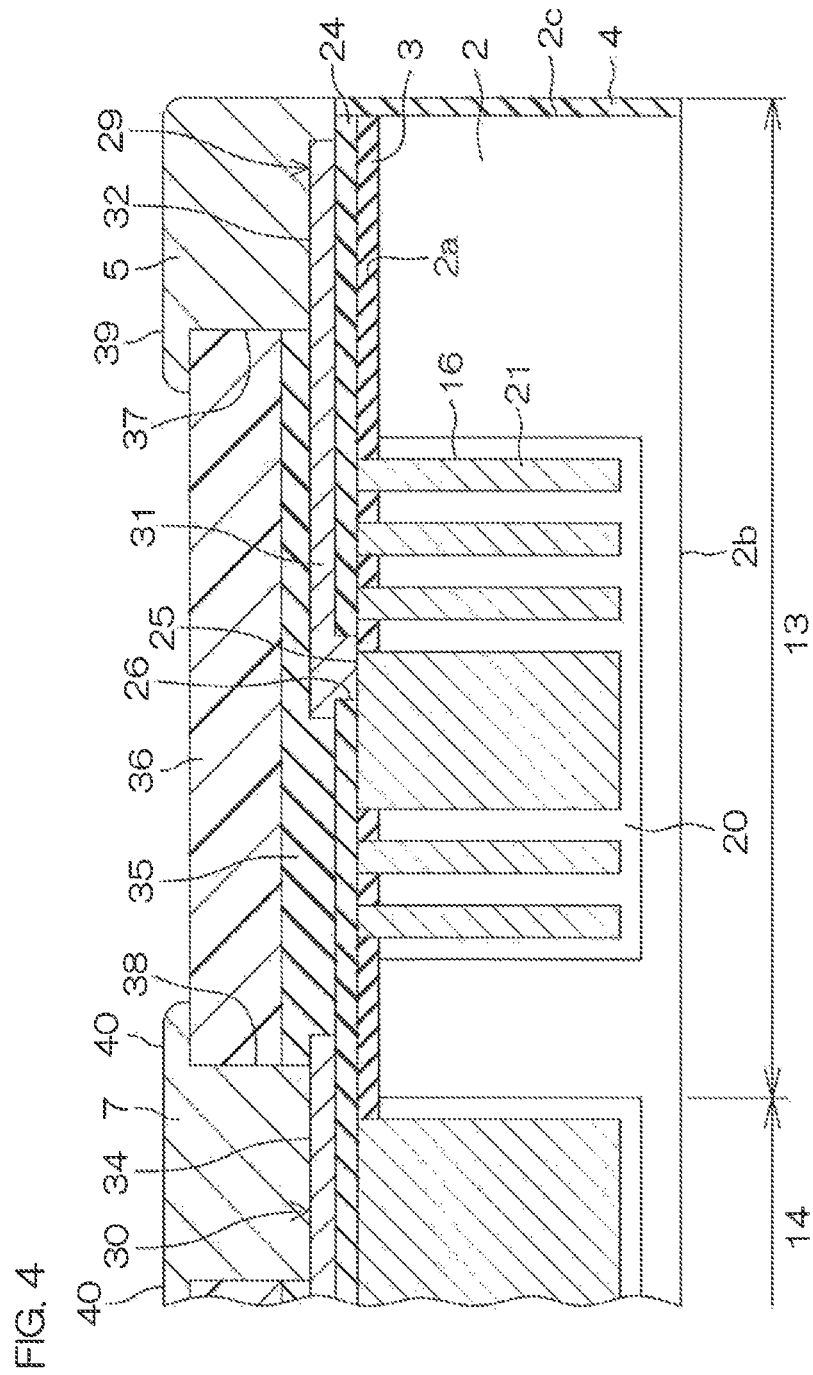
FIG. 4 is a cross-sectional view taken along line IV-IV shown in FIG. 3.
Figure 5:
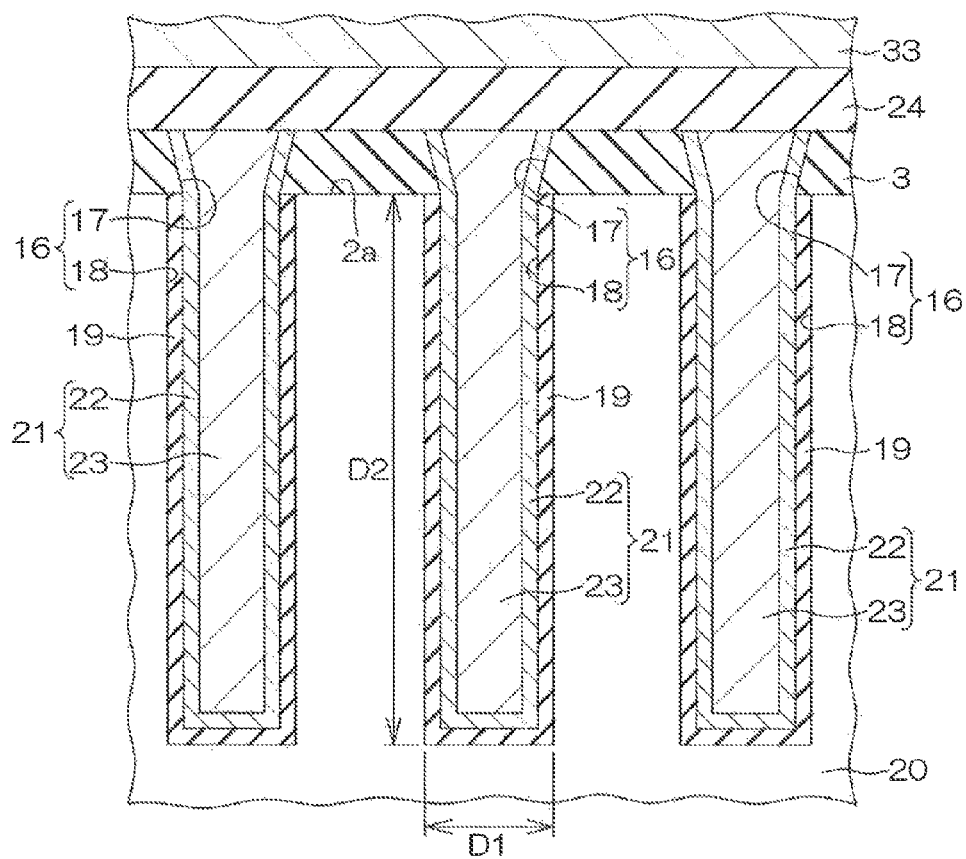
FIG. 5 is an enlarged cross-sectional view of a coil formation trench shown in FIG. 4.
Figure 6:
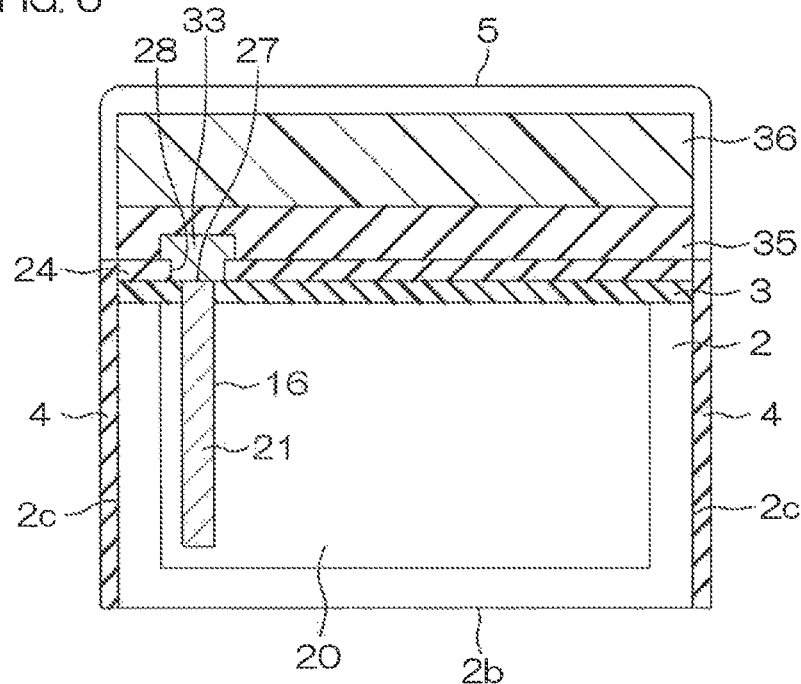
FIG. 6 is a cross-sectional view taken along line VI-VI shown in FIG. 3.

FIG. 3 is an enlarged plan view showing the coil region of the chip part 1 shown in FIG. 1. FIG. 4 is a cross-sectional view taken along line IV-IV shown in FIG. 3. FIG. 5 is an enlarged cross-sectional view of a coil formation trench 16 shown in FIG. 4. FIG. 6 is a cross-sectional view taken along line VI-VI shown in FIG. 3.

As shown in FIGS. 3 and 4, in the substrate 2 in the coil region 13, the coil formation trench 16 formed, in plan view, in a spiral shape is formed by being dug down from the element formation surface 2a to a predetermined depth. In this preferred embodiment, the coil formation trench 16 is formed, in plan view, in the shape of a square spiral, and includes a plurality of straight portions parallel to the side surfaces 2c of the substrate 2. The coil formation trench 16 may be formed, in plan view, in the shape of a circular spiral or may be formed, in plan view, in the shape of a polygonal spiral other than a square such as in plan view, in the shape of an octagonal spiral.

As shown in FIG. 5, with respect to a cross section in a direction perpendicularly intersecting the spiral direction of the coil formation trench 16, the cross section of the coil formation trench 16 is formed in the shape of a rectangle elongated in the direction of the thickness of the substrate 2. The width D1 of the coil formation trench 16 may be, for example, equal to or more than 3 μm but equal to or less than 10 μm. The depth D2 of the coil formation trench 16 may be, for example, equal to or more than 10 μm but equal to or less than 100 μm.

The coil formation trench 16 includes a first trench portion 17 which is formed in the insulating film 3 and a second trench portion 18 which is formed in the substrate 2 and which communicates with the first trench portion 17. In the inner surface of the coil formation trench 16 (the second trench portion 18) in the substrate 2, an inner surface insulating film 19 is formed. The inner surface insulating film 19 may be, for example, $SiO_2$. In this preferred embodiment, the entire wall sandwiched by the coil formation trench 16 (the second trench portion 18) in a spiral shape in the substrate 2 is an insulating film, and an insulator portion 20 is formed.

In the coil formation trench 16, a conductive member 21 (first conductive member) is embedded. The conductive member 21 includes a first conductive member layer 22 and a second conductive member layer 23. The first conductive member layer 22 is formed along the surface of the inner surface insulating film 19 and the surface of the first trench portion 17 of the coil formation trench 16. The first conductive member layer 22 may be, for example, a barrier metal layer containing titanium nitride (TiN). The film thickness of the first conductive member layer 22 may be about 400 to 500 angstroms. The second conductive member layer 23 is embedded in a concave space partitioned by the first conductive member layer 22. The second conductive member layer 23 may contain, for example, tungsten (W).

The coil L formed, in plan view, in a spiral shape (the shape of a square spiral) is formed with the conductive member 21 embedded in the coil formation trench 16. The coil L includes a plurality of plate-shaped portions parallel to the side surfaces 2c of the substrate 2.

As shown in FIG. 4, on the insulating film 3, a surface insulating film 24 is formed so as to cover the coil L. The surface insulating film 24 is formed in the shape of a rectangle which matches with the element formation surface 2a. The surface insulating film 24 includes a flat surface. The surface insulating film 24 includes, for example, a USG film (Undoped Silicate Glass film) or an SOG film (Spin-On-Glass film). The SOG film may be an inorganic SOG film containing $SiO_2$ and an inorganic material such as Hydrogen silsesquioxane (HSQ). The SOG film may be an organic SOG film containing $SiO_2$ and an organic material such as methyl silsesquioxane (MSQ). The surface insulating film 24 may have a thickness of 8000 to 15000 angstroms.

As shown in FIGS. 3 and 4, in the surface insulating film 24, a first coil contact hole 26 that exposes one end 25 (end portion located on the side of one end portion of the element formation surface 2a) of the coil L is formed. As shown in FIGS. 3 and 6, in the surface insulating film 24, a second coil contact hole 28 that exposes the other end 27 (end portion located on the opposite side of the one end 25 of the coil L) of the coil L is formed. In the surface of the surface insulating film 24, a first internal electrode film 29 and a second internal electrode film 30 are formed.

As shown in FIG. 3, the first internal electrode film 29 is arranged below the first external electrode 5. The first internal electrode film 29 includes a first drawing electrode 31 that is connected to the one end 25 of the coil L and a first pad 32 that is formed integrally with the first drawing electrode 31 and that is formed, in plan view, in the shape of a rectangle. The first drawing electrode 31 enters the first coil contact hole 26 from the surface of the surface insulating film 24 and is connected to the one end 25 of the coil L within the first coil contact hole 26. The first drawing electrode 31 is formed linearly so as to be passed on the one end 25 of the coil L to reach the first pad 32. The first internal electrode film 29 may include an aluminum film.

The second internal electrode film 30 is arranged below the first intermediate external electrode 7. The second internal electrode film 30 includes a second drawing electrode 33 that is connected to the one end 25 of the coil L and a second pad 34 that is formed integrally with the second drawing electrode 33 and that is formed, in plan view, in the shape of a rectangle. The second drawing electrode 33 enters the second coil contact hole 28 from the surface of the surface insulating film 24 and is connected to the other end 27 of the coil L within the second coil contact hole 28. The second drawing electrode 33 is formed linearly so as to be passed on the other end 27 of the coil L to reach the second pad 34. The second internal electrode film 30 may include an aluminum film.

The other end 27 of the coil L may be extended to a position below the second pad 34. In this case, since the second coil contact hole 28 can be formed in the second pad 34, the other end 27 of the coil L is connected to the second pad 34 without the intervention of the second drawing electrode 33.

As shown in FIG. 4, the first internal electrode film 29 and the second internal electrode film 30 is covered by a passivation film 35. The passivation film 35 may include a nitride film. On the passivation film 35, a resin film 36 such as polyimide is formed. In the passivation film 35 and the resin film 36, a first cutout portion 37 that exposes a region other than an edge portion of the first pad 32 on the side of the coil region 13 is formed. In the passivation film 35 and the resin film 36, a second cutout portion 38 that exposes a region other than an edge portion of the second pad 34 on the side of the coil region 13 and an edge portion on the side of the first capacitor region 14 is formed (also see FIG. 2).

As shown in FIG. 4. the first external electrode 5 is formed so as to fill the first cutout portion 37. The first external electrode 5 is formed so as to protrude from the resin film 36. The first external electrode 5 includes a covering portion 39 that is drawn out to the side of the coil region 13 along the surface of the resin film 36. In this preferred embodiment, the first external electrode 5 is formed so as to cover the first pad 32 exposed from the first cutout portion 37, the surface of the surface insulating film 24 and the upper end surface of the passivation film 4 on the side of one end portion of the substrate 2. The three side surfaces other than the side surface on the inner side of the first external electrode 5 are formed so as to be flush with the surface of the passivation film 4.

The first intermediate external electrode 7 is formed so as to fill the second cutout portion 38. The first intermediate external electrode 7 is formed so as to protrude from the resin film 36. The first intermediate external electrode 7 includes a covering portion 40 that is drawn out to the side of the coil region 13 and the side of the first capacitor region 14 along the surface of the resin film 36. In this preferred embodiment, the first intermediate external electrode 7 is formed so as to cover the second pad 34 exposed from the second cutout portion 38, the surface of the surface insulating film 24 and the upper end surface of the passivation film 4 on the side of the side surface 2c of the substrate 2. The first intermediate external electrode 7 is formed so as to be flush with the surface of the passivation film 4.

The passivation film 35 and the resin film 36 cover the coil L, the surface insulating film 24, the first internal electrode film 29 and the second internal electrode film 30, and function as protective films to protect them. On the other hand, the passivation film 4 functions as a protective film to protect the side surfaces 2c of the substrate 2 and the peripheral portion of the surface insulating film 24.

Figure 7:
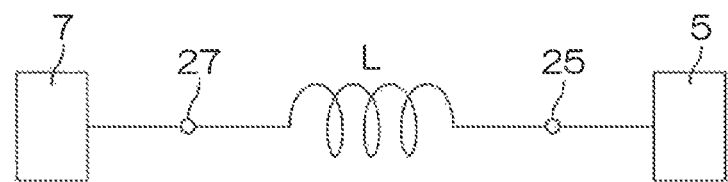
FIG. 7 is an electrical circuit diagram showing an example of an electrical structure of the coil region.

FIG. 7 is an electrical circuit diagram showing an example of an electrical structure of the coil region 13.

As shown in FIG. 7, the one end 25 of the coil L is connected to the first external electrode 5, and the other end 27 of the coil L is connected to the first intermediate external electrode 7. In this way, the coil L functions as a coil having a predetermined inductance.

As a parameter indicating the performance (quality) of the coil L, the Q value (Quality Factor) of the coil L is present. As the Q value is increased, loss is decreased, and as a high-frequency inductance, excellent characteristics are provided.

The Q value of the coil L is represented by formula (1) below.

$$Q=2\pi fL/R_L \qquad (1)$$

In the formula above, f represents the frequency of a current flowing through the coil L, L represents the inductance of the coil L and $R_L$ represents the internal resistance of the coil L.

As described above, in the coil region 13, the conductive member 21 is embedded in the coil formation trench 16 which is formed, in plan view, in a spiral shape in the substrate 2, and thus the coil L is formed. Since as compared with a case where a coil is formed with a conductor film on the surface of the substrate, the winding wire of the coil L formed by utilizing the conductive member 21 within the coil formation trench 16 can have a large cross-sectional area (cross-sectional area perpendicularly intersecting the spiral direction of the winding wire), it is possible to reduce the internal resistance $R_L$ of the coil L. In this way, it is possible to enhance the Q value of the coil L. The coil formation trench 16 is formed in the substrate 2, the conductive member 21 is embedded within the coil formation trench 16 and thus the winding wire of the coil L can be formed, with the result that it is easy to manufacture the coil L.

Since the conductive member 21 is embedded in the coil formation trench 16 formed in the substrate 2, and thus the coil L can be formed, it is easy to manufacture the coil L.

<First Capacitor Region 14>

Figure 8:
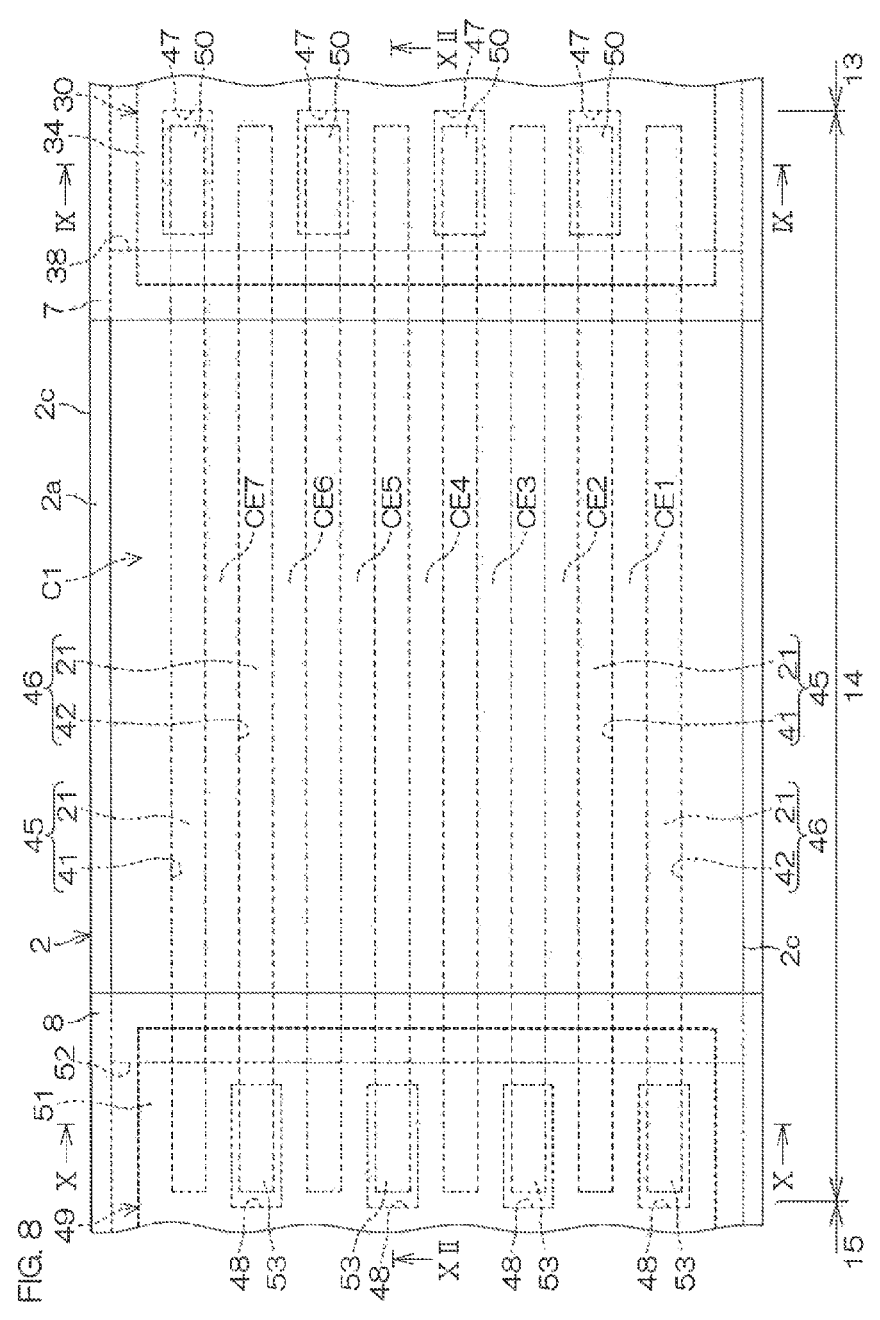
Figure 9:
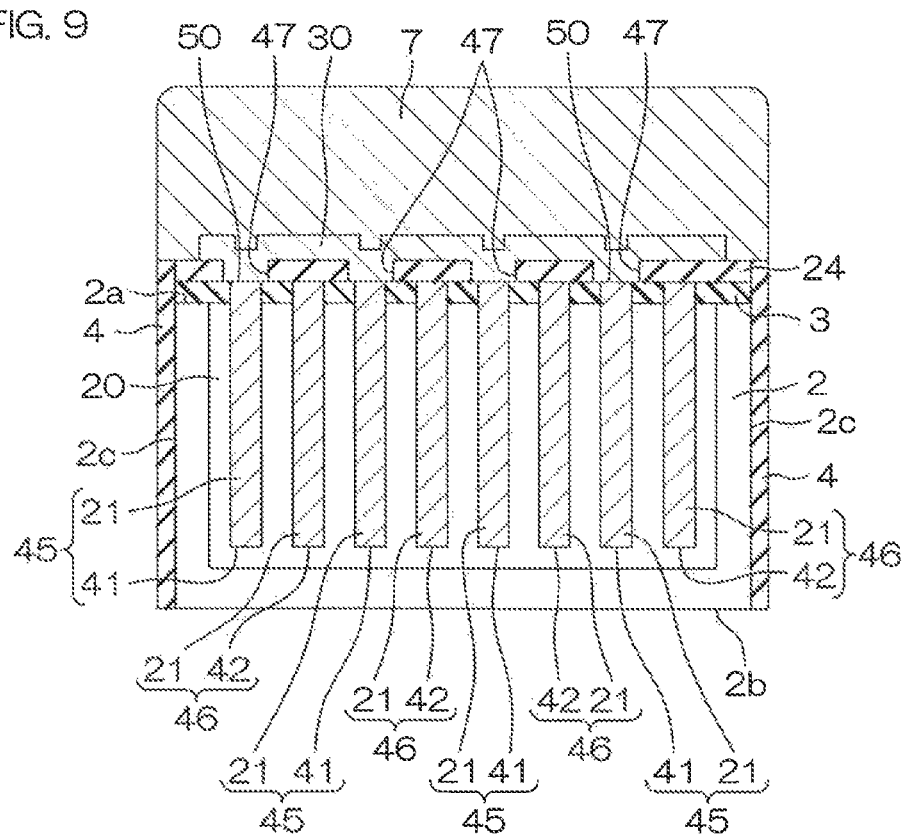
FIG. 9 is a cross-sectional view taken along line IX-IX shown in FIG. 8.
Figure 10:
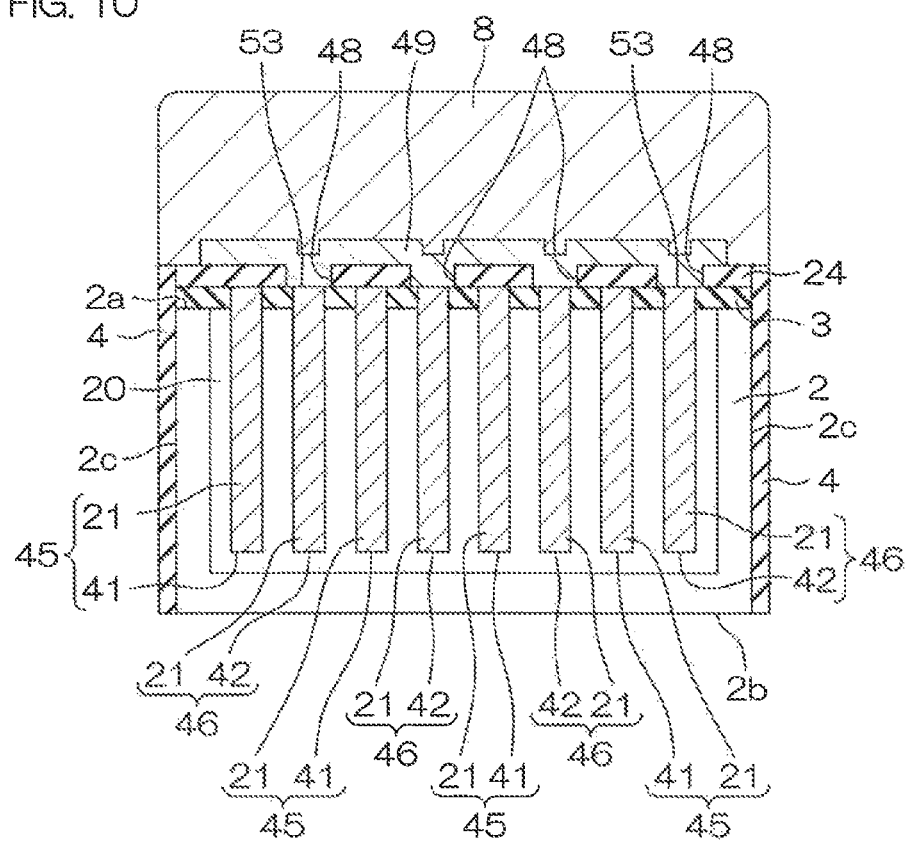
FIG. 10 is a cross-sectional view taken along line X-X shown in FIG. 8.

FIG. 8 is an enlarged plan view showing the first capacitor region 14 of the chip part 1 shown in FIG. 1. FIG. 9 is a cross-sectional view taken along line IX-IX shown in FIG. 8. FIG. 10 is a cross-sectional view taken along line X-X shown in FIG. 8. FIG. 11 is an enlarged cross-sectional view of a first internal electrode formation trench 41 and a second internal electrode formation trench 42 shown in FIG. 9. FIG. 12 is a cross-sectional view taken along line XII-XII shown in FIG. 8.

As shown in FIGS. 8 to 10, in the substrate 2 of the first capacitor region 14, a plurality of first internal electrode formation trenches 41 and a plurality of second internal electrode formation trenches 42 are formed. The first internal electrode formation trenches 41 and the second internal electrode formation trenches 42 are formed, in plan view, in the shape of stripes extending along the longitudinal direction of the element formation surface 2a. The first internal electrode formation trenches 41 and the second internal electrode formation trenches 42 are extended in parallel at a predetermined distance in the widthwise direction of the substrate 2. The first internal electrode formation trenches 41 and the second internal electrode formation trenches 42 are arranged so as to be alternately aligned in the widthwise direction of the substrate 2.

The first internal electrode formation trenches 41 and the second internal electrode formation trenches 42 are extended from a region below the first intermediate external electrode 7 through the first capacitor region 14 to a region below the second intermediate external electrode 8. In plan view, one end of the first internal electrode formation trench 41 and one end of the second internal electrode formation trench 42 are located in a region below the first intermediate external electrode 7. On the other hand, in plan view, the other end of the first internal electrode formation trench 41 and the other end of the second internal electrode formation trench 42 are located in a region below the second intermediate external electrode 8.

The first internal electrode formation trench 41 and the second internal electrode formation trench 42 are formed by being dug down from the element formation surface 2a to a predetermined depth. The vertical cross sections of the first internal electrode formation trench 41 and the second internal electrode formation trench 42 are formed in the shape of a rectangle elongated in the direction of the thickness of the substrate 2.

As shown in FIG. 11, the width D3 of the first internal electrode formation trench 41 and the second internal electrode formation trench 42 may be, for example, equal to or more than 3 μm but equal to or less than 10 μm. The depth D4 of the first internal electrode formation trench 41 and the second internal electrode formation trench 42 may be, for example, equal to or more than 10 μm but equal to or less than 100 μm.

The first internal electrode formation trench 41 includes a first trench portion 43 that is formed in the insulating film 3 and a second trench portion 44 that is formed in the substrate 2 and that communicates with the first trench portion 43. Likewise, the second internal electrode formation trench 42 includes the first trench portion 43 that is formed in the insulating film 3 and the second trench portion 44 that is formed in the substrate 2 and that communicates with the first trench portion 43.

In each of the inner surface of the second trench portion 44 of the first internal electrode formation trench 41 in the substrate 2 and the inner surface of the second trench portion 44 of the second internal electrode formation trench 42 in the substrate 2, the inner surface insulating film 19 is formed. In this preferred embodiment, the entire wall between the second trench portion 44 of the first internal electrode formation trench 41 and the second trench portion 44 of the second internal electrode formation trench 42 adjacent to each other in the substrate 2 is an insulating film, and the insulator portion 20 is formed.

In the first internal electrode formation trench 41 and the second internal electrode formation trench 42, as in the coil region 13 described previously, the conductive member 21 is embedded. The conductive member 21 includes the first conductive member layer 22 and the second conductive member layer 23. The first conductive member layer 22 is formed along the surface of the inner surface insulating film 19 and the surface of the first trench portion 43 of each of the first internal electrode formation trench 41 and the second internal electrode formation trench 42. The second conductive member layer 23 is embedded in a concave space partitioned by the first conductive member layer 22.

A first internal electrode 45 is formed with the conductive member 21 embedded in the first internal electrode formation trench 41. Likewise, a second internal electrode 46 is formed with the conductive member 21 embedded in the second internal electrode formation trench 42. The first internal electrode 45 and the second internal electrode 46 are formed in the shape of a rectangle elongated in the longitudinal direction of the substrate 2 when seen in the widthwise direction of the substrate 2. The first internal electrode 45 and the second internal electrode 46 are formed in the shape of a flat plate having a surface parallel to the side surfaces 2c along the longitudinal direction of the substrate 2.

The first internal electrode 45 and the second internal electrode 46 are arranged so as to be alternately aligned in the widthwise direction of the substrate 2. Hence, the first internal electrode 45 and the second internal electrode 46 adjacent to each other have opposite surfaces opposite to each other in the widthwise direction of the substrate 2. The wall (the insulator portion 20) of the substrate 2 sandwiched between the opposite surfaces of the first internal electrode 45 and the second internal electrode 46 adjacent to each other forms a dielectric film. One pair of the first internal electrode 45 and the second internal electrode 46 adjacent to each other and the dielectric film therebetween form one capacitor element CE.

In this preferred embodiment, since four first internal electrodes 45 and four second internal electrode 46 are individually provided, seven pairs of the first internal electrode 45 and the second internal electrode 46 adjacent to each other are provided. Hence, seven capacitor elements CE1 to CE7 are formed in the substrate 2. Preferably, one or more first internal electrodes 45 and one or more second internal electrodes 46 (the first internal electrode formation trenches 41 and the second internal electrode formation trenches 42) are individually provided.

As shown in FIG. 12, on the element formation surface 2a (the surface of the insulating film 3) of the substrate 2, the surface insulating film 24 is formed so as to cover the element formation surface 2a and the capacitor elements CE1 to CE7. As shown in FIGS. 8 and 10, in the surface insulating film 24, below the first intermediate external electrode 7, a first capacitor contact hole 47 is formed that exposes one end 50 (hereinafter simply referred to as "one end 50 of the first capacitor C1") of the first internal electrode 45 forming the capacitor elements CE1 to CE7. As shown in FIGS. 8 and 10, in the surface insulating film 24, below the second intermediate external electrode 8, a second capacitor contact hole 48 is formed that exposes the other end 53 (hereinafter simply referred to as "the other end 53 of the first capacitor C1") of the second internal electrode 46. On the surface insulating film 24, the second internal electrode film 30 and a third internal electrode film 49 are formed.

As shown in FIGS. 8 and 9, the second internal electrode film 30 (the second pad 34) is formed so as to enter the first capacitor contact hole 47 from the surface insulating film 24. Within the first capacitor contact hole 47, the second internal electrode film 30 is electrically connected to the one end 50 of the first capacitor C1.

As shown in FIGS. 8 and 10, the third internal electrode film 49 is arranged below the second intermediate external electrode 8. The third internal electrode film 49 includes a third pad 51. The third internal electrode film 49 is formed so as to enter the second capacitor contact hole 48 from the surface insulating film 24. Within the second capacitor contact hole 48, the third internal electrode film 49 is electrically connected to the other end 53 of the first capacitor C1. The arrangement of the third internal electrode film 49 will be specifically described with reference to the resistance region 15 which will be described later.

The second internal electrode film 30 and the third internal electrode film 49 are covered by the passivation film 35. On the passivation film 35, the resin film 36 is formed. In the passivation film 35 and the resin film 36, a third cutout portion 52 is formed that exposes a region other than an edge portion of the third internal electrode film 49 on the side of the first capacitor region 14 and an edge portion on the side of the resistance region 15.

As shown in FIGS. 10 and 12, the second intermediate external electrode 8 is formed so as to fill the third cutout portion 52. The second intermediate external electrode 8 is formed so as to protrude from the resin film 36. The second intermediate external electrode 8 includes a covering portion 54 that is drawn out to the side of the first capacitor region 14 and the side of the resistance region 15 along the surface of the resin film 36. In this preferred embodiment, the second intermediate external electrode 8 is formed so as to cover the third internal electrode film 49 exposed from the third cutout portion 52, the surface of the surface insulating film 24 and the upper end portion of the passivation film 4. The second intermediate external electrode 8 is formed so as to be flush with the surface of the passivation film 4.

The passivation film 35 and the resin film 36 cover, in the first capacitor region 14, the first internal electrode 45 and the second internal electrode 46, the surface insulating film 24, the second internal electrode film 30 and the third internal electrode film 49, and function as protective films to protect them.

Figure 13A:
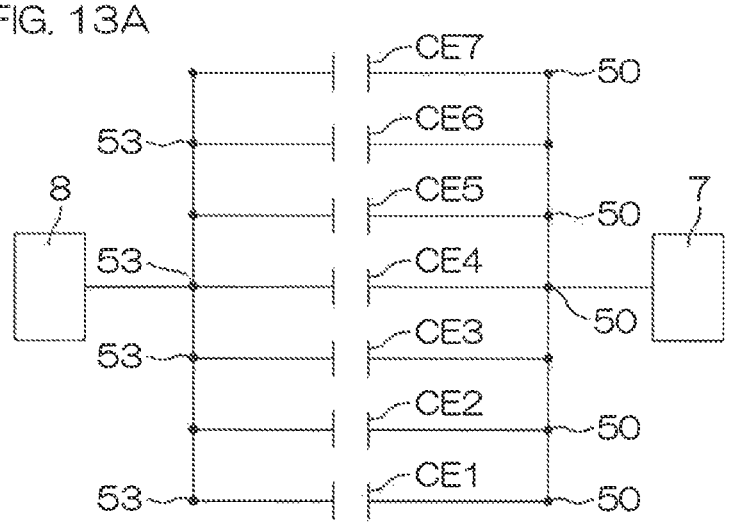
FIGS. 13A and 13B are electrical circuit diagrams showing an example of an electrical structure of the first capacitor region.
Figure 13B:
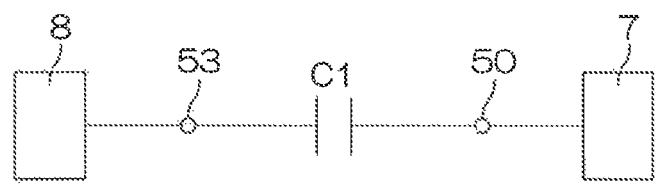

FIGS. 13A and 13B are electrical circuit diagrams showing an example of an electrical structure of the first capacitor region 14.

As shown in FIG. 13A, the capacitor elements CE1 to CE7 are connected parallel to each other. The one ends 50 of the capacitor elements CE1 to CE7 are connected to the first intermediate external electrode 7, and the other ends 53 of the capacitor elements CE1 to CE7 are connected to the second intermediate external electrode 8. The combined capacitance thereof forms the first capacitor C1 as shown in FIG. 13B. The one end 50 of the first capacitor C1 is connected to the first intermediate external electrode 7, and the other end 53 of the first capacitor C1 is connected to the second intermediate external electrode 8. In this way, the first capacitor C1 having a predetermined capacitance is formed.

As described above, in the first capacitor region 14, the first internal electrode 45 and the second internal electrode 46 can be opposite to each other in a direction (direction parallel to the surface of the substrate 2) perpendicularly intersecting the direction of the thickness of the substrate 2. Hence, it is possible to increase the area of the opposite surfaces of the first internal electrode 45 and the second internal electrode 46 without increasing the area of the surface of the substrate 2. In this way, it is possible to reduce the size and increase the capacitance.

The first internal electrode formation trench 41 is embedded in the substrate 2, the conductive member 21 is embedded in the second internal electrode formation trench 42 and thus it is possible to form the first internal electrode 45 and the second internal electrode 46, with the result that it is easy to manufacture the first internal electrode 45 and the second internal electrode 46.

<Resistance Region 15>

Figure 14:
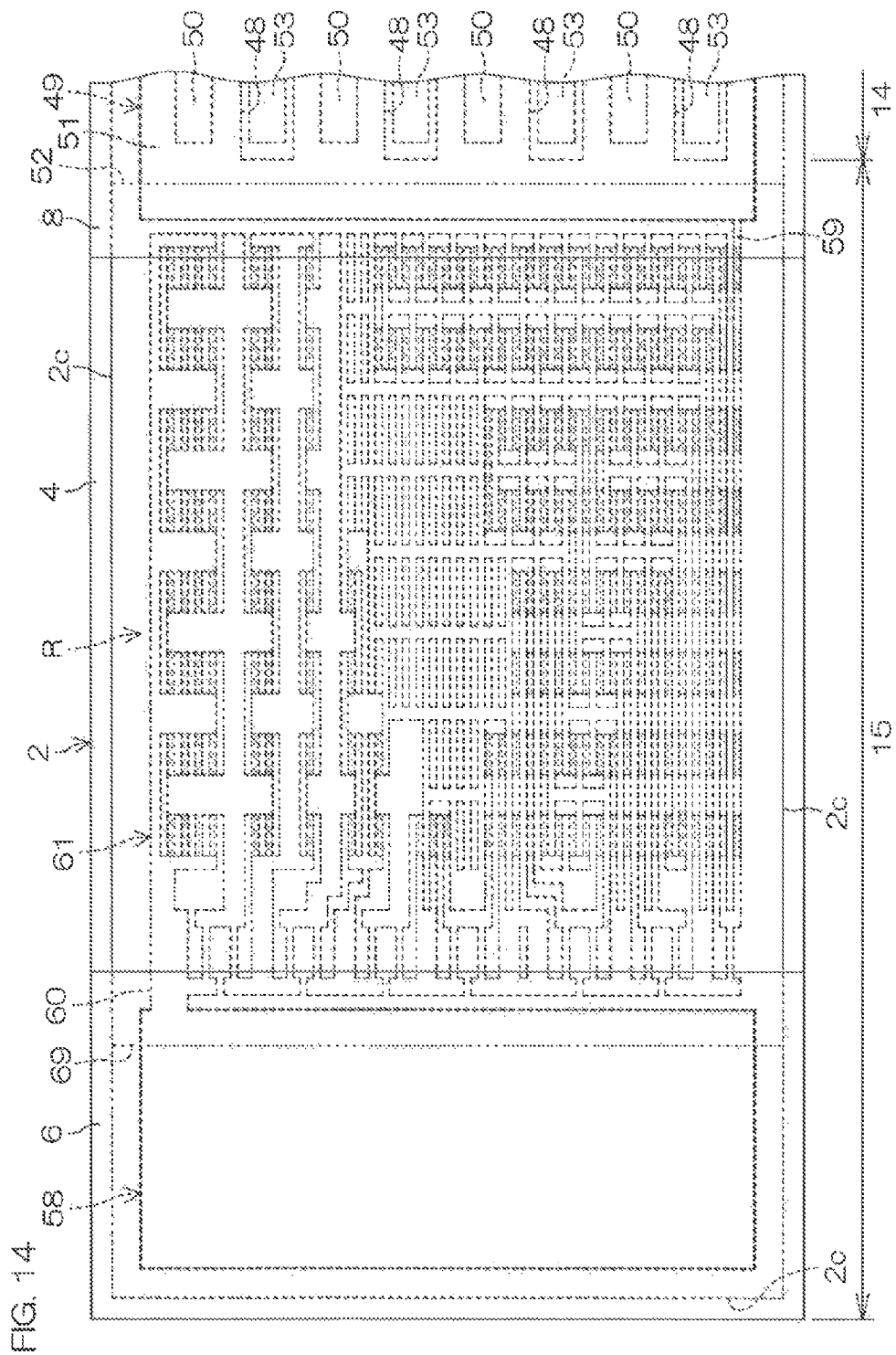
FIG. 14 is an enlarged plan view showing a resistance region of the chip part shown in FIG. 1.
Figure 15:
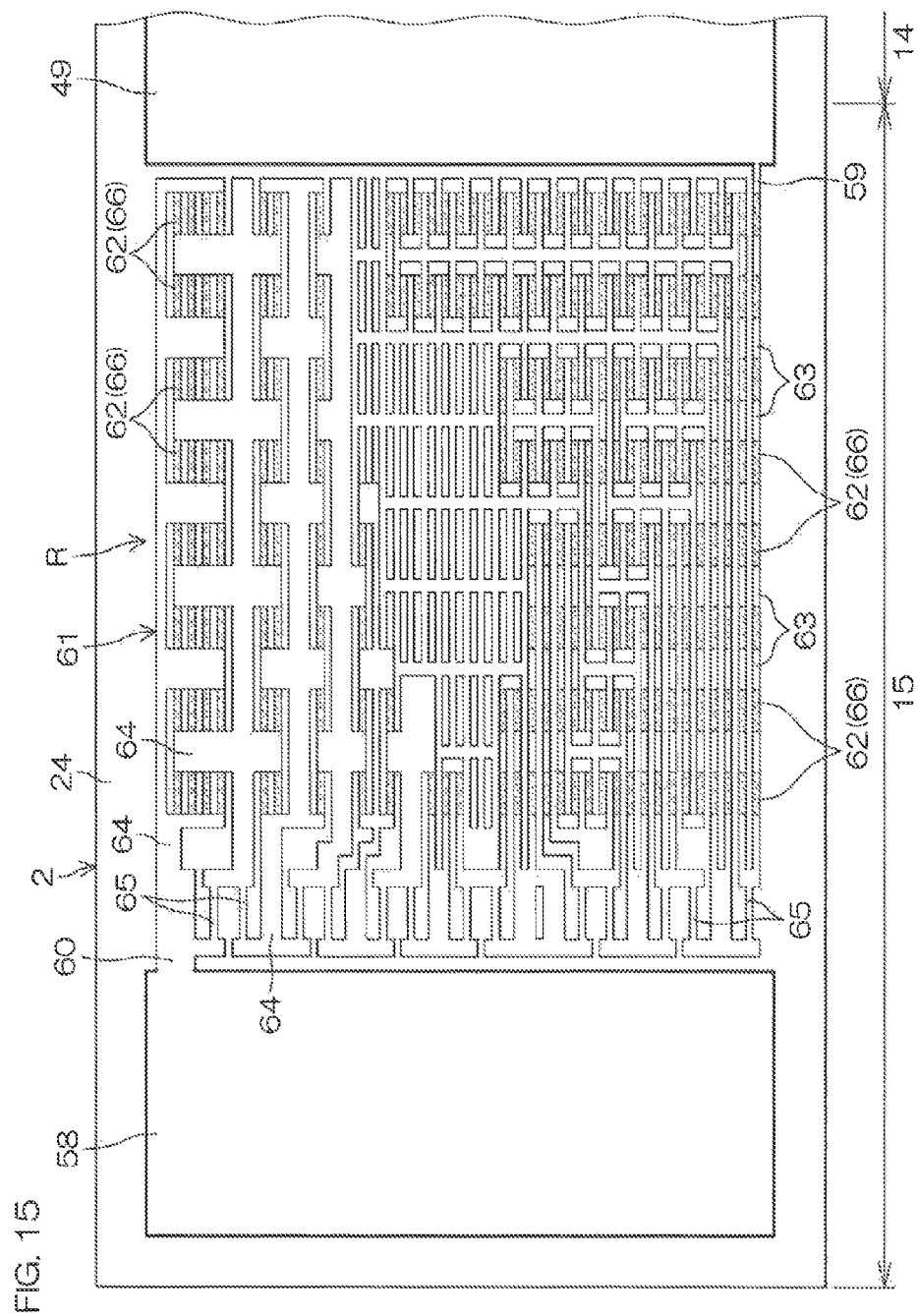
FIG. 15 is a plan view showing a structure on a surface insulating film.
Figure 19A:
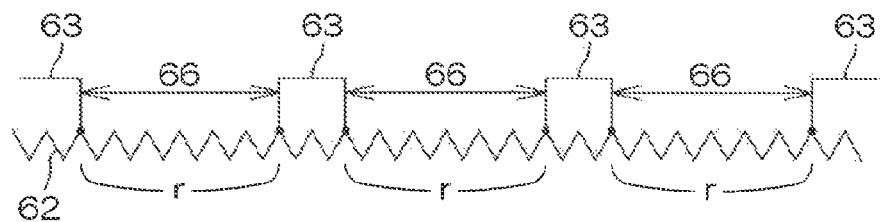
FIGS. 19A, 19B and 19C are electrical circuit diagrams showing respective examples of an electrical structure of a resistive film line and a conductor film.
Figure 19B:
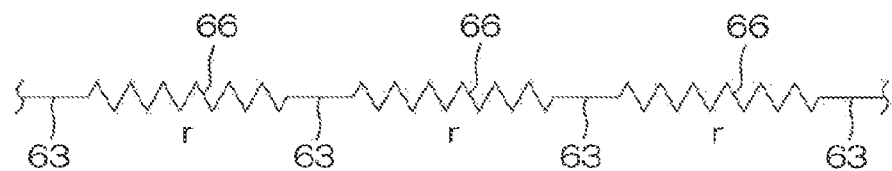
Figure 19C:
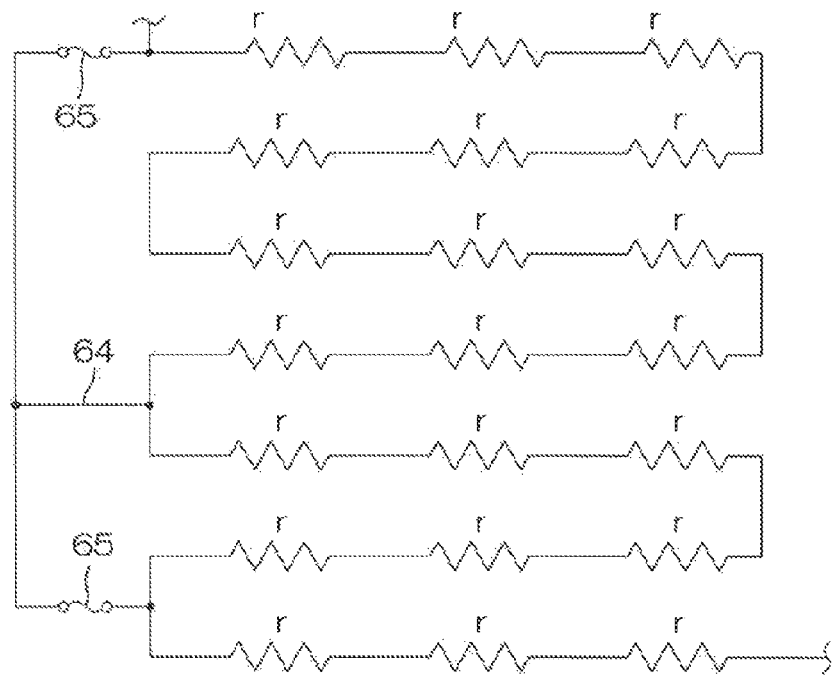

FIG. 14 is an enlarged plan view showing the resistance region 15 of the chip part 1. FIG. 15 is a plan view showing a structure on the surface insulating film 24. FIG. 16 is a partially enlarged plan view of an element shown in FIG. 15. FIG. 17 is a cross-sectional view taken along line XVII-XVII shown in FIG. 16. FIG. 18 is a cross-sectional view taken along line XVIII-XVIII shown in FIG. 16. FIGS. 19A, 19B and 19C are electrical circuit diagrams showing an example of an electrical structure of a resistive film line 62 and a conductor film 63.

As shown in FIG. 17, the insulating film 3 covering the entire region of the substrate 2 (the element formation surface 2a) and the surface insulating film 24 covering the entire surface of the insulating film 3 are formed. In this preferred embodiment, the resistance region 15 is set on the surface insulating film 24.

As shown in FIGS. 14 to 17, on the surface insulating film 24, the third internal electrode film 49 described previously, a fourth internal electrode film 58 provided below the second external electrode 6 and the resistor portion R are formed.

As shown in FIGS. 14 and 15, the resistor portion R includes a resistor portion conductive member film 61 (second conductive member) arranged between the third internal electrode film 49 and the fourth internal electrode film 58. One end 59 (hereinafter simply referred to as "one end 59 of the resistor portion R") of the resistor portion conductive member film 61 is connected to the third internal electrode film 49. The other end 60 (hereinafter simply referred to as "the other end 60 of the resistor portion R") of the resistor portion conductive member film 61 is connected to the fourth internal electrode film 58.

As shown in FIGS. 17 and 18, the resistor portion conductive member film 61 includes a plurality of resistive film lines 62 formed on the surface insulating film 24 and a plurality of conductor films 63 laminated on the resistive film line 62. The resistor portion conductive member film 61 further includes a connection conductor film 64 that is connected to the plurality of conductor films 63 and a fuse portion 65 that communicates integrally with the connection conductor film 64 (also see FIG. 16 and the like).

This preferred embodiment shows an example where the resistive film line 62 has a linear pattern that is extended in a direction in which the third internal electrode film 49 and the fourth internal electrode film 58 are opposite to each other. The resistive film line 62 may have a linear pattern that is extended in a direction intersecting the direction in which the third internal electrode film 49 and the fourth internal electrode film 58 are opposite to each other. The resistive film line 62 may have a pattern obtained by combining the linear pattern extended in the opposite direction with the linear pattern extended in the direction intersecting the opposite direction. The resistive film line 62 may be cut in a middle portion in the direction in which the third internal electrode film 49 and the fourth internal electrode film 58 are opposite to each other. The resistive film line 62 may contain any one of TiN, TiON and TiSiON. The thickness of the resistive film line 62 may be, for example, about 2000 angstroms.

A plurality of conductor films 63 are spaced a predetermined distance apart on the resistive film line 62. The conductor film 63 has a conductivity p63 higher than the conductivity p62 of the resistive film line 62 (the conductivity p62 of the resistive film line 62<the conductivity p63 of the conductor film 63). The conductor film 63 may contain, for example, any one of aluminum (Al), copper (Cu) and an alloy thereof (AlCu alloy). The thickness of the conductor film 63 may be, for example, about 8000 angstroms.

With reference to FIGS. 17 and 19A, an exposure portion of the resistive film line 62 exposed between the conductor films 63 adjacent to each other forms one resistor body 66. On the other hand, since the portion of the resistive film line 62 where the conductor film 63 is arranged is short-circuited by the conductor film 63, it does not function as the resistor body 66. All of the plurality of resistor bodies 66 have an equal shape and an equal area. In other words, the resistor bodies 66 are formed as unit resistor portions having an equal resistance value r. In this way, the arrangement shown in FIG. 17 can be electrically represented by the electrical circuit diagram shown in FIG. 19B. The arrangement shown in FIG. 16 can be electrically represented by the electrical circuit diagram shown in FIG. 19C.

In the resistive film line 62, a plurality of resistor bodies 66 described above are formed. More specifically, on the surface insulating film 24, the plurality of resistor bodies 66 are aligned in a matrix along the longitudinal direction of the substrate 2 and the widthwise direction of the substrate 2. In this preferred embodiment, the plurality of resistor bodies 66 include 8 resistor bodies 66 that are aligned along the row direction (the longitudinal direction of the substrate 2) and 44 resistor bodies 66 that are aligned along the column direction (the widthwise direction of the substrate 2). A total of 352 resistor bodies 66 are formed in the resistance region 15. On each of the resistive film lines 62, a series resistor group in which 1 to 64 resistor bodies 66 are connected in series is formed. The resistance value of each of the resistive film lines 62 is determined by the combined resistance of a plurality of resistor bodies 66 formed on the resistive film line 62. In other words, each of the resistive film lines 62 is provided as a resistor portion unit body having a plurality of types of resistance values. The resistance value of the resistor portion R is determined by the combined resistance of a plurality of resistive film lines 62.

A plurality of conductor films 63 are electrically connected through the connection conductor film 64 and the fuse portion 65 to the third internal electrode film 49 and the fourth internal electrode film 58.

The connection conductor film 64 includes a linear pattern that is formed along a direction in which the third internal electrode film 49 and the fourth internal electrode film 58 are opposite to each other. The connection conductor film 64 may include a linear pattern that is extended in a direction intersecting the direction in which the third internal electrode film 49 and the fourth internal electrode film 58 are opposite to each other. The connection conductor film 64 may include a pattern obtained by combining the linear pattern extended in the opposite direction with the linear pattern extended in the direction intersecting the opposite direction. The connection conductor film 64 communicates integrally with the conductor film 63 formed on each of the resistive film lines 62. The connection conductor film 64 is formed in the same layer as the conductor film 63 and is formed of the same material as the conductor film 63.

The fuse portion 65 is formed so as to communicate integrally with the connection conductor film 64 such that the fuse portion 65 can be blown. The fuse portion 65 is formed along the side of the fourth internal electrode film 58 on the side of the resistance region 15. The fuse portion 65 is formed along the direction in which the third internal electrode film 49 and the fourth internal electrode film 58 are opposite to each other and is formed in the shape of a straight line thinner than the connection conductor film 64. Around the fuse portion 65, no resistor body 66 is formed. One or more fuse portions 65 may be provided in the connection conductor film 64. Part of the fuse portions 65 may be unused. The fuse portion 65 is formed in the same layer as the conductor film 63 and is formed of the same material as the conductor film 63.

The fuse portion 65 may be a fuse element that is formed not only with part of the conductor films 63 but also with part of the resistor bodies 66 (the resistive film lines 62) and part of the conductor films 63 on the resistive film lines 62. On the conductor film 63, another conductor film is further laminated, and thus the resistance value of the entire conductor film 63 may be lowered. Even in this case, when another conductor film 63 is not laminated on the fuse portion 65, the blowing property of the fuse portion 65 is prevented from being degraded.

With reference to FIG. 19C, when the fuse portion 65 is connected, the resistor body 66 (the resistive film line 62) is short-circuited by the conductor film 63 and the connection conductor film 64. For example, when a voltage is applied to the third internal electrode film 49 and the fourth internal electrode film 58, a current flowing through the connection conductor film 64 bypasses the resistive film line 62 and the resistor body 66 to flow through the connection conductor film 64 and the conductor film 63. In other words, when the fuse portion 65 is connected to the connection conductor film 64, since the resistor body 66 is electrically separated from the third internal electrode film 49 and the fourth internal electrode film 58, the resistance value is not increased.

On the other hand, when the fuse portion 65 is cut (blown), and a voltage is applied to the third internal electrode film 49 and the fourth internal electrode film 58, a current path along which a current flows into the resistor body 66 (the resistive film line 62) is formed. In other words, when the fuse portion 65 is cut (blown), since the resistor body 66 is electrically connected to the third internal electrode film 49 and the fourth internal electrode film 58, the resistance value is increased.

As shown in FIG. 17, the third internal electrode film 49 has a laminated structure that includes a first conductive member film 67 formed on the surface insulating film 24 and a second conductive member film 68 formed on the first conductive member film 67. The first conductive member film 67 is formed integrally with the resistive film line 62. The first conductive member film 67 is formed of the same material as the resistive film line 62. On the other hand, the second conductive member film 68 is formed integrally with the conductor film 63. The second conductive member film 68 is formed of the same material as the conductor film 63.

The fourth internal electrode film 58 is electrically connected to the second external electrode 6. In other words, the fourth internal electrode film 58 includes a fourth pad that is formed, in plan view, in the shape of a rectangle. As with the third internal electrode film 49, the fourth internal electrode film 58 has a laminated structure that includes the first conductive member film 67 formed on the surface insulating film 24 and the second conductive member film 68 formed on the first conductive member film 67.

The third internal electrode film 49 and the fourth internal electrode film 58 are covered by the passivation film 35. On the passivation film 35, the resin film 36 is formed. In the passivation film 35 and the resin film 36, a fourth cutout portion 69 is formed that exposes a region other than an edge portion of the fourth internal electrode film 58 on the side of the resistance region 15.

The second external electrode 6 is formed so as to fill the fourth cutout portion 69. The second external electrode 6 is formed so as to protrude from the resin film 36. The second external electrode 6 includes a covering portion 70 that is drawn out to the side of the resistance region 15 and the opposite side to the resistance region 15 along the surface of the resin film 36. In this preferred embodiment, the second external electrode 6 is formed so as to cover the fourth internal electrode film 58 exposed from the fourth cutout portion 69, the surface of the surface insulating film 24 and the upper end portion of the passivation film 4. The three side surfaces other than the side surface on the inner side of the second external electrode 6 are formed so as to be flush with the surface of the passivation film 4.

The passivation film 35 and the resin film 36 cover, in the resistance region 15, the resistor portion conductive member film 61, the surface insulating film 24, the third internal electrode film 49 and the fourth internal electrode film 58, and function as protective films to protect them. The undesired short-circuiting of the resistor body 66 and the like is reduced by the passivation film 35.

Figure 20:
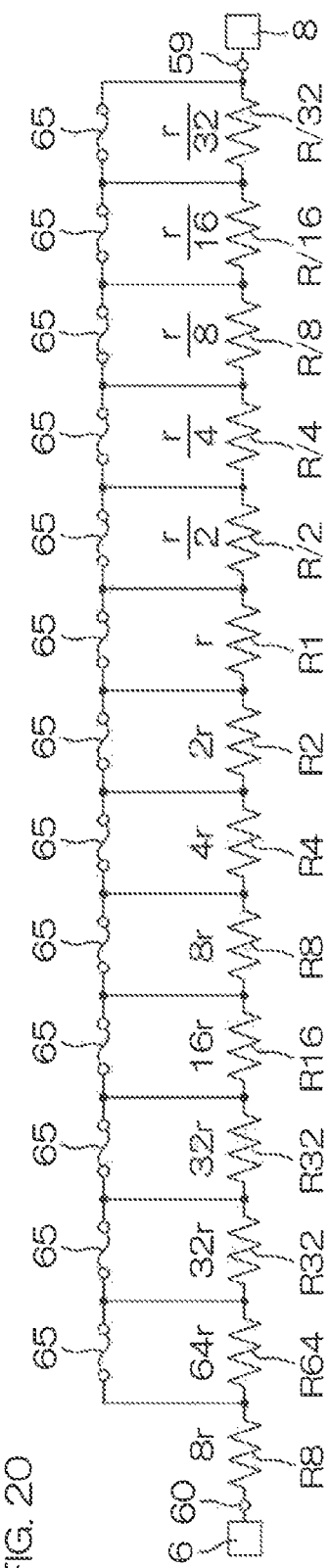
FIG. 20 is an electrical circuit diagram showing an example of an electrical structure of the resistance region.

FIG. 20 is an electrical circuit diagram showing an example of an electrical structure of the resistance region 15.

The resistor portion R is electrically connected to the second external electrode 6 and the second intermediate external electrode 8. The resistor portion R has an arrangement in which a reference resistance circuit R8, a resistance circuit R64, two resistance circuits R32, a resistance circuit R16, a resistance circuit R8, a resistance circuit R4, a resistance circuit R2, a resistance circuit R1, a resistance circuit R/2, a resistance circuit R/4, a resistance circuit R/8, a resistance circuit R/16 and a resistance circuit R/32 are connected in series.

Each of the reference resistance circuit R8 and the resistance circuits R64 to R2 includes an equal number of resistor bodies 66 connected in series as the number at the end thereof (in the case of R64, "64"). For example, the resistance circuit R64 includes 64 resistor bodies 66 connected in series. Each of the resistance circuits R/2 to R/32 includes an equal number of resistor bodies 66 connected in parallel as the number at the end thereof (in the case of R/32, "32"). For example, the resistance circuit R/32 includes 32 resistor bodies 66 connected in parallel.

The fuse portion 65 is connected in parallel to each of the resistance circuits R64 to R/32 other than the reference resistance circuit R8. The fuse portions 65 are connected in series either directly or through the connection conductor film 64 (see FIG. 16).

As shown in FIG. 20, in a state where no fuse portion 65 is blown, the resistance circuits R64 to R/32 other than the reference resistance circuit R8 are short-circuited by the fuse portion 65. Hence, the current is passed through the reference resistance circuit R8, and thereafter flows through the fuse portion 65 so as to bypass the resistance circuits R64 to R/32. In this case, the resistor portion R can be assumed to include only the reference resistance circuit R8. In the reference resistance circuit R8, since 8 resistor bodies 66 are connected in series, for example, when it is assumed that the resistance value r of one resistor body 66 is 8Ω, it is possible to obtain a combined resistance value of 64Ω by the product (=8 pieces×8Ω) of the number (=8 pieces) of resistor bodies 66 and the resistance value (=8Ω).

The fuse portion 65 is selectively blown according to the required resistance value. The fuse portion 65 is blown by, for example, laser light. The resistance circuit in which the fuse portion 65 is blown is electrically connected to the second external electrode 6 and the second intermediate external electrode 8. Hence, the fuse portion 65 is selectively blown, and thus the resistance value of the entire resistor portion R can be adjusted into an arbitrary resistance value both finely and digitally. In this way, it is possible to obtain the desired resistance value (the combined resistance).

Figure 21:
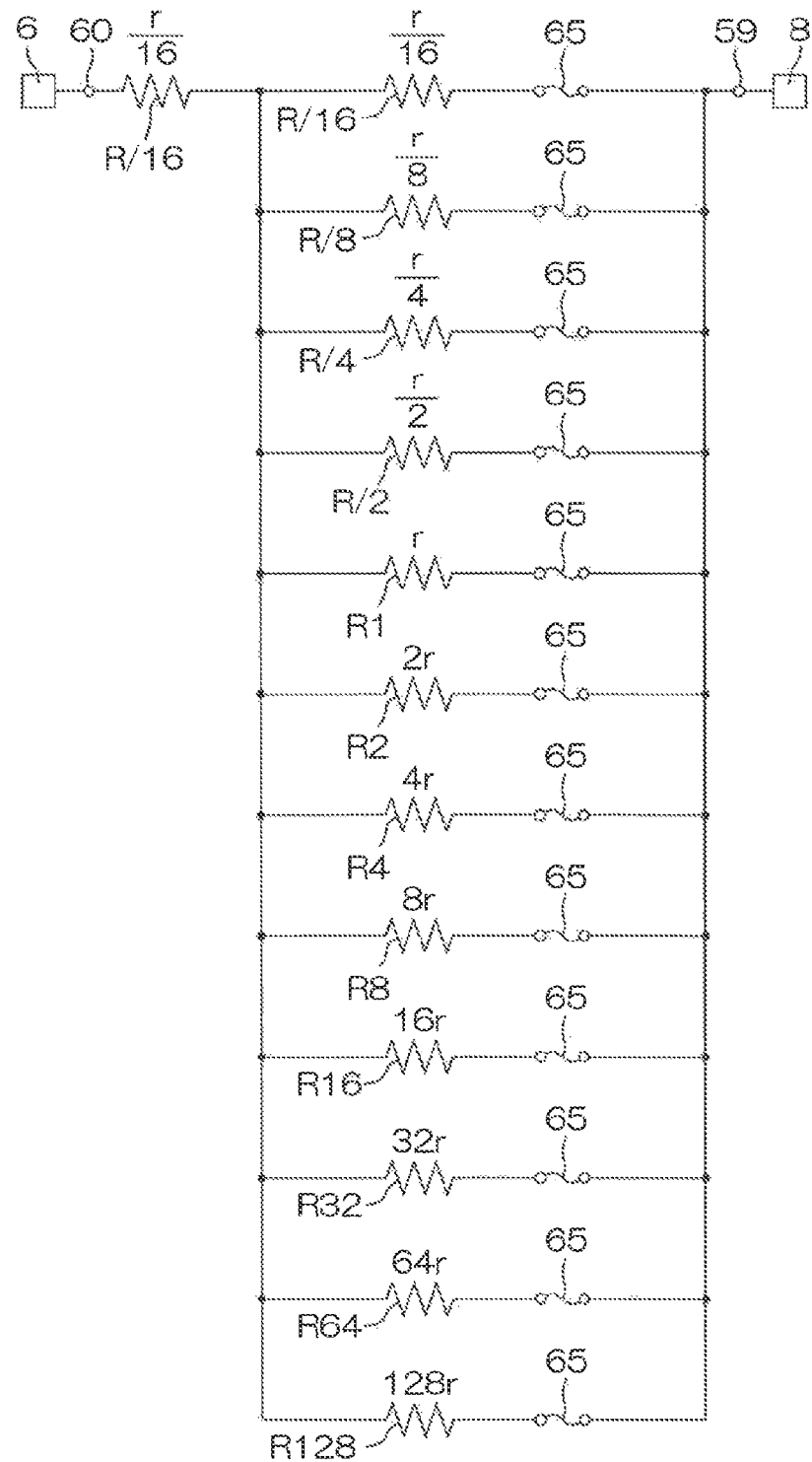
FIG. 21 is an electrical circuit diagram showing another example of the electrical structure of the resistance region.

FIG. 21 is an electrical circuit diagram showing another example of the electrical structure of the resistance region 15.

The resistor portion R includes a series circuit of a reference resistance circuit R/16 and a parallel circuit of 12 types of resistance circuits R/16, R/8, R/4, R/2, R1, R2, R4, R8, R16, R32, R64 and R128.

The fuse portion 65 is connected in series to each of the 12 types of resistance circuits R/16 to R128 other than the reference resistance circuit R/16. Even in this arrangement, the fuse portion 65 is selectively blown, and thus the resistance value of the resistor portion R can be adjusted into an arbitrary resistance value both finely and digitally. In this way, it is possible to obtain the desired resistance value (the combined resistance).

Figure 22:
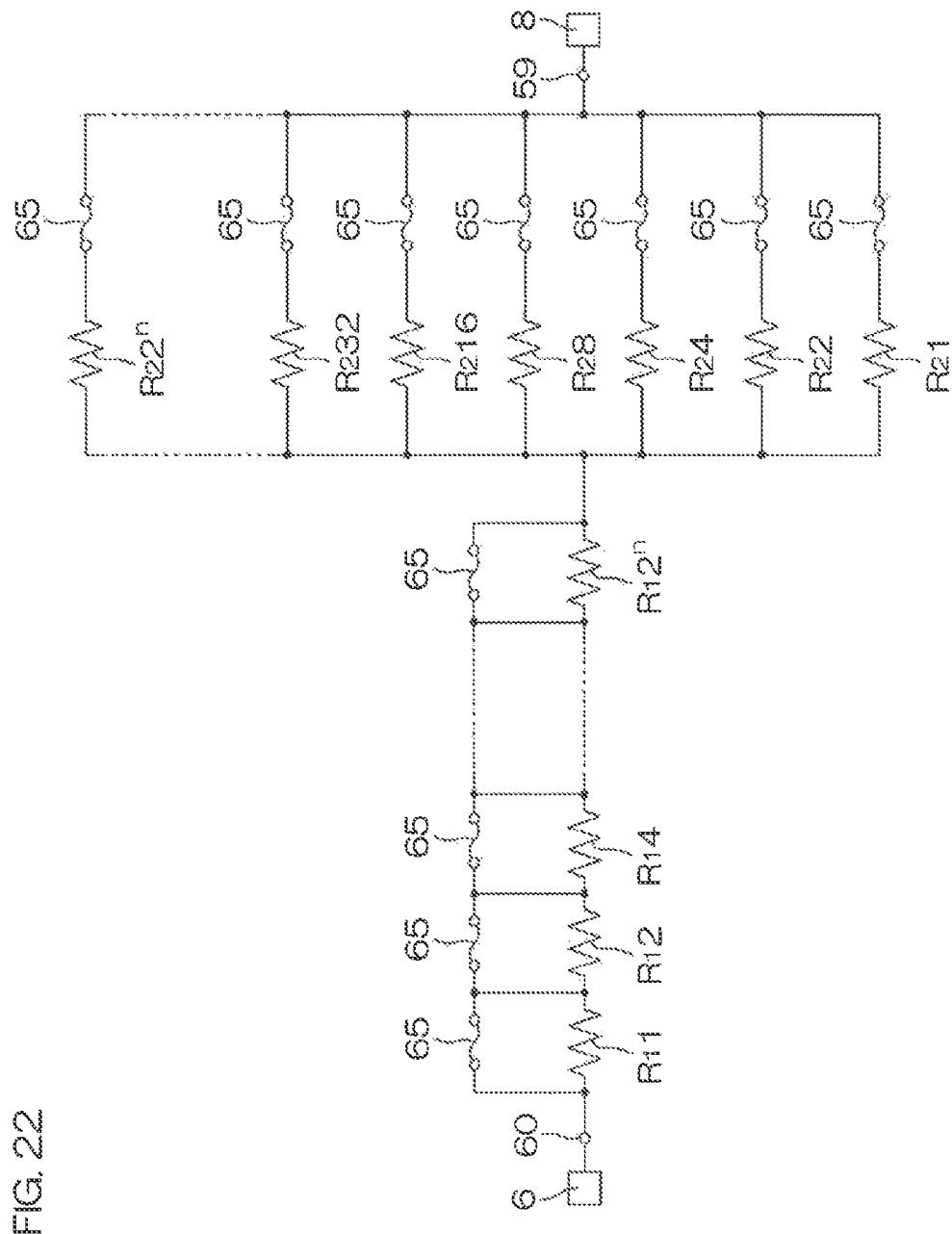
FIG. 22 is an electrical circuit diagram showing still another example of the electrical structure of the resistance region.

FIG. 22 is an electrical circuit diagram showing still another example of the electrical structure of the resistance region 15.

The resistor portion R includes a plurality of series resistance circuits $R_1 2^n$ (n=0, 1, 2 . . . ) connected in series and a plurality of parallel resistance circuits $R_2 2^n$ (n=0, 1, 2 . . . ) connected in parallel. The series resistance circuits $R_1 2^n$ and the parallel resistance circuits $R_2 2^n$ are connected in series. In the series resistance circuits $R_1 2^n$, as in the arrangement of FIG. 20, the fuse portion 65 is connected in parallel to each of the resistance circuits. In the parallel resistance circuits $R_2 2^n$, as in the arrangement of FIG. 21, the fuse portion 65 is connected in series to each of the resistance circuits. Hence, in any of the series resistance circuits $R_1 2^n$ and the parallel resistance circuits $R_2 2^n$, the combined resistance value can be changed and adjusted depending on whether or not the fuse portion 65 is blown.

In such an arrangement, on the side of the series resistance circuits $R_1 2^n$, a high-resistance circuit (for example, a resistance circuit of 1 kΩ or more) can easily be realized. On the other hand, on the side of the parallel resistance circuits $R_2 2^n$, a low-resistance circuit (for example, a resistance circuit of 1 kΩ or less) can easily be realized. Hence, it is possible to form the resistor portion R that includes resistance circuits having a wide range of resistance values of a few ohms to a few mega ohms.

<Electrical Circuit>

Figure 23:
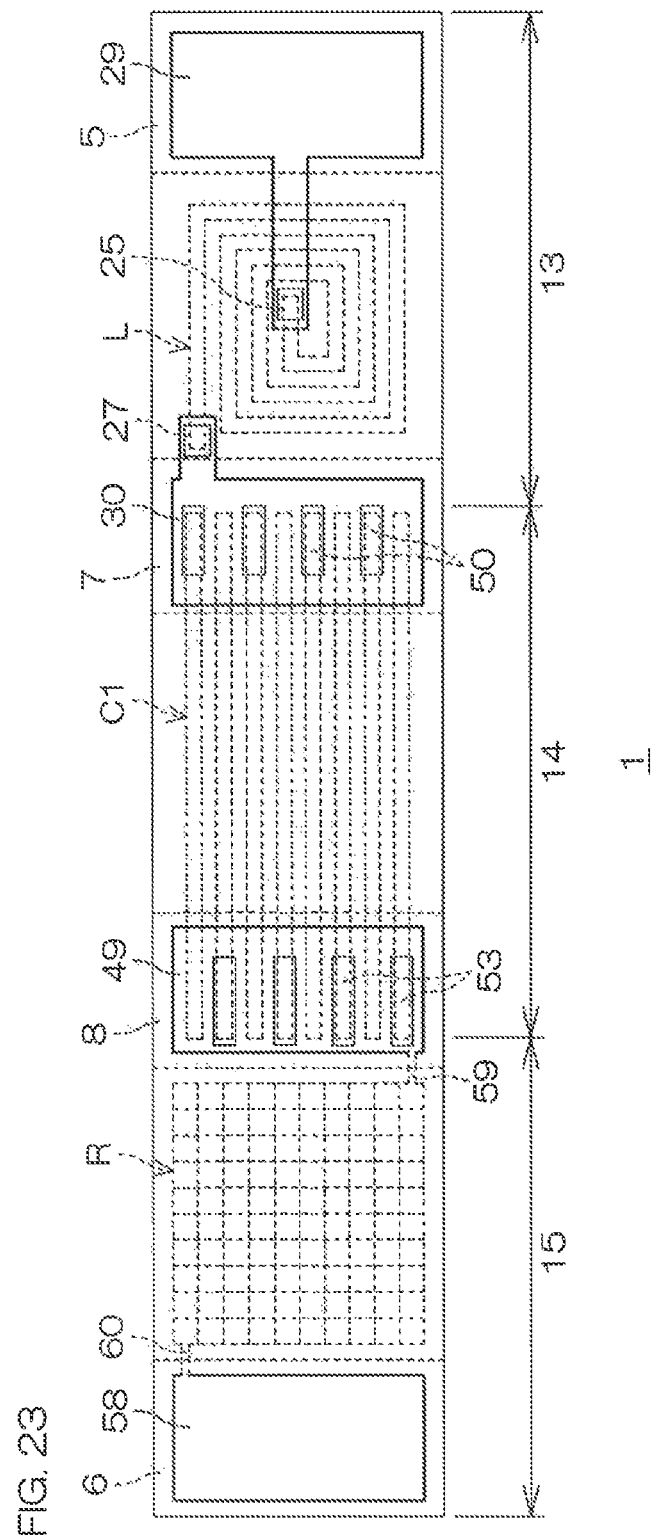
FIG. 23 is a plan view of the chip part shown in FIG. 1 and is also a diagram showing the arrangement of a passive element and an internal electrode film.
Figure 24:
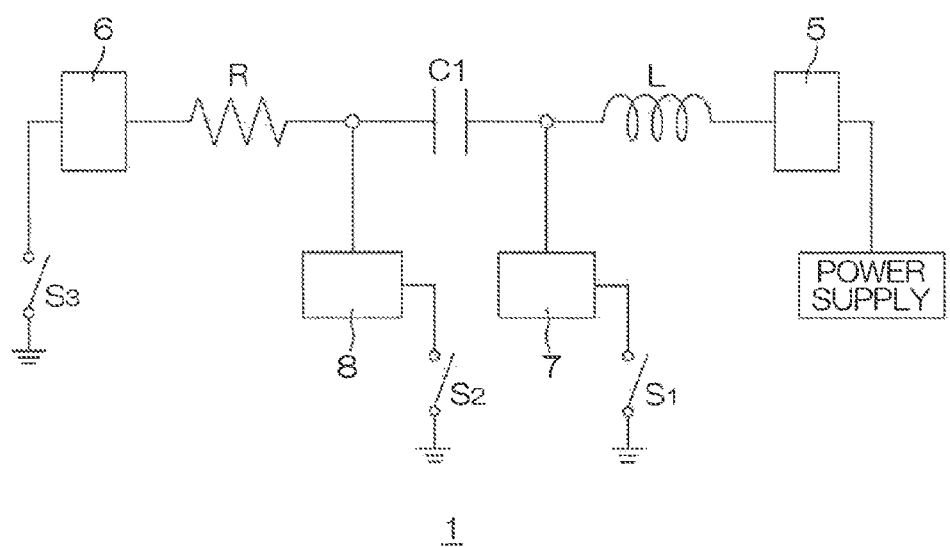
FIG. 24 is an electrical circuit diagram showing an example of an electrical structure of the chip part shown in FIG. 1.

FIG. 23 is a plan view of the chip part 1 and is also a diagram showing the arrangement of the coil L, the first capacitor C1, the resistor portion R and the arrangement of the first internal electrode film 29, the second internal electrode film 30, the third internal electrode film 49 and the fourth internal electrode film 58. FIG. 24 is an electrical circuit diagram showing an example of an electrical structure of the chip part 1.

As shown in FIG. 23, the one end 25 of the coil L is connected through the first internal electrode film 29 to the first external electrode 5. The other end 27 of the coil L is connected through the second internal electrode film 30 to the one end 50 of the first capacitor C1. In other words, the second internal electrode film 30 forms a common internal connection portion that connects the other end 27 of the coil L and the one end 50 of the first capacitor C1 simultaneously. The other end 27 of the coil L and the one end 50 of the first capacitor C1 are connected through the second internal electrode film 30 to the first intermediate external electrode 7. The other end 53 of the first capacitor C1 is connected through the third internal electrode film 49 to the one end 59 of the resistor portion R. In other words, the third internal electrode film 49 forms a common internal connection portion that connects the other end 53 of the first capacitor C1 and the one end 59 of the resistor portion R simultaneously. The other end 53 of the first capacitor C1 and the one end 59 of the resistor portion R are connected through the fourth internal electrode film 58 to the second intermediate external electrode 8. The other end 60 of the resistor portion R is connected through the fourth internal electrode film 58 to the second external electrode 6. In this way, as shown in FIG. 24, an LCR series circuit network in which the coil L, the first capacitor C1 and the resistor portion R are connected in series is formed.

In FIG. 24, for ease of description, the first capacitor C1 formed in the first capacitor region 14 is represented by the combined capacitance, and the resistor portion R formed in the resistance region 15 is represented by the combined resistance. FIG. 24 shows an example where a power supply is connected to the first external electrode 5, a first switch SW1 is connected to the first intermediate external electrode 7, a second switch SW2 is connected to the second intermediate external electrode 8 and a third switch SW3 is connected to the second external electrode 6.

When the first switch SW1 is set "on," and the second switch SW2 and the third switch SW3 are set "off," a current flows through only the coil L. In this way, only the coil L is taken out from the LCR series circuit network, and can be used. The portion to which the power supply is connected is replaced with the portion to which the first switch SW1 is connected, and thus only the first capacitor C1 is taken out from the LCR series circuit network, and can be used. Likewise, the portion to which the power supply is connected is replaced with the portion to which the third switch SW3 is connected, and thus only the resistor portion R is taken out from the LCR series circuit network, and can be used.

When the second switch SW2 is set "on," and the first switch SW1 and the third switch SW3 are set "off," only the LC series circuit network of the coil L and the first capacitor C1 are taken out from the LCR series circuit network, and can be used. The portion to which the power supply is connected is replaced with the portion to which the third switch SW3 is connected, and thus only the RC series circuit network of the resistor portion R and the first capacitor C1 are taken out from the LC series circuit network, and can be used. The third switch SW3 is set "on," the first intermediate external electrode 7 and the second intermediate external electrode 8 are short-circuited and thus only the LR series circuit network of the coil L and the resistor portion R is taken out from the LCR series circuit network, and can be used.

When the first switch SW1 and the second switch SW2 are set "off," and the third switch SW3 is set "on," only the LCR series circuit network is taken out, and can be used.

The chip part 1 is not limited to the LCR series circuit network (RCL series circuit network) in which the coil L (the coil region 13), the first capacitor C1 (the first capacitor region 14) and the resistor portion R (the resistance region 15) are arranged in this order from the side of the first external electrode 5. The chip part 1 may be an LRC series circuit network (CRL series circuit network) in which the coil L, the resistor portion R and the first capacitor C1 are arranged in this order from the side of the first external electrode 5. The chip part 1 may be an RCL series circuit network (CLR series circuit network) in which the resistor portion R, the coil L and the first capacitor C1 are arranged in this order from the side of the first external electrode 5.

<Effect of the Chip Part 1>

As described above, in the chip part 1, the coil formation trench 16 is utilized to form the coil L within the substrate 2. The first internal electrode formation trench 41 and the second internal electrode formation trench 42 are utilized to form the first capacitor C1 within the substrate 2. Furthermore, the resistor portion conductive member film 61 on the substrate 2 is used to form the resistor portion R.

As described above, the internal region of the substrate 2 is utilized as the region for forming the coil L and the first capacitor C1, and the region on the surface of the substrate 2 is utilized as the region for forming the resistor portion R and thus it is possible to provide the composite element-type chip part 1 that has a plurality of passive elements on the common substrate 2. Furthermore, since the internal region of the substrate 2 and the region on the surface of the substrate 2 are utilized, and thus the coil L, the first capacitor C1 and the resistor portion R can be formed, it is possible to enhance the flexibility of the design of the passive element.

Specifically, it is possible to acquire the significant flexibility of the arrangement of the coil L, the first capacitor C1 and the resistor portion R, the form of connection between the coil L, the first capacitor C1 and the resistor portion R and the first external electrode 5, the second external electrode 6, the first intermediate external electrode 7 and the second intermediate external electrode 8 and the like. In this preferred embodiment, the coil L, the first capacitor C1 or the resistor portion R is selectively taken out and can be used. In this way, it is possible to provide the composite element-type chip part 1 that includes the first passive element and the second passive element.

Since in the coil region 13, the coil L having an excellent Q value (Quality Factor) is formed, it is possible to provide the composite element-type chip part 1 that includes the coil L having excellent properties on the common substrate 2.

In the first capacitor region 14, the first internal electrode 45 and the second internal electrode 46 have opposite surfaces parallel to each other. In this way, it is possible to increase the capacitance of the first capacitor C1 without occupying a large area on the substrate 2. Thus, it is possible to provide the small-sized chip part 1 that includes the first capacitor C1 of a high capacitance on the common substrate 2 and that is a composite element type.

In the resistance region 15, the resistor portion conductive member film 61 is used to form the resistor portion R. In the resistor portion conductive member film 61, the shape and/or the area of the resistive film line 62 that is exposed between the conductor films 63 adjacent to each other is changed, and thus it is possible to change and adjust the resistance value of the resistor body 66. Moreover, in the resistor portion conductive member film 61, one or a plurality of fuse portions 65 are selected and cut, and thus it is possible to easily realize a plurality of resistance values. By the combination of the resistor portion R, the coil L or the first capacitor C1 described above, it is possible to realize electrical circuits that have various electrical characteristics, more specifically, various frequency characteristics. Consequently, it is possible to use, in common, the manufacturing process of the composite element-type chip parts 1 that can achieve various electrical characteristics, to manufacture them and to provide them.

The chip part 1 includes the surface insulating film 24. The coil region 13 and the first capacitor region 14, and the resistance region 15 are set within the substrate 2 and outside the substrate 2 through the surface insulating film 24. In this way, since through the surface insulating film 24, the region where the coil region 13 and the first capacitor region 14 are formed and the region where the resistor portion R is formed can be partitioned, the coil L, the first capacitor C1 and the resistor portion R can be formed without significantly interfering with each other. Since the surface insulating film 24 has a flat surface, it is possible to satisfactorily form the resistor portion R (the resistor portion conductive member film 61).

Figure 25:
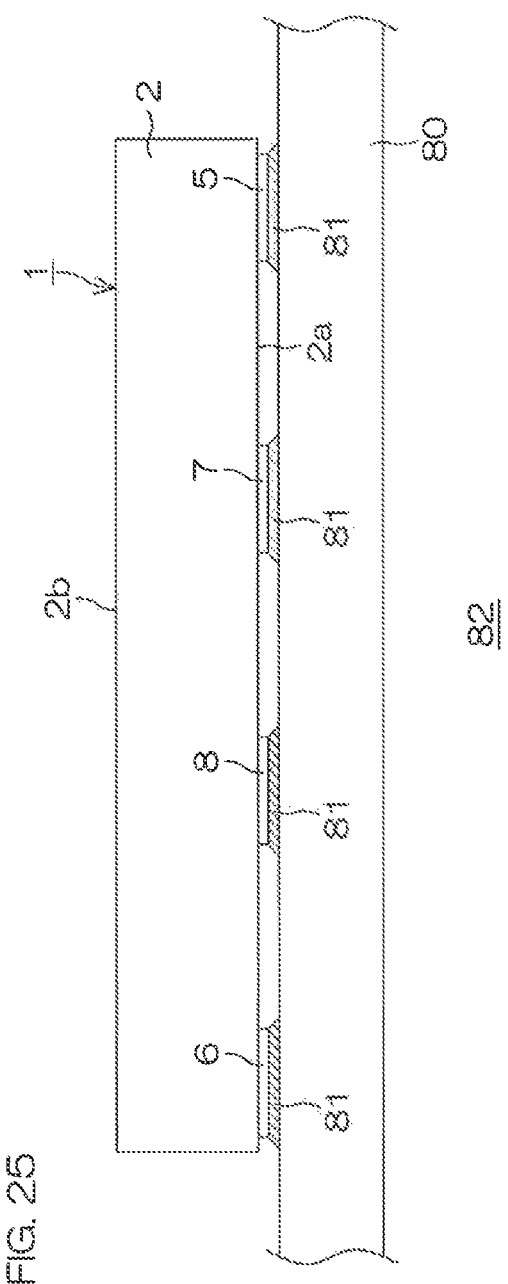
FIG. 25 is a cross-sectional view showing the arrangement of a circuit assembly in which the chip part shown in FIG. 1 is connected to a mounting substrate.

In the chip part 1, on the side of the element formation surface 2a of the substrate 2, the first external electrode 5, the second external electrode 6, the first intermediate external electrode 7 and the second intermediate external electrode 8 are formed. Hence, as shown in FIG. 25, the element formation surface 2a is made opposite to a mounting substrate 80, the first external electrode 5, the second external electrode 6, the first intermediate external electrode 7 and the second intermediate external electrode 8 are bonded on the mounting substrate 80 by a solder 81 and thus it is possible to provide a circuit assembly 82 in which the chip part 1 is surface-mounted on the mounting substrate 80. Specifically, it is possible to provide the chip part 1 of a flip-chip connection type, and with face-down bonding with the element formation surface 2a opposite to the mounting surface of the mounting substrate 80, it is possible to connect the chip part 1 to the mounting substrate 80 by wireless bonding. In this way, it is possible to decrease the space on the mounting substrate 80 occupied by the chip part 1. In particular, it is possible to realize the low profile of the chip part 1 on the mounting substrate 80. In this way, it is possible to effectively utilize the space within the housing of a small-sized electronic device or the like, and thus it is possible to facilitate high-density mounting and miniaturization.

<Method of Manufacturing Chip Part 1>

Figure 26:
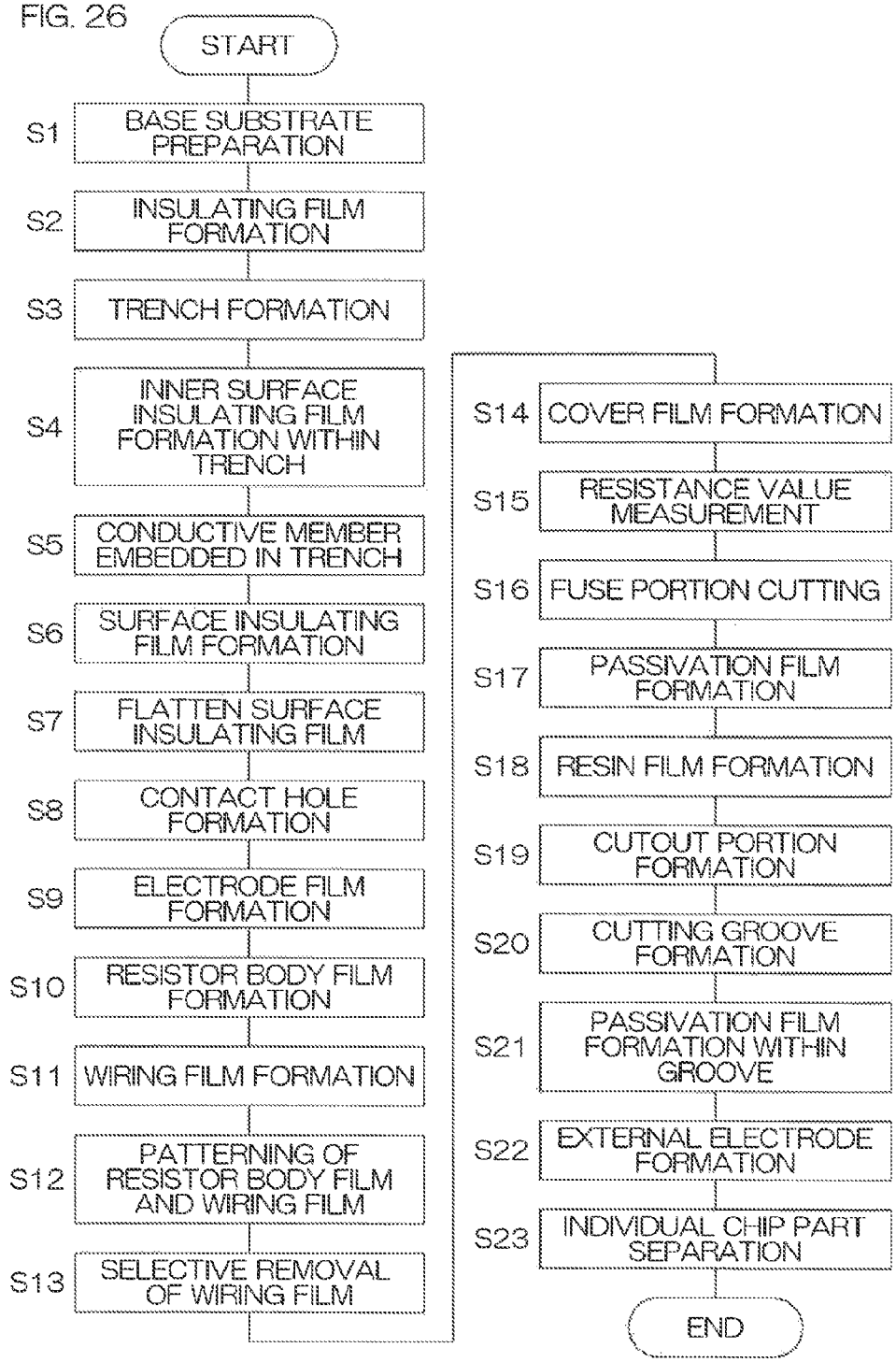
FIG. 26 is a flowchart showing an example of a method of manufacturing the chip part shown in FIG. 1.
Figure 27:
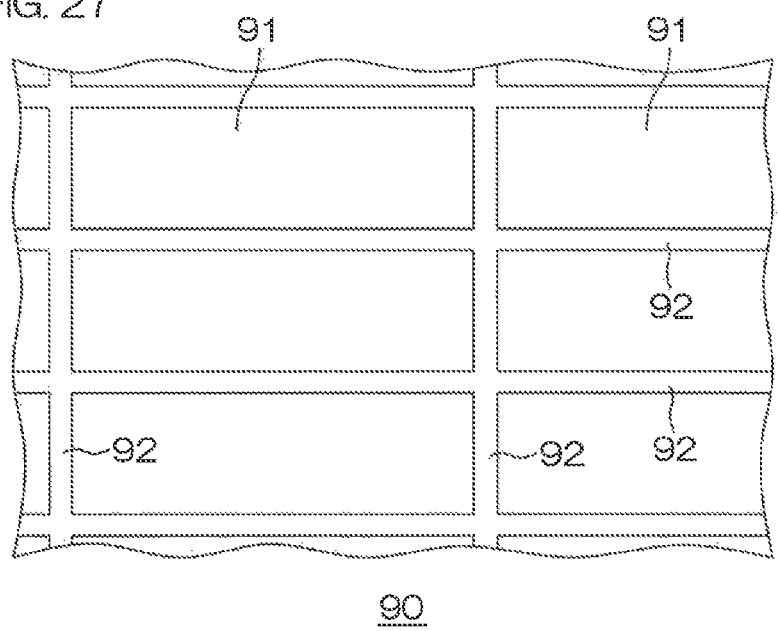
FIG. 27 is a plan view of a base substrate which is the base of the chip part shown in FIG. 1 and shows an enlarged part of the region.

FIG. 26 is a flowchart showing an example of a method of manufacturing the chip part 1. FIG. 27 is a plan view of a base substrate 90 which is the base of the chip part 1 and shows an enlarged part of the region.

The base substrate 90 before the substrate 2 is separated into individual pieces is first prepared (step S1: base surface preparation). The surface of the base substrate 90 corresponds to the element formation surface 2a of the substrate 2, and the back surface of the base substrate 90 corresponds to the back surface 2b of the substrate 2.

As shown in FIG. 27, on the surface of the base substrate 90, chip regions 91 corresponding to a plurality of chip parts 1 are arranged in a matrix. Between the chip regions 91 adjacent to each other, a boundary region 92 is set. The boundary region 92 is a band-shaped region having a substantially constant width, and is formed in the shape of a lattice extending in two directions intersecting each other. After a necessary step is performed on the surface of the base substrate 90, the base substrate 90 is separated along the boundary region 92, and thus the chip regions 91 are separated into individual chip parts 1.

More specifically, after the base substrate 90 is prepared, the insulating film 3 (see FIG. 4 and the like) is formed on the surface of the base substrate 90 (step S2: insulating film formation step). After the formation of the insulating film 3, by photolithography and etching, the portions of the insulating film 3 corresponding to a region where the coil formation trench 16 (see FIG. 3 and the like), the first internal electrode formation trench 41 and the second internal electrode formation trench 42 (see FIG. 8 and the like) are formed are removed (step S3: trench formation step). In this way, the first trench portion 17 (see FIG. 5) of the coil formation trench 16 and the first trench portions 43 (see FIG. 12) of the first internal electrode formation trench 41 and the second internal electrode formation trench 42 are formed on the base substrate 90.

Then, by etching through the first trench portion 17 of the coil formation trench 16 and the first trench portions 43 of the first internal electrode formation trench 41 and the second internal electrode formation trench 42, an unnecessary portion of the base substrate 90 is removed. In this way, the second trench portion 18 (see FIG. 5) of the coil formation trench 16 and the second trench portions 44 (see FIG. 12) of the first internal electrode formation trench 41 and the second internal electrode formation trench 42 are formed on the base substrate 90.

Through the steps described above, on the insulating film 3 and the base substrate 90, the coil formation trench 16, the first internal electrode formation trench 41 and the second internal electrode formation trench 42 are formed. The coil formation trench 16, the first internal electrode formation trench 41 and the second internal electrode formation trench 42 may be formed by using, for example, a so-called BOSCH process.

Then, on the inner surfaces of the coil formation trench 16, the first internal electrode formation trench 41 and the second internal electrode formation trench 42, the inner surface insulating film 19 (see FIGS. 5 and 12) is formed (step S4: inner surface insulating film formation step). Here, on the inner surface including the side portion and the bottom portion of the coil formation trench 16 in the base substrate 90, the inner surface including the side portion and the bottom portion of the first internal electrode formation trench 41 and the inner surface including the side portion and the bottom portion of the second internal electrode formation trench 42, the inner surface insulating film 19 is formed. In this preferred embodiment, in the base substrate 90, the entire wall sandwiched by the coil formation trench 16 in a spiral shape and the entire wall sandwiched between the first internal electrode formation trench 41 and the second internal electrode formation trench 42 adjacent to each other are the insulating film. In this way, the insulator portion 20 (see FIGS. 4 and 13 and the like) having an insulating property is formed on the base substrate 90.

Then, the conductive member 21 is embedded in the coil formation trench 16, the first internal electrode formation trench 41 and the second internal electrode formation trench 42 (step S5: conductive member embedding step). In this step, the first conductive member layer 22 is first formed along the inner surfaces of the coil formation trench 16, the first internal electrode formation trench 41 and the second internal electrode formation trench 42 (see FIGS. 5 and 12). The first conductive member layer 22 may be formed of TiN. Thereafter, anneal processing may be performed. Then, for example, by a CVD method, on the base substrate 90 including the inner surfaces of the coil formation trench 16, the first internal electrode formation trench 41 and the second internal electrode formation trench 42, the second conductive member layer 23 is deposited. The second conductive member layer 23 may be formed of tungsten.

Then, the second conductive member layer 23 is etched back such that the surface of the second conductive member layer 23 is flush with the surface of the insulating film 3. In this way, the conductive member 21 including the first conductive member layer 22 and the second conductive member layer 23 is embedded in the coil formation trench 16, the first internal electrode formation trench 41 and the second internal electrode formation trench 42 (see FIGS. 5 and 12). The coil L is formed by the conductive member 21 embedded in the coil formation trench 16. The first internal electrode 45 and the second internal electrode 46 are formed by the conductive member 21 embedded in the first internal electrode formation trench 41 and the second internal electrode formation trench 42, and thus the first capacitor C1 is formed.

Then, the surface insulating film 24 is formed on the insulating film 3 so as to cover the coil L and the first capacitor C1 (step S6: surface insulating film formation step). The surface insulating film formation step may be a USG film formation step of forming a USG film by, for example, a CVD method. The thickness of the USG film may be, for example, 20000 to 40000 angstroms. Then, the surface of the USG film is flattened (step S7: surface insulating film flatting step). The flattening of the surface of the USG film is performed by, for example, a CMP method. The thickness of the USG film after the flattening may be, for example, 8000 to 15000 angstroms.

Instead of the USG film formation step, an SOG film formation step may be performed. In the SOG film formation step, in a state where the base substrate 90 is rotated at a predetermined rotation speed, an inorganic solvent containing $SiO_2$ or an organic solvent containing $SiO_2$ is applied onto the base substrate 90. The solvent applied to the base substrate 90 receives a centrifugal force caused by the rotation of the base substrate 90 so as to be spread over the entire surface of the base substrate 90. In this way, on the surface of the base substrate 90, a solvent film having a substantially uniform thickness is formed. Thereafter, thermal processing is performed to cure (vitrify) the solvent film. In this way, the surface insulating film 24 having a flat surface is formed. The thickness of the SOG film after the thermal processing may be, for example, 8000 to 15000 angstroms.

Then, by photolithography and etching, the first coil contact hole 26 and the second coil contact hole 28 (see FIG. 3) and the first capacitor contact hole 47 and the second capacitor contact hole 48 (see FIG. 8) are formed in the surface insulating film 24 (step S8: contact hole formation step).

Then, for example, by sputtering, on the surface insulating film 24, an electrode film for forming the first internal electrode film 29 and the second internal electrode film 30 is formed (step S9: electrode film formation step). The electrode film may be formed of aluminum. Then, by photolithography and etching, the electrode film is patterned, and thus the first internal electrode film 29 and the second internal electrode film 30 are formed.

Then, the resistor portion R is formed in the resistance region 15 (see FIG. 14 and the like). First in the resistor portion R formulation step, for example, by sputtering, a conductive member film (hereinafter simply referred to as a "resistor body film") that forms the resistive film line 62, part of the fuse portion 65 and the first conductive member films 67 of the third internal electrode film 49 and the fourth internal electrode film 58 and that has a relatively low conductivity p62 is formed on the surface insulating film 24 (step S10: resistor body film formation step). The resistor body film may be a TiN film.

Then, a conductive member film (hereinafter simply referred to as a "wiring film") that forms the conductor film 63, the connection conductor film 64, part of the fuse portion 65 and the second conductive member films 68 of the third internal electrode film 49 and the fourth internal electrode film 58 and that has a conductivity p63 higher than the conductivity p62 of the resistor body film is formed on the resistor body film (step S11: wiring film formation step). The wiring film may be an aluminum film.

Then, by photolithography and etching, the resistor body film and the wiring film are patterned simultaneously (step S12: resistor body film and wiring film patterning step). In this way, the third internal electrode film 49, the fourth internal electrode film 58, the resistive film line 62, the connection conductor film 64 and the fuse portion 65 are formed simultaneously. Here, the wiring film covers the entire region of the resistive film line 62. Then, for example, by wet etching, the wiring film formed on the resistive film line 62 is selectively removed (step S13: wiring film removal step). In this way, on the resistive film line 62, the conductor film 63 is formed a given distance apart.

Then, for example, by a CVD method, a cover film that covers the entire region of the surface insulating film 24 is formed (step S14: cover film formation step). The cover film may be a nitride film. Then, the cover film is selectively etched, and thus parts of the third internal electrode film 49 and the fourth internal electrode film 58 are exposed.

Then, the probe of a resistance measuring device is brought into contact with the third internal electrode film 49 and the fourth internal electrode film 58, and thus the resistance value of the resistor portion R is measured (step S15: resistance value measuring step). Then, laser light is applied through the cover film to blow an arbitrary fuse portion 65 (step S16: fuse portion cutting step). A region other than the exposed portions of the third internal electrode film 49 and the fourth internal electrode film 58 is covered by the cover film. Thus, it is possible to reduce a connection failure such as a short circuit caused by the adherence of broken pieces and the like produced by the blowing to another region.

Then, by a CVD method, on the surface insulating film 24, a nitride film is formed again, and the cover film is thickened. In this way, the passivation film 35 is formed (step S17: passivation film formation step).

Then, on the passivation film 35, a photosensitive polyimide is applied (step S18: resin film formation step). The photosensitive polyimide is exposed by a pattern corresponding to the first cutout portion 37, the second cutout portion 38, the third cutout portion 52 and the fourth cutout portion 69, and is thereafter developed. In this way, the resin film 36 having cutout portions corresponding to the first cutout portion 37, the second cutout portion 38, the third cutout portion 52 and the fourth cutout portion 69 is formed. Thereafter, as necessary, thermal processing for curing the resin film 36 is performed. Then, the resin film 36 is used as a mask, and thus an unnecessary portion of the passivation film 35 is removed by dry etching (step S19: cutout portion formation step). In this way, the first cutout portion 37, the second cutout portion 38, the third cutout portion 52 and the fourth cutout portion 69 are formed (see FIG. 2 and the like).

Then, a resist mask having a lattice-shaped opening matching with the boundary region 92 (see FIG. 27) is formed on the resin film 36 (step S20: cutting groove formation step). Plasma etching is performed through this resist mask, and thus the surface insulating film 24, the insulating film 3 and the base substrate 90 are removed from the surface of the surface insulating film 24 to a predetermined depth. In this way, a cutting groove (scribe groove) is formed along the boundary region 92. After the formation of the groove, the resist mask is separated.

Then, for example, by a CVD method, over the entire region of the base substrate 90 including the inner surface (the side portion and the bottom portion) of the groove, the passivation film 4 such as a nitride film is formed (step S21: passivation film formation step). Then, the passivation film 4 is selectively etched such that the portion corresponding to the side surfaces 2c of the substrate 2 is covered by the passivation film 4.

Then, for example, by electroless plating, Ni, Pd and Au are sequentially plated by being grown on the first cutout portion 37, the second cutout portion 38, the third cutout portion 52 and the fourth cutout portion 69 (step S22: external electrode formation step). In this way, the first external electrode 5, the second external electrode 6, the first intermediate external electrode 7 and the second intermediate external electrode 8 are formed.

Then, by a DBG (Dicing Before Grinding) method, the chip regions 91 are separated into individual chip parts 1 (step S23: individual chip part separation step). Specifically, a support tape having an adherence surface is first adhered to the side of the surface of the base substrate 90. Then, the base substrate 90 is ground from the back surface to reach the bottom portion of the groove. In this way, a plurality of chip regions 91 are separated into individual chip parts 1.

Second Preferred Embodiment

Figure 28:
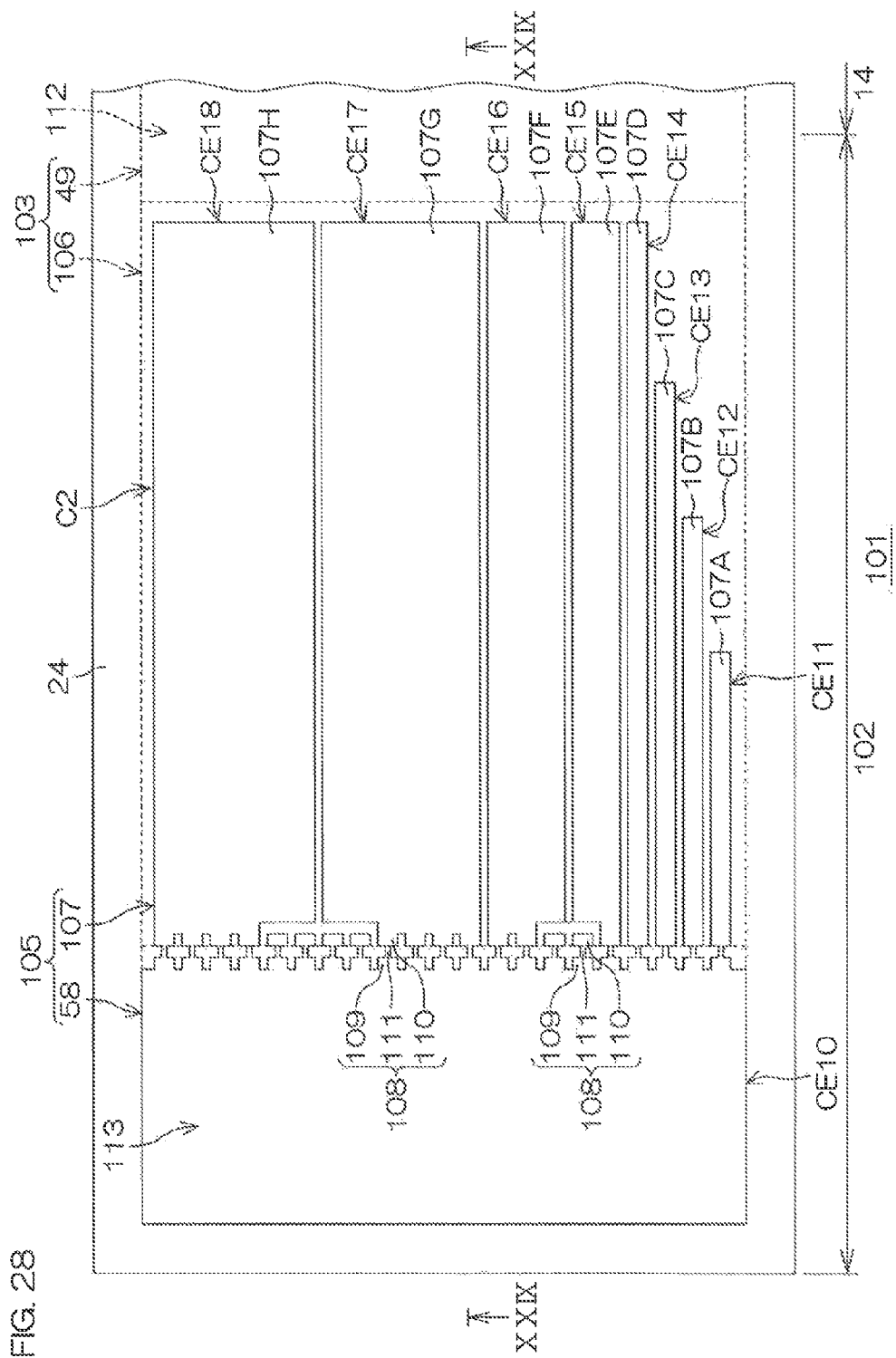
FIG. 28 is a plan view showing a second capacitor region of a chip part according to a second preferred embodiment of the present invention.
Figure 29:
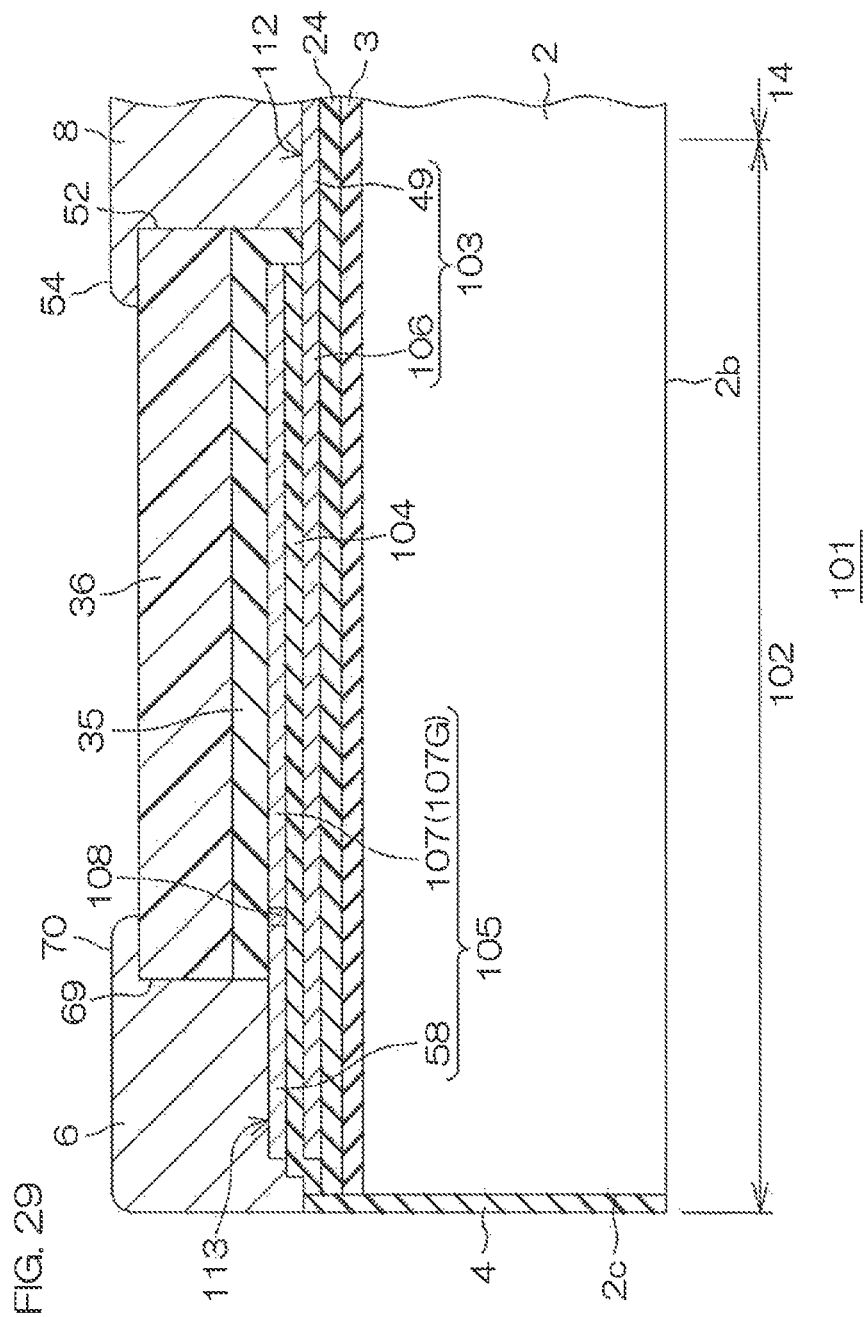
FIG. 29 is a cross-sectional view taken along line XXIX-XXIX shown in FIG. 28.

FIG. 28 is a plan view showing a second capacitor region 102 of a chip part 101 according to a second preferred embodiment of the present invention. FIG. 29 is a cross-sectional view taken along line XXIX-XXIX shown in FIG. 28. In FIGS. 28 and 29, portions corresponding to the individual portions shown in FIGS. 1 to 27 are identified with the same reference symbols, and their description will be omitted.

As shown in FIGS. 28 and 29, in this preferred embodiment, instead of the resistance region 15 described previously, the second capacitor region 102 is set. In the second capacitor region 102, a second capacitor C2 is formed. The second capacitor C2 includes a first electrode film 103 (second conductive member) formed on the surface insulating film 24, a dielectric film 104 formed on the first electrode film 103 and a second electrode film 105 formed on the dielectric film 104. In FIG. 28, the first electrode film 103 is represented by broken lines, and the second electrode film 105 is represented by solid lines.

The first electrode film 103 includes the third internal electrode film 49 described previously and a first capacitor electrode film 106 formed integrally with the third internal electrode film 49. The first capacitor electrode film 106 is extended from the third internal electrode film 49 to a region immediately below the second external electrode 6. The first capacitor electrode film 106 is electrically connected through the third internal electrode film 49 to the second intermediate external electrode 8. In other words, the third internal electrode film 49 also functions as one end 112 of the second capacitor C2. The third internal electrode film 49 forms a common internal connection portion that simultaneously connects the one end 112 of the second capacitor C2 and the other end 53 of the first capacitor C1.

The dielectric film 104 is formed on the surface insulating film 24 so as to cover the first capacitor electrode film 106. The dielectric film 104 may be, for example, an oxide film (SiO₂ film) or a nitride film (SiN film). The dielectric film 104 may also be an ONO film that includes an oxide film (SiO₂ film)/a nitride film (SiN film)/an oxide film (SiO₂ film) in this order.

The second electrode film 105 includes the fourth internal electrode film 58 described previously, a second capacitor electrode film 107 formed integrally with the fourth internal electrode film 58 and a plurality of fuse portions 108 that connect the fourth internal electrode film 58 and the second capacitor electrode film 107. The second capacitor electrode film 107 is electrically connected through the fourth internal electrode film 58 to the second external electrode 6. In other words, the fourth internal electrode film 58 also functions as the other end 113 of the second capacitor C2.

The second capacitor electrode film 107 is divided into two or more (in this preferred embodiment, eight) electrode film portions 107A to 107H. Each of the electrode film portions 107A to 107H is formed, in plan view, in the shape of a rectangle extending from the fuse portion 108 toward the second intermediate external electrode 8 in the shape of a band. The electrode film portions 107A to 107H are opposite to the first capacitor electrode film 106 through the dielectric film 104. The opposite area of the electrode film portions 107A to 107H to the first capacitor electrode film 106 may include a geometric progression with a common ratio being one or more. The opposite area of the electrode film portions 107A to 107H to the first capacitor electrode film 106 may be, for example, 1:2:4:8:16:32:64:64.

In the second capacitor region 102, the fourth internal electrode film 58 is opposite to the first capacitor electrode film 106 through the dielectric film 104, and thus a capacitor element CE10 is formed. The electrode film portions 107A to 107H are opposite to the first capacitor electrode film 106 through the dielectric film 104, and thus a plurality of capacitor elements CE11 to CE18 are formed.

The electrode film portions 107A to 107H are electrically connected through one or a plurality of fuse portions 108 to the fourth internal electrode film 58. Part of the fuse portions 108 may be unused.

The fuse portion 108 is formed along the side of the fourth internal electrode film 58 on the side of the second capacitor region 102. The fuse portion 108 includes a first wide portion 109 that is connected to the fourth internal electrode film 58, a second wide portion 110 that is connected to the electrode film portions 107A to 107H and a narrow portion 111 that is connected between the first wide portion 109 and the second wide portion 110. The narrow portion 111 is arranged to have a width narrower than the first wide portion 109 and the second wide portion 110. The narrow portion 111 is selectively cut (blown), and thus the electrode film portions 107A to 107H can be electrically separated from the second external electrode 6 and the second intermediate external electrode 8.

Figure 30:
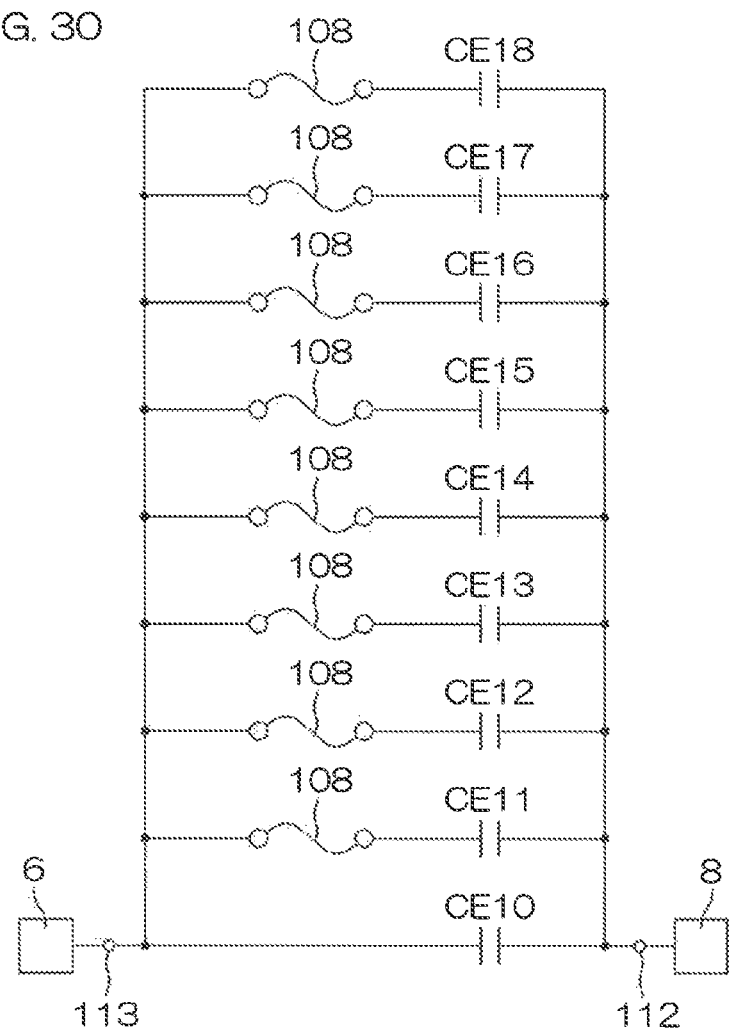
FIG. 30 is an electrical circuit diagram showing an example of an electrical structure of a second capacitor region shown in FIG. 28.

FIG. 30 is an electrical circuit diagram showing an example of an electrical structure of the second capacitor region 102 shown in FIG. 28.

As shown in FIG. 30, a plurality of capacitor elements CE10 to CE18 are connected parallel to each other between the second external electrode 6 and the second intermediate external electrode 8. In the capacitor element CE10 formed in a region immediately below the second external electrode 6, no fuse portion 108 is provided. On the other hand, the fuse portions 108 are connected in series to the capacitor elements CE11 to CE18 formed with the electrode film portions 107A to 107H.

When all the fuse portions 108 are connected, the capacitance value of the second capacitor C2 is the value of the combined capacitance of the capacitor elements CE10 to CE18. When all the fuse portions 108 are cut (blown), the capacitance value of the second capacitor C2 is the capacitance value of the capacitor element CE10 formed in a region immediately below the second external electrode 6. On the other hand, when the fuse portions 108 are selectively cut (blown), the capacitance value of the second capacitor C2 is reduced by the capacitance value of the capacitor elements CE10 to CE18 which are separated.

<Method of Manufacturing Second Capacitor C2>

Figure 31:
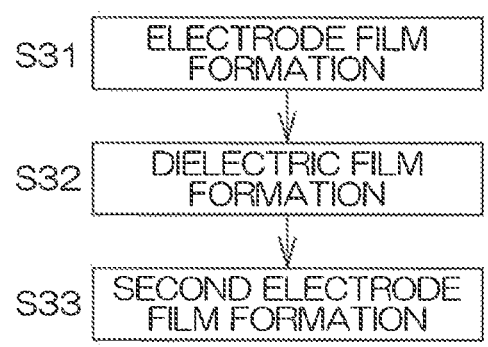
FIG. 31 is a process diagram showing an example of a method of manufacturing the chip part shown in FIG. 28.

FIG. 31 is a process diagram showing an example of a method of manufacturing the chip part 101 shown in FIG. 28.

In order to manufacture the second capacitor C2, instead of steps S9 to S13 shown in FIG. 26, steps S31 to S33 shown in FIG. 31 are performed.

The electrode film formation step in step S9 is first utilized, and thus together with the first internal electrode film 29 and the second internal electrode film 30, the first electrode film 103 including the third internal electrode film 49 is formed in the second capacitor region 102 (step S31: electrode film formation step). Then, the dielectric film 104 is formed so as to cover the first electrode film 103 (step S32: dielectric film formation step). The dielectric film 104 may be an ONO film in which an oxide film ($SiO_2$ film)/a nitride film (SiN film)/an oxide film ($SiO_2$ film) are laminated in this order. Then, an electrode film for forming the second electrode film 105 is formed so as to cover the dielectric film 104 (step S33: second electrode film formation step). Then, a resist mask corresponding to the final shape of the second electrode film 105 is formed on the electrode film. By etching through this resist mask, the second electrode film 105 including the fourth internal electrode film 58, the second capacitor electrode film 107 and the fuse portion 108 is formed.

Then, in the same steps as steps S14 to S16 described previously, the capacitance value of the second capacitor C2 is adjusted. Thereafter, steps S17 to S23 are sequentially performed, and thus the chip part 101 including the second capacitor region 102 is manufactured.

<Effects of Chip Part 101>

In the arrangement described above, it is possible to provide the chip part 101 that includes, on the common substrate 2, the coil region 13, the first capacitor region 14 and the second capacitor region 102, and includes a CLC series circuit network. In the second capacitor region 102, depending on whether or not the fuse portion 108 is cut (blown), it is possible to easily change and adjust the capacitance value of the second capacitor C2. Hence, by the combination of the second capacitor C2, the coil L and the first capacitor C1, it is possible to realize electrical circuits that have various electrical characteristics, more specifically, various frequency characteristics. Thus, it is possible to provide the composite element-type chip part 101 that can easily satisfy the desired electrical characteristics. In this way, it is possible to use, in common, the manufacturing process of the composite element-type chip parts 101 that can achieve various electrical characteristics, to manufacture them and to provide them.

Although in this preferred embodiment, the example of the chip part 101 including the CLC series circuit network in which, instead of the resistance region 15, the second capacitor region 102 is set, is described, instead of the first capacitor region 14, the second capacitor region 102 may be set. In other words, the chip part 101 may include the CLR series circuit network that includes the second capacitor region 102, the coil region 13 described above and the resistance region 15 described above. In this case, the chip part 101 includes the resistor portion R whose resistance value can be changed and adjusted and the second capacitor C2 whose capacitance value can be changed and adjusted. By combining the resistor portion R and the second capacitor C2 described above with the coil L, it is possible to further increase the feasible electrical characteristics (frequency characteristics). In this way, it is possible to use, in common, the manufacturing process of the composite element-type chip parts 101 that can achieve various electrical characteristics, to manufacture them and to provide them.

Third Preferred Embodiment

Figure 32:
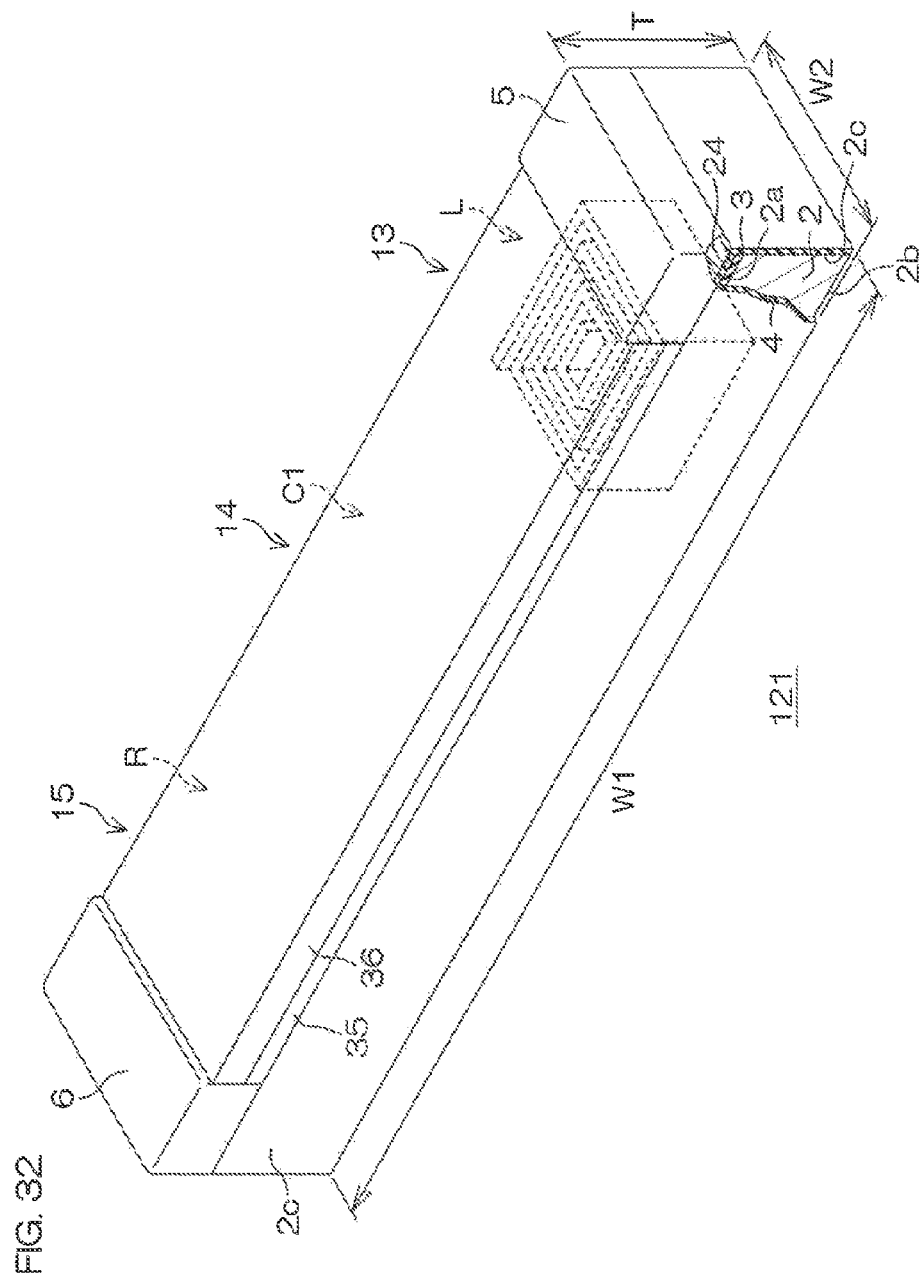
FIG. 32 is a partially cut-away perspective view of a chip part according to a third preferred embodiment of the present invention.
Figure 33:
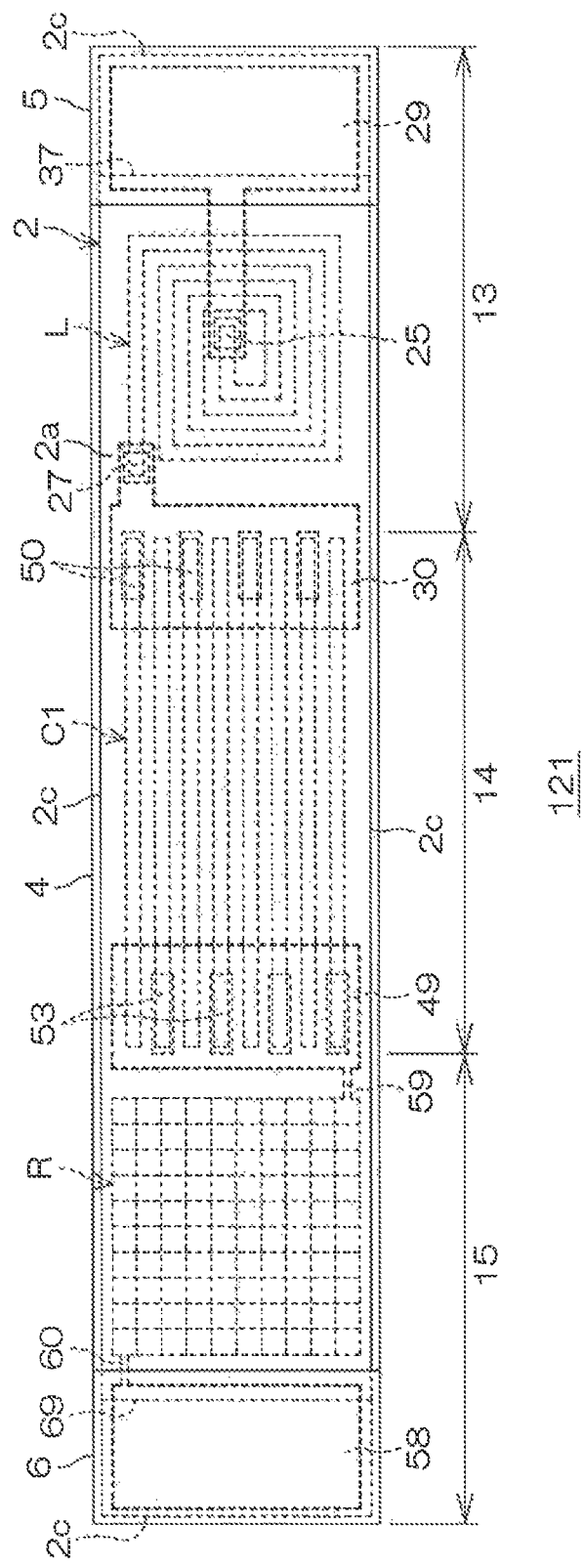
FIG. 33 is a plan view of the chip part shown in FIG. 32.

FIG. 32 is a partially cut-away perspective view of a chip part 121 according to a third preferred embodiment of the present invention. FIG. 33 is a plan view of the chip part 121. In FIGS. 32 and 33, portions corresponding to the individual portions shown in FIGS. 1 to 31 are identified with the same reference symbols, and their description will be omitted.

As shown in FIG. 32, the chip part 121 does not include the first intermediate external electrode 7 and the second intermediate external electrode 8. In other words, as shown in FIG. 33, the chip part 121 has an arrangement in which the second cutout portion 38 and the third cutout portion 52 are omitted from the preferred embodiment described previously.

In the arrangement described above, since it is not necessary to form the first intermediate external electrode 7 and the second intermediate external electrode 8, it is possible to provide an inexpensive chip part 121.

Fourth Preferred Embodiment

Figure 34:
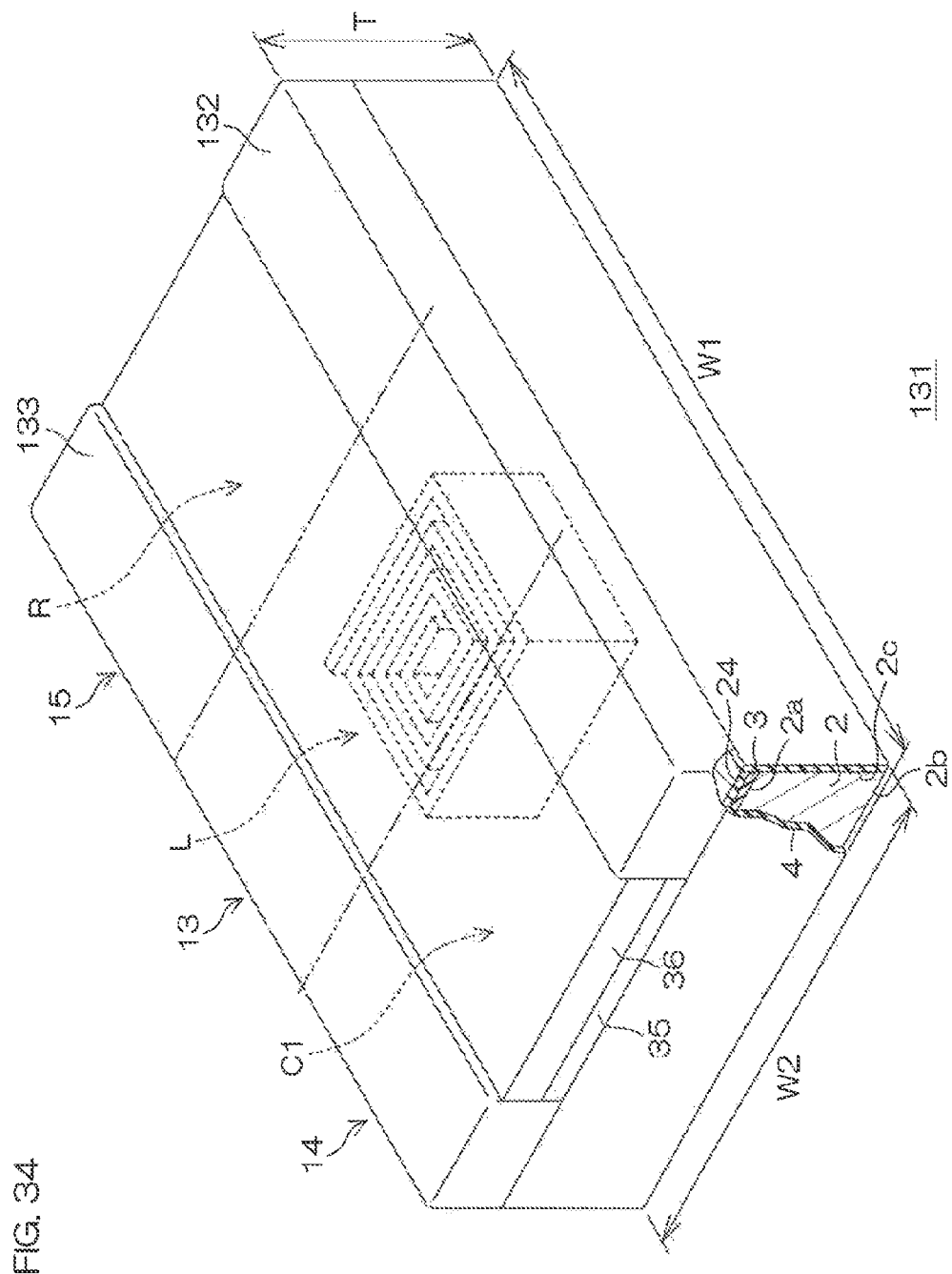
FIG. 34 is a partially cut-away perspective view of a chip part according to a fourth preferred embodiment of the present invention.
Figure 35:
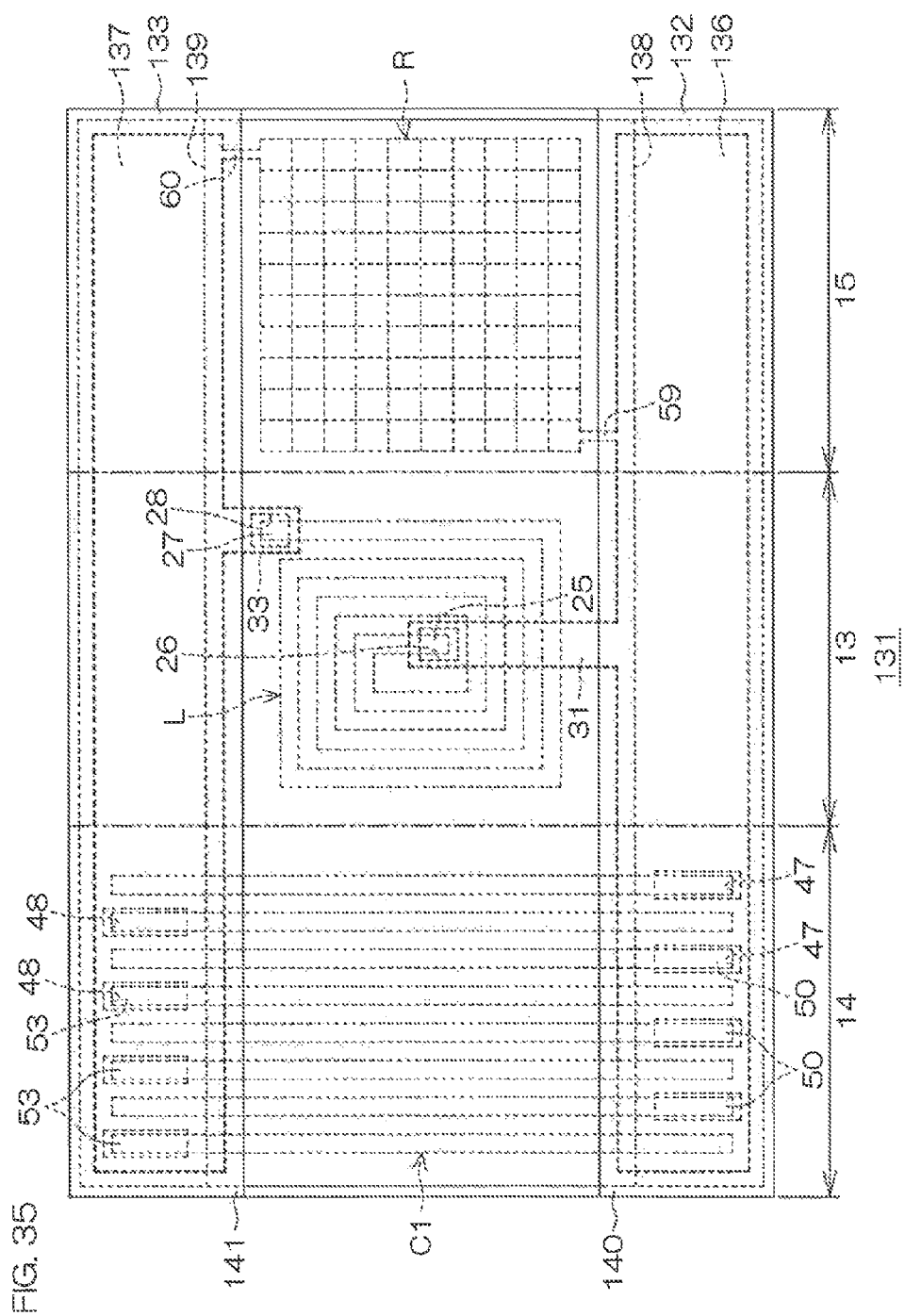
FIG. 35 is a plan view of the chip part shown in FIG. 34.

FIG. 34 is a partially cut-away perspective view of a chip part 131 according to a fourth preferred embodiment of the present invention. FIG. 35 is a plan view of the chip part 131 shown in FIG. 34. In FIGS. 34 and 35, portions corresponding to the individual portions shown in FIGS. 1 to 33 are identified with the same reference symbols, and their description will be omitted.

As shown in FIG. 34, the chip part 131 is formed in the shape of a rectangular parallelepiped. The planar shape of the chip part 131 is rectangular, and a length W1 in the longitudinal direction thereof may be 1.0 to 1.2 mm, and a length W2 in the widthwise direction may be about 0.4 mm. The entire thickness T of the chip part 131 may be about 0.15 mm.

The chip part 131 includes a substrate 2 in the shape of a rectangular parallelepiped. The substrate 2 includes a pair of main surfaces 2a and 2b and four side surfaces 2c. One (the main surface 2a on the upper surface side of FIG. 34) of the pair of main surfaces 2a and 2b is an element formation surface. Hereinafter, the main surface 2a is referred to as an "element formation surface 2a," and the main surface 2b on the opposite side to the element formation surface 2a is referred to as a "back surface 2b." The surface (the element formation surface 2a) of the substrate 2 is covered by an insulating film 3. The four side surfaces 2c of the substrate 2 and the peripheral portion of the insulating film 3 are covered by a passivation film 4.

As shown in FIG. 35, on the substrate 2, a first external electrode 132 and a second external electrode 133 are formed apart from each other. The first external electrode 132 is arranged along an end portion on one side along the longitudinal direction of the substrate 2. The first external electrode 132 is formed, in plan view, in the shape of a rectangle. The second external electrode 133 is arranged along the end portion on the other side along the longitudinal direction of the substrate 2. The second external electrode 133 is formed, in plan view, in the shape of a rectangle.

In this preferred embodiment, along a direction (direction perpendicularly intersecting) intersecting the direction in which the first external electrode 132 and the second external electrode 133 are opposite to each other, a plurality of passive element regions are aligned. More specifically, the plurality of passive element regions include the coil region 13 described above, the first capacitor region 14 described above and the resistance region 15 described above. In this preferred embodiment, an example where the first capacitor region 14 and the resistance region 15 are arranged so as to sandwich the coil region 13 is shown.

Below the first external electrode 132, a first internal electrode film 136 is arranged. The first internal electrode film 136 is arranged so as to cross the boundary between the first capacitor region 14 and the coil region 13 and the boundary between the coil region 13 and the resistance region 15. In the resistance region 15, the first internal electrode film 136 is electrically connected to the one end 59 of the resistor portion R. In the coil region 13, the first internal electrode film 136 is electrically connected to the one end 25 of the coil L through the first drawing electrode 31 entering the first coil contact hole 26 formed in the surface insulating film 24. In the first capacitor region 14, the first internal electrode film 136 enters the first capacitor contact hole 47 formed in the surface insulating film 24, and is electrically connected to the one end 50 of the first capacitor C1.

Below the second external electrode 133, a second internal electrode film 137 is arranged. The second internal electrode film 137 is arranged so as to cross the boundary between the first capacitor region 14 and the coil region 13 and the boundary between the coil region 13 and the resistance region 15. In the resistance region 15, the second internal electrode film 137 is electrically connected to the other end 60 of the resistor portion R. In the coil region 13, the second internal electrode film 137 is electrically connected to the other end 27 of the coil L through the second drawing electrode 33 entering the second coil contact hole 28 formed in the surface insulating film 24. In the first capacitor region 14, the second internal electrode film 137 enters the second capacitor contact hole 48 formed in the surface insulating film 24, and is electrically connected to the other end 53 of the first capacitor C1.

In the passivation film 35 and the resin film 36, a first cutout portion 138 is formed that exposes a region other than the resistance region 15 of the first internal electrode film 136, the coil region 13 and an edge portion on the side of the first capacitor region 14. Likewise, in the passivation film 35 and the resin film 36, a second cutout portion 139 is formed that exposes a region other than the resistance region 15 of the second internal electrode film 137, the coil region 13 and the edge portion on the side of the first capacitor region 14.

The first external electrode 132 is formed so as to fill the first cutout portion 138. The first external electrode 132 is formed so as to protrude from the resin film 36. The first external electrode 132 includes a covering portion 140 that is drawn out to the side of the resistance region 15, the coil region 13 and the first capacitor region 14 along the surface of the resin film 36. Likewise, the second external electrode 133 is formed so as to fill the second cutout portion 139. The second external electrode 133 is formed so as to protrude from the resin film 36. The second external electrode 133 includes a covering portion 141 that is drawn out to the side of the resistance region 15, the coil region 13 and the first capacitor region 14 along the surface of the resin film 36.

Figure 36:
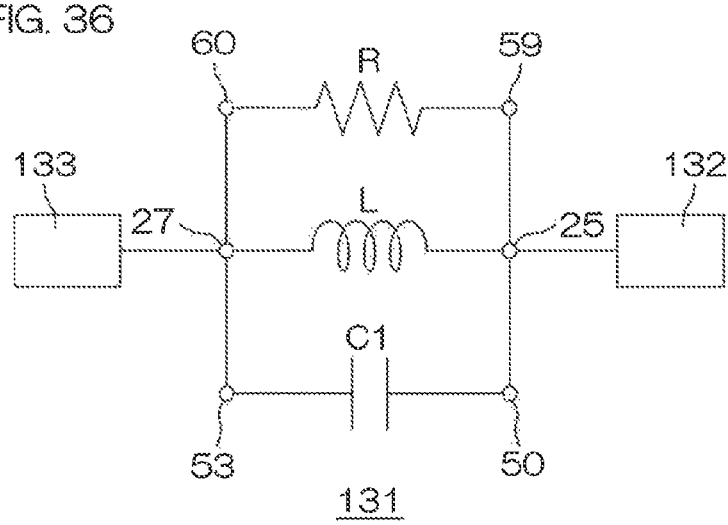
FIG. 36 is an electrical circuit diagram showing an example of an electrical structure of the chip part shown in FIG. 34.

FIG. 36 is an electrical circuit diagram showing an example of an electrical structure of the chip part 131 shown in FIG. 34.

As shown in FIG. 36, the one end 59 of the resistor portion R, the one end 25 of the coil L and the one end 50 of the first capacitor C1 are connected to the first external electrode 132 through the first internal electrode film 136 (see FIG. 35). On the other hand, the other end 60 of the resistor portion R, the other end 27 of the coil L and the other end 53 of the first capacitor C1 are connected to the second external electrode 133 through the second internal electrode film 137 (see FIG. 35). In this way, a RLC parallel circuit network is formed in which the resistor portion R, the coil L and the first capacitor C1 are connected in parallel.

In the arrangement described above, it is possible to provide the chip part 131 in which the RLC parallel circuit network is formed on the common substrate 2.

Figure 37:
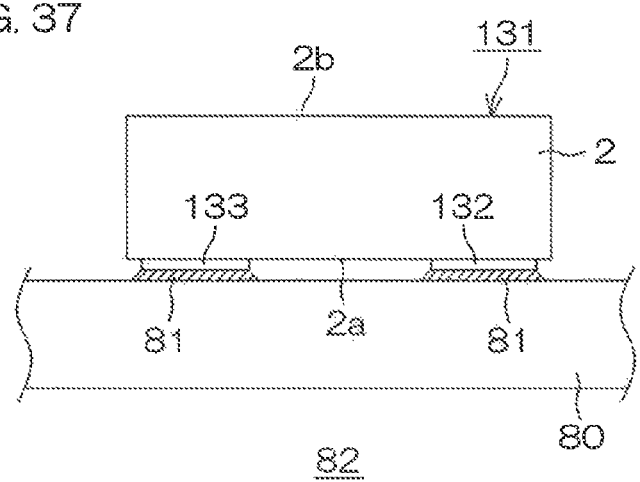
FIG. 37 is a cross-sectional view showing the arrangement of a circuit assembly in which the chip part shown in FIG. 34 is connected to a mounting substrate.

In the chip part 131, on the element formation surface 2a which is one surface of the substrate 2, the first external electrode 132 and the second external electrode 133 are formed. Hence, as shown in FIG. 37, the element formation surface 2a is opposite to the mounting substrate 80, the first external electrode 132 and the second external electrode 133 are bonded by the solder 81 on the mounting substrate 80 with face-down bonding and thus it is possible to provide the circuit assembly 82 in which the chip part 131 is surface-mounted on the mounting substrate 80. In this way, it is possible to decrease the space on the mounting substrate 80 occupied by the chip part 131, and thus it is possible to realize the low profile of the chip part 131 on the mounting substrate 80. Consequently, it is possible to effectively utilize the space within the housing of a small-sized electronic device or the like, and thus it is possible to facilitate high-density mounting and miniaturization.

Fifth Preferred Embodiment

Figure 38:
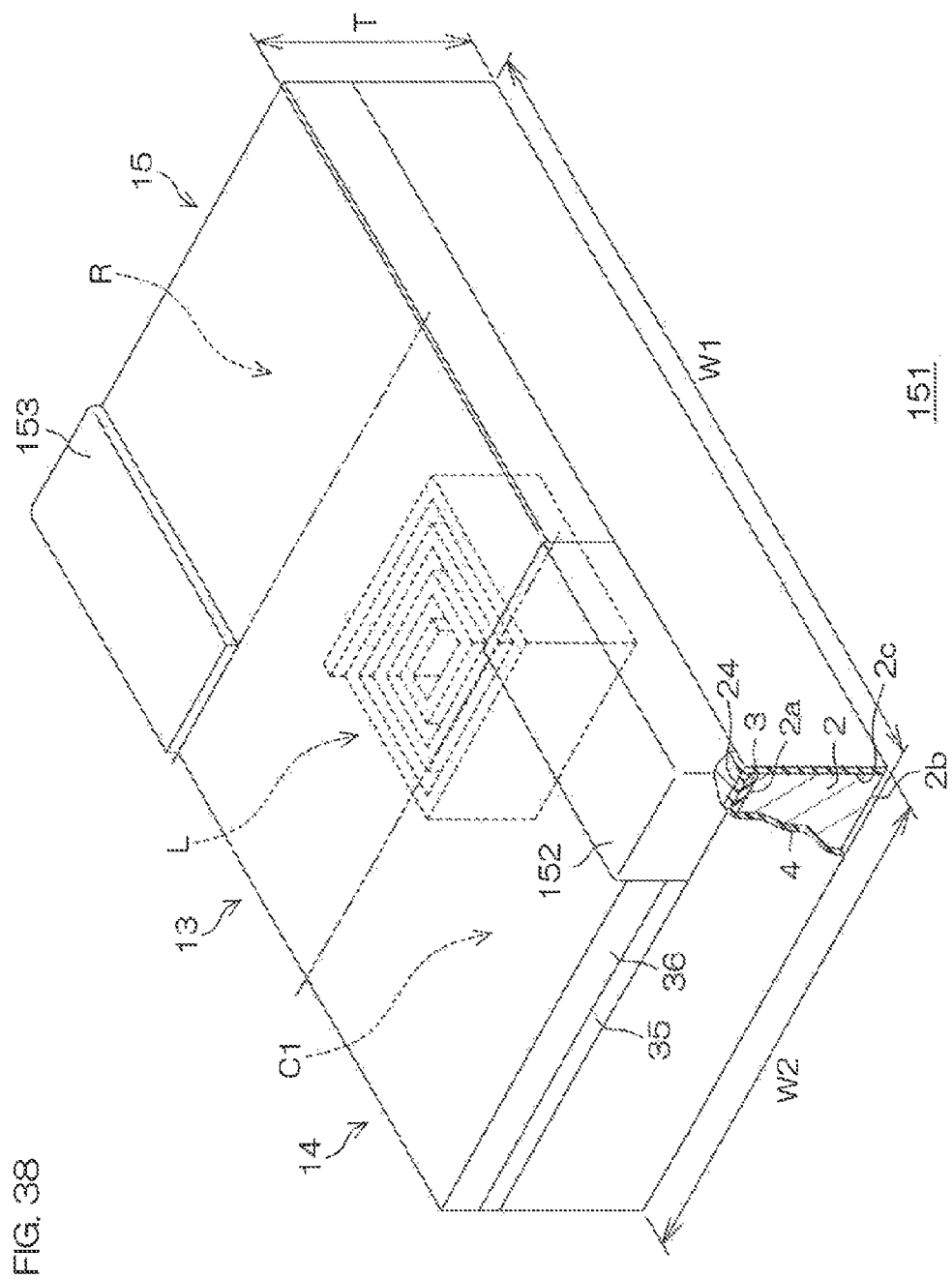
FIG. 38 is a partially cut-away perspective view of a chip part according to a fifth preferred embodiment of the present invention.
Figure 39:
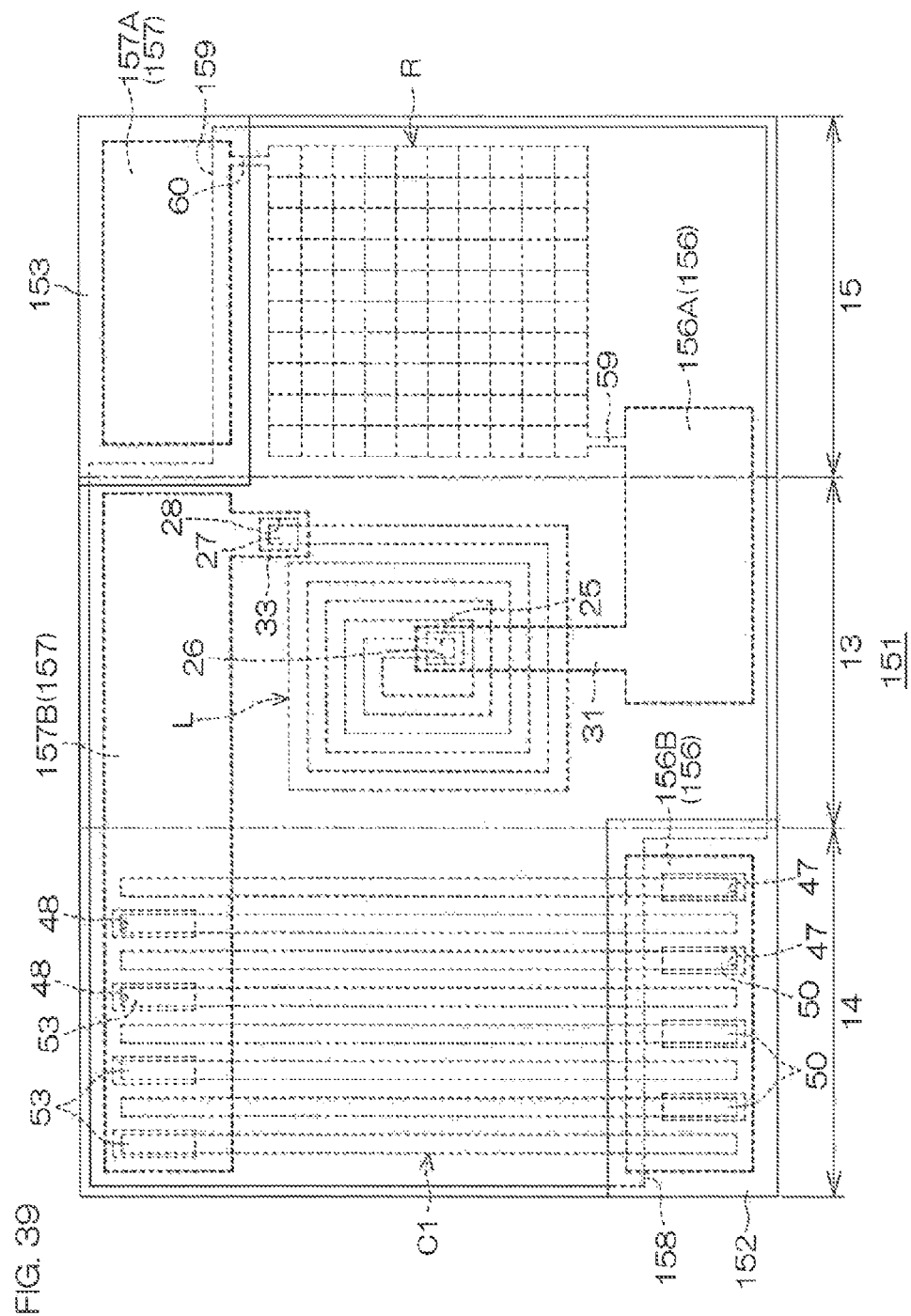
FIG. 39 is a plan view of the chip part shown in FIG. 38.

FIG. 38 is a partially cut-away perspective view of a chip part 151 according to a fifth preferred embodiment of the present invention. FIG. 39 is a plan view of the chip part 151 shown in FIG. 38. In FIGS. 38 and 39, portions corresponding to the individual portions shown in FIGS. 1 to 37 are identified with the same reference symbols, and their description will be omitted.

As shown in FIGS. 38 and 39, on the substrate 2, a first external electrode 152 and a second external electrode 153 are formed apart from each other. The first external electrode 152 is arranged in a corner portion (corner portion on the side of the first capacitor region 14) where an end portion on one side along the longitudinal direction of the substrate 2 intersects an end portion on one side along the widthwise direction of the substrate 2. The first external electrode 152 is formed, in plan view, in the shape of a rectangle. The second external electrode 153 is arranged in a corner portion (corner portion on the side of the resistance region) where an end portion on the other side along the longitudinal direction of the substrate 2 intersects an end portion on the other side along the widthwise direction of the substrate 2. The second external electrode 153 is formed, in plan view, in the shape of a rectangle.

In this preferred embodiment, along a direction intersecting a direction in which the first external electrode 152 and the second external electrode 153 are opposite to each other, the coil region 13 described previously, the first capacitor region 14 described previously and the resistance region 15 described previously are arranged.

As shown in FIG. 39, along the end portion on the one side along the longitudinal direction of the substrate 2, a first internal electrode film 156 is formed. The first internal electrode film 156 includes an electrode film portion that electrically connects at least two of the one end 25 of the coil L, the one end 50 of the first capacitor C1 and the one end 59 of the resistor portion R. More specifically, in this preferred embodiment, the first internal electrode film 156 includes a first electrode film portion 156A and a second electrode film portion 156B arranged apart from each other.

The first electrode film portion 156A is formed to cross the boundary between the coil region 13 and the resistance region 15, and is electrically connected to the one end 25 of the coil L and the one end 59 of the resistor portion R. The second electrode film portion 156B is arranged below the first external electrode 152, and is electrically connected to the one end 50 of the first capacitor C1.

Between the first electrode film portion 156A and the second electrode film portion 156B, the surface insulating film 24 is exposed. On the surface insulating film 24, the passivation film 35 and the resin film 36 are formed. Hence, the area between the first electrode film portion 156A and the second electrode film portion 156B is electrically insulated. Hence, the first electrode film portion 156A is not directly connected to the second electrode film portion 156B.

At the end portion on the other side along the longitudinal direction of the substrate 2, a second internal electrode film 157 is formed. The second internal electrode film 157 includes an electrode film portion that electrically connects at least two of the other end 27 of the coil L, the other end 53 of the first capacitor C1 and the other end 60 of the resistor portion R. More specifically, in this preferred embodiment, the second internal electrode film 157 includes a first electrode film portion 157A and a second electrode film portion 157B arranged apart from each other.

The first electrode film portion 157A is arranged below the second external electrode 153, and is electrically connected to the other end 60 of the resistor portion R. The second electrode film portion 157B is formed to cross the boundary between the coil region 13 and the first capacitor region 14, and is electrically connected to the other end 27 of the coil L and the other end 53 of the first capacitor C1.

Between the first electrode film portion 157A and the second electrode film portion 157B, the surface insulating film 24 is exposed. On the surface insulating film 24, the passivation film 35 and the resin film 36 are formed. Hence, the area between the first electrode film portion 157A and the second electrode film portion 157B is electrically insulated. Hence, the first electrode film portion 157A is not directly connected to the second electrode film portion 157B.

In the passivation film 35 and the resin film 36, a first cutout portion 158 is formed that exposes the second electrode film portion 156B of the first internal electrode 156. The first external electrode 152 is formed so as to fill the first cutout portion 158. Likewise, in the passivation film 35 and the resin film 36, a second cutout portion 159 is formed that exposes the second electrode film portion 157A of the second internal electrode 157. The second external electrode 153 is formed so as to fill the second cutout portion 159.

<Electrical Circuit>

Figure 40:
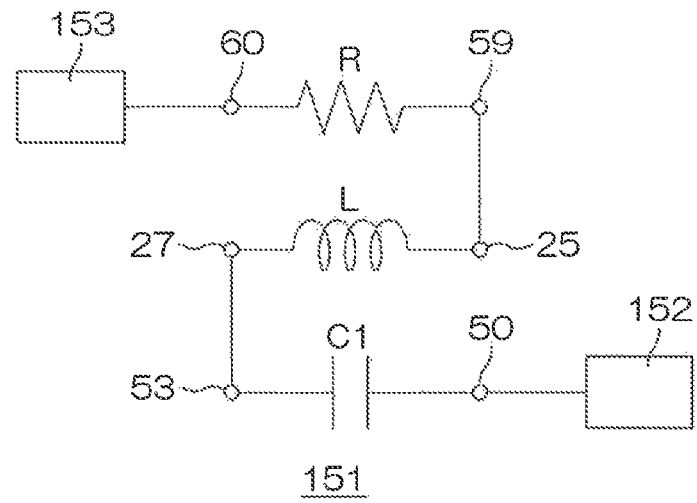
FIG. 40 is an electrical circuit diagram showing an example of an electrical structure of the chip part shown in FIG. 38.

FIG. 40 is an electrical circuit diagram showing an example of an electrical structure of the chip part 151.

The other end 60 of the resistor portion R is electrically connected to the second external electrode 153 through the first electrode film portion 157A of the second internal electrode film 157. The one end 59 of the resistor portion R is electrically connected to the one end 25 of the coil L through the second electrode film portion 156B of the first internal electrode film 156. The other end 27 of the coil L is electrically connected to the other end 53 of the first capacitor C1 through the second electrode film portion 157B of the second internal electrode film 157. The one end 50 of the first capacitor C1 is electrically connected to the first external electrode 152 through the first electrode film portion 156A of the first internal electrode film 156. In this way, the RLC series circuit network in which the resistor portion R, the coil L and the first capacitor C1 are connected in series is formed.

Figure 41:
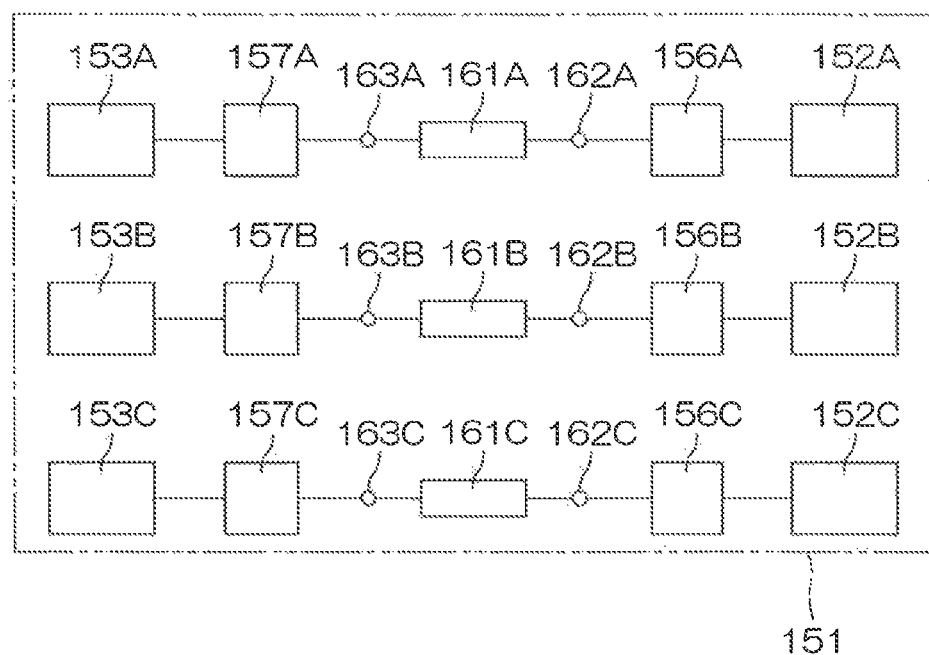
FIG. 41 is an electrical circuit diagram for describing a connection example of a passive element of the chip part shown in FIG. 38.

In the arrangement described above, it is possible to provide the chip part 151 in which the RLC series circuit network is formed on the common substrate 2. The chip part 151 including the RLC series circuit network described above is formed based on a connection example shown in FIG. 41. FIG. 41 is an electrical circuit diagram for describing the connection example of a passive element of the chip part 151 shown in FIG. 38.

As shown in FIG. 41, the chip part 151 includes three passive elements 161. Each of the passive elements 161 has one end 162 and the other end 163. Any one of the coil L (the coil region 13) described previously, the first capacitor C1 (the first capacitor region 14) described previously, the second capacitor C2 (the second capacitor region 102) described previously and the resistor portion R (the resistance region 15) described previously is incorporated in one passive element 161. In the following description, sequentially from the top of FIG. 41, the ends of the passive elements 161 are referred to as one end 162A and the other end 163A of a first passive element 161A, one end 162B and the other end 163B of a second passive element 161B and one end 162C and the other end 163C of a third passive element 161C.

As shown in FIG. 41, the first internal electrode film 156 includes the first electrode film portion 156A that can be electrically connected to the one end 162A of the first passive element 161A, the second electrode film portion 156B that can be electrically connected to the one end 162B of the second passive element 161B and a third electrode film portion 156C that can be electrically connected to the one end 162C of the third passive element 161C.

The second internal electrode film 157 includes the first electrode film portion 157A that can be electrically connected to the other end 163A of the first passive element 161A, the second electrode film portion 157B that can be electrically connected to the other end 163B of the second passive element 161B and a third electrode film portion 157C that can be electrically connected to the other end 163C of the third passive element 161C.

The first external electrode 152 includes a first external electrode portion 152A that can be electrically connected to the first electrode film portion 156A, a second external electrode portion 152B that can be electrically connected to the second electrode film portion 156B and a third external electrode portion 152C that can be electrically connected to the third electrode film portion 156C.

The second external electrode 153 includes a first external electrode portion 153A that can be electrically connected to the first electrode film portion 157A, a second external electrode portion 153B that can be electrically connected to the second electrode film portion 157B and a third external electrode portion 153C that can be electrically connected to the third electrode film portion 157C.

In the first internal electrode film 156, whether or not the first electrode film portion 156A and the second electrode film portion 156B are electrically connected and whether or not the second electrode film portion 156B and the third electrode film portion 156C are electrically connected can be selected. There are four combinations thereof.

Likewise, in the second internal electrode film 157, whether or not the first electrode film portion 157A and the second electrode film portion 157B are electrically connected and whether or not the second electrode film portion 157B and the third electrode film portion 157C are electrically connected can be selected. There are four combinations thereof.

In the first external electrode 152, whether or not the first external electrode portion 152A is provided, whether or not the second external electrode portion 152B is provided and whether or not the third external electrode portion 152C is provided can be selected. There are six combinations thereof. Furthermore, in the first external electrode 152, whether or not the first external electrode portion 152A and the second external electrode portion 152B are electrically connected and whether or not the second external electrode portion 152B and the third external electrode portion 152C are electrically connected can be selected. There are four combinations thereof.

In the second external electrode 153, whether or not the first external electrode portion 153A is provided, whether or not the second external electrode portion 153B is provided and whether or not the third external electrode portion 153C is provided can be selected. There are six combinations thereof. Furthermore, in the second external electrode 153, whether or not the first external electrode portion 153A and the second external electrode portion 153B are electrically connected and whether or not the second external electrode portion 153B and the third external electrode portion 153C are electrically connected can be selected. There are four combinations thereof.

As the passive element that is incorporated in the first passive element 161A, the second passive element 161B and the third passive element 161C, one is selected from the coil L (the coil region 13) described previously, the first capacitor C1 (the first capacitor region 14) described previously, the second capacitor C2 (the second capacitor region 102) described previously and the resistor portion R (the resistance region 15) described previously. There are 64 combinations thereof.

An appropriate electrical circuit is selected from the combinations (4×4×6×4×6×4×64 combinations) and is formed on the common substrate 2, and thus it is possible to obtain the chip part 151 that includes the desired passive element circuit network. FIGS. 42 to 45 show an example thereof.

Figure 42:
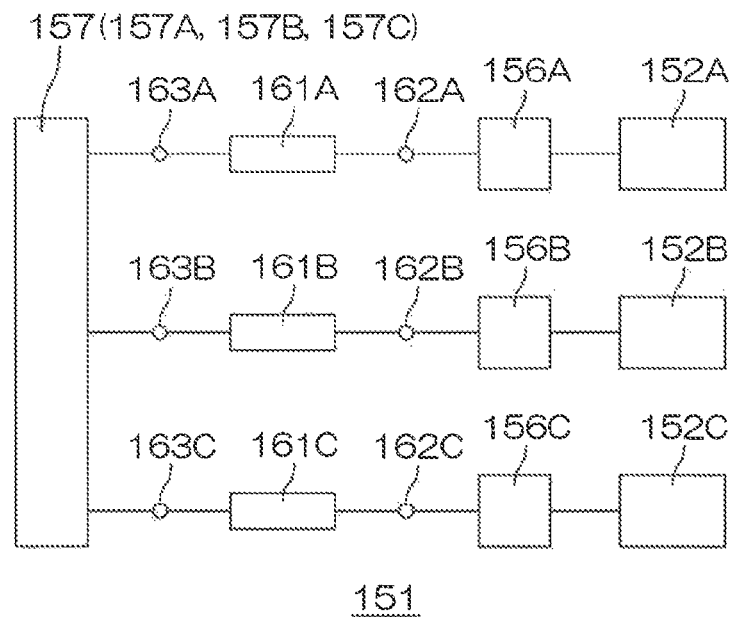
FIG. 42 is a first circuit example obtained from the connection example of FIG. 41.

In FIG. 42, the first external electrode portion 152A, the second external electrode portion 152B and the third external electrode portion 152C are formed. The first external electrode portion 152A is connected through the first electrode film portion 156A to the one end 162A of the first passive element 161A. The second external electrode portion 152B is connected through the second electrode film portion 156B to the one end 162B of the second passive element 161B. The third external electrode portion 152C is connected through the third electrode film portion 156C to the one end 162C of the third passive element 161C. The other end 163A of the first passive element 161A, the other end 163B of the second passive element 161B and the other end 163C of the third passive element 161C are electrically connected by the second internal electrode film 157 in which the first electrode film portion 157A, the second electrode film portion 157B and the third electrode film portion 157C are integral. The second internal electrode film 157 is electrically separated from the first external electrode portion 153A, the second external electrode portion 153B and the third external electrode portion 153C. In the case of this circuit, any one of the first external electrode portion 152A, the second external electrode portion 152B and the third external electrode portion 152C can be set to an input terminal or an output terminal.

Figure 43:
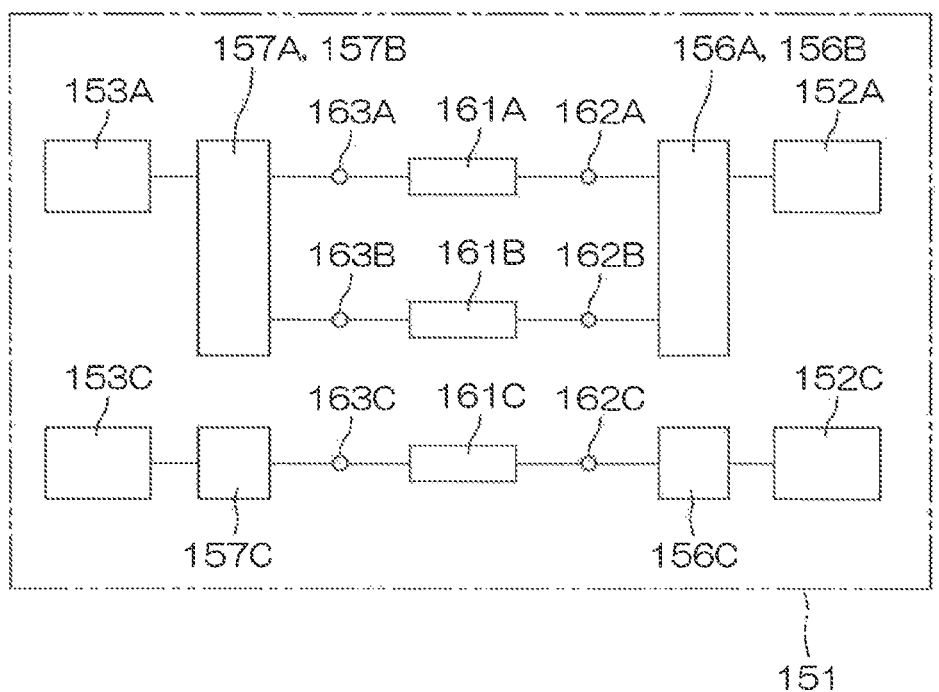
FIG. 43 is a second circuit example obtained from the connection example of FIG. 41.
Figure 44:
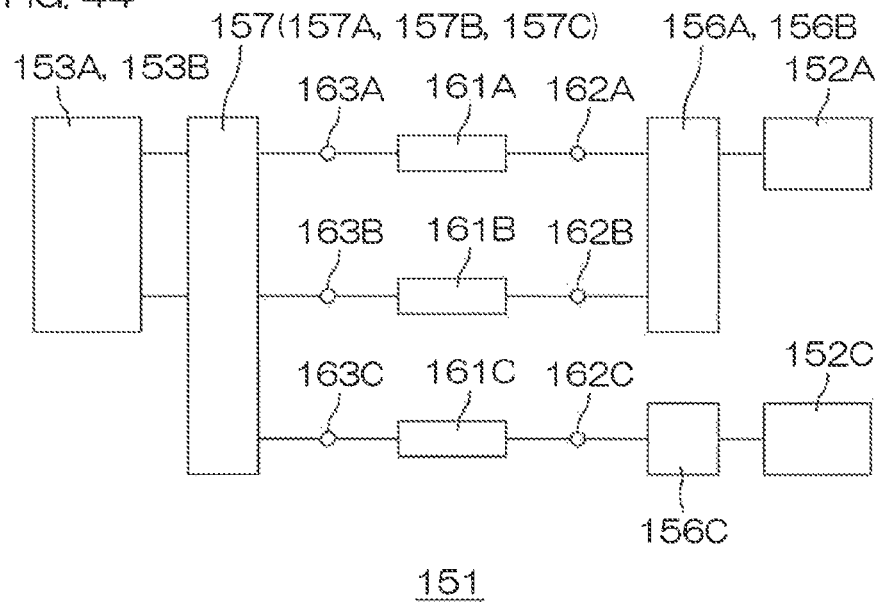
FIG. 44 is a third circuit example obtained from the connection example of FIG. 41.

In FIG. 43, between the first external electrode portion 152A and the second external electrode portion 153B, a parallel circuit of the first passive element 161A and the second passive element 161B is formed. The third passive element 161C is connected in series between the third external electrode portion 152C and the third external electrode portion 153C. The third passive element 161C forms one series circuit that is electrically separated from the first passive element 161A and the second passive element 161B. FIG. 44 differs from the circuit of FIG. 43 in that the third electrode film portion 157C is electrically connected to the first electrode film portion 157A and the second electrode film portion 157B and that the first external electrode portion 153A and the second external electrode portion 153B are electrically connected.

Figure 45:
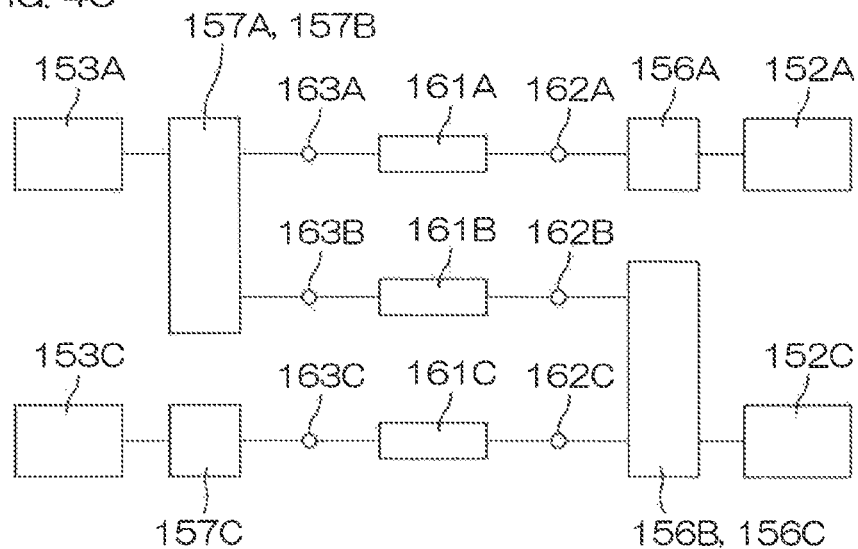
FIG. 45 is a fourth circuit example obtained from the connection example of FIG. 41.

In FIG. 45, a bridge circuit is formed in which the other end 163B of the second passive element 161B is connected to the other end 163A of the first passive element 161A and in which the one end 162B of the second passive element 161B is connected to the one end 162C of the third passive element 161C.

As described above, in this preferred embodiment, by the circuit networks formed with various combinations selected from a plurality of passive elements, it is possible to easily manufacture and provide the chip part 151 that is formed on the common substrate 2.

Sixth Preferred Embodiment

Figure 46:
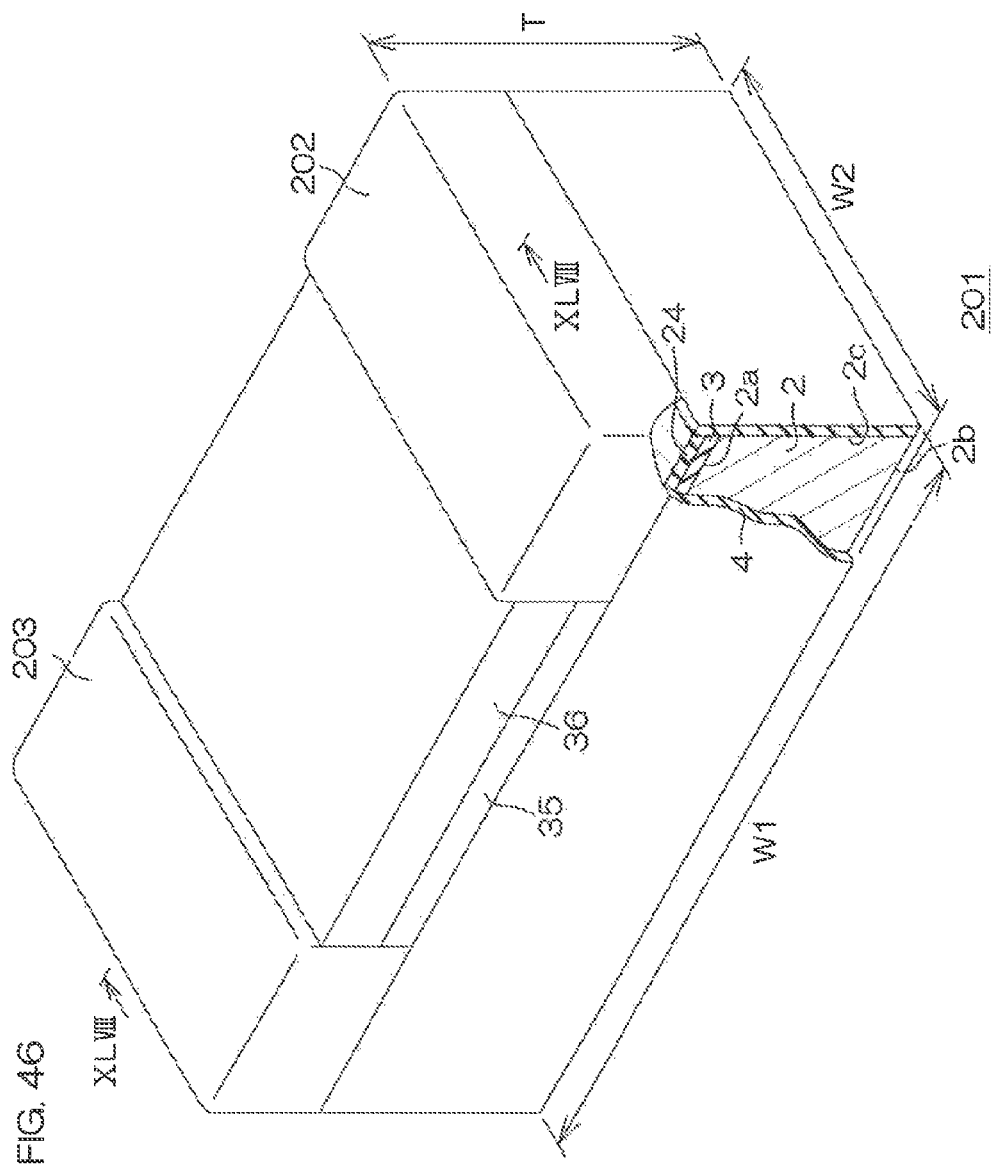
FIG. 46 is a partially cut-away perspective view of a chip part according to a sixth preferred embodiment of the present invention.
Figure 47:
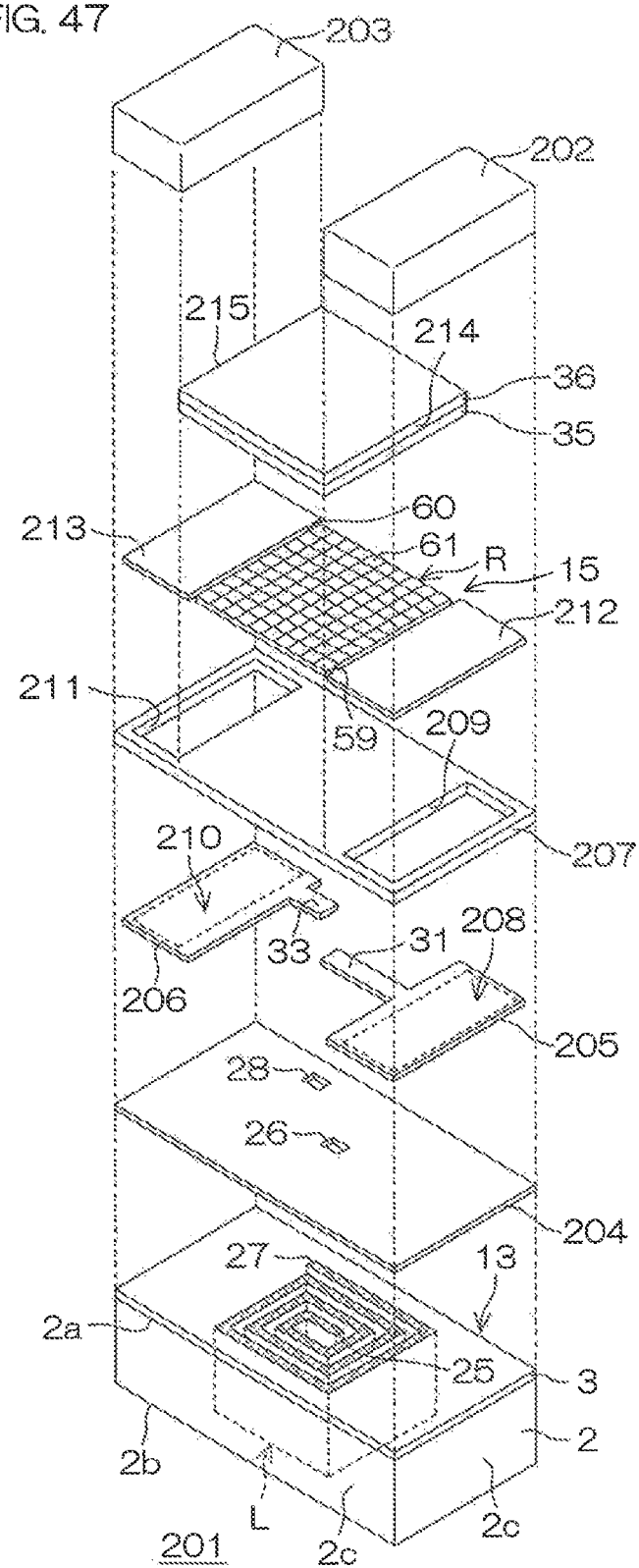
FIG. 47 is an exploded perspective view of the chip part shown in FIG. 46.
Figure 48:
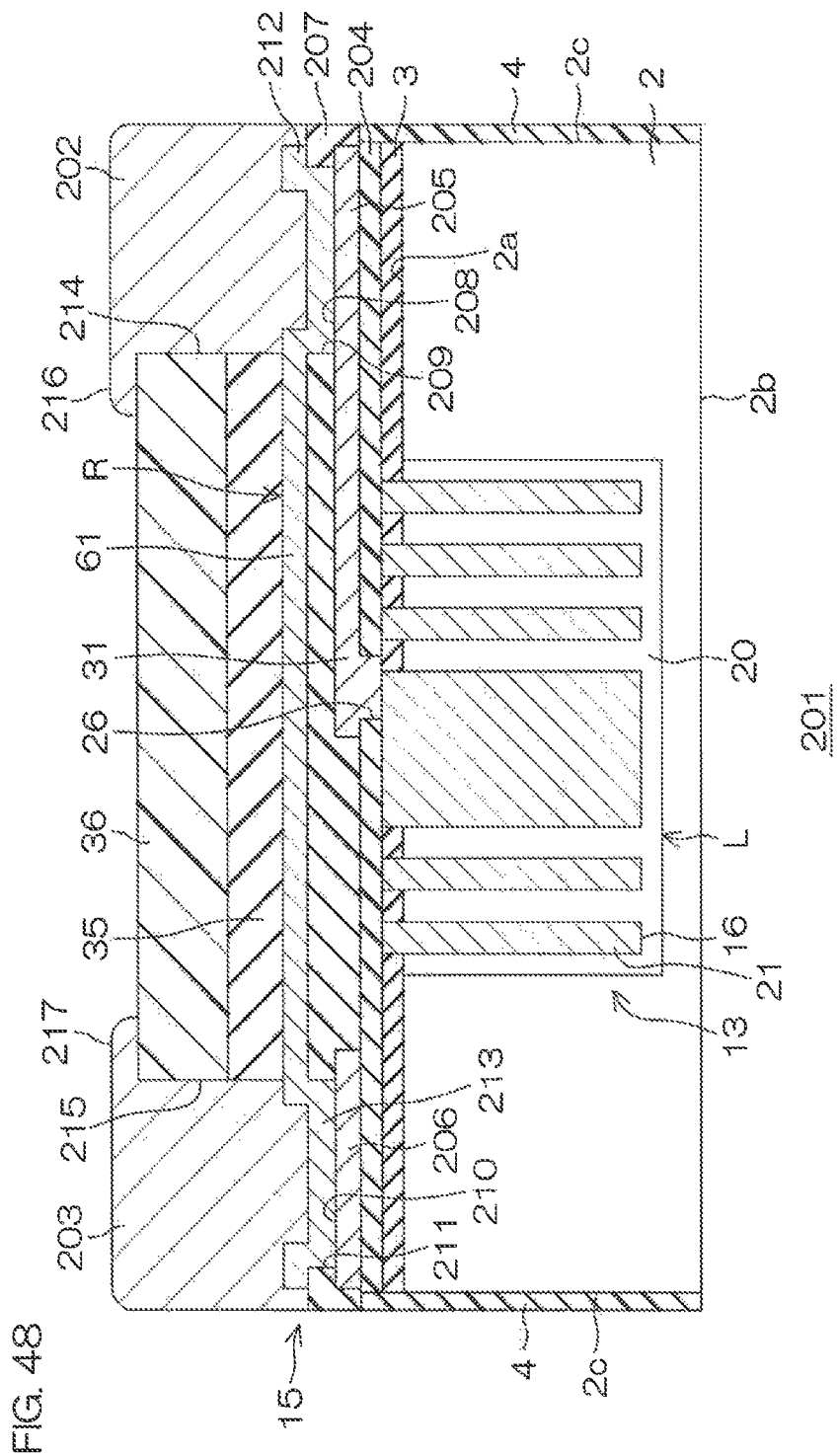
FIG. 48 is a cross-sectional view taken along line XLVIII-XLVIII in FIG. 46.
Figure 49:
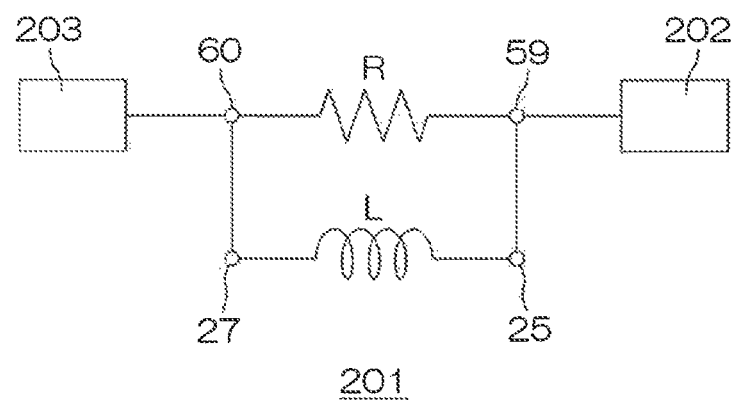
FIG. 49 is an electrical circuit diagram showing an example of an electrical structure of the chip part shown in FIG. 46.

FIG. 46 is a partially cut-away perspective view of a chip part 201 according to a sixth preferred embodiment of the present invention. FIG. 47 is an exploded perspective view of the chip part 201 shown in FIG. 46. FIG. 48 is a cross-sectional view taken along line XLVIII-XLVIII in FIG. 46. FIG. 49 is an electrical circuit diagram showing an example of an electrical structure of the chip part 201. In FIGS. 46 to 49, portions corresponding to the individual portions shown in FIGS. 1 to 45 are identified with the same reference symbols, and their description will be omitted.

As shown in FIG. 46, the chip part 201 is formed in the shape of a rectangular parallelepiped. The planar shape of the chip part 201 is rectangular, and a length W1 in the longitudinal direction thereof may be 0.4 mm, and a length W2 in the widthwise direction may be about 0.2 mm. The entire thickness T of the chip part 201 may be about 0.15 mm.

The chip part 201 includes a substrate 2 in the shape of a rectangular parallelepiped. The substrate 2 includes a pair of main surfaces 2a and 2b and four side surfaces 2c. One (the main surface 2a on the upper surface side of FIG. 46) of the pair of main surfaces 2a and 2b is an element formation surface. Hereinafter, the main surface 2a is referred to as an "element formation surface 2a," and the main surface 2b on the opposite side to the element formation surface 2a is referred to as a "back surface 2b." The surface (the element formation surface 2a) of the substrate 2 is covered by an insulating film 3. The four side surfaces 2c of the substrate 2 and the peripheral portion of the insulating film 3 are covered by a passivation film 4.

The chip part 201 includes a first external electrode 202 and a second external electrode 203 that are formed apart from each other on the substrate 2. The first external electrode 202 is arranged at one end portion of the substrate 2 and is formed, in plan view, in the shape of a rectangle. The second external electrode 203 is arranged at the other end portion of the substrate 2 and is formed, in plan view, in the shape of a rectangle.

As shown in FIG. 47, in the chip part 201, between the first external electrode 202 and the second external electrode 203, along a direction intersecting a direction in which the first external electrode 202 and the second external electrode 203 are opposite to each other, a plurality of passive element regions are aligned. More specifically, the chip part 201 has a laminated structure in which a plurality of passive elements are laminated in a vertical direction vertically intersecting the surface of the substrate 2. In this preferred embodiment, the chip part 201 has a laminated structure in which the coil region 13 described previously and the resistance region 15 described previously are laminated.

More specifically, as shown in FIGS. 47 and 48, on the substrate 2 on which the insulating film 3 is formed, the coil region 13 described previously is set to have the same arrangement. On the substrate 2, a first surface insulating film 204 is formed so as to cover the coil region 13. The first surface insulating film 204 corresponds to the surface insulating film 24 described previously. On the first surface insulating film 204, a first internal electrode film 205 and a second internal electrode film 206 are arranged.

The first internal electrode film 205 is arranged at one end portion of the substrate 2. The first internal electrode film 205 includes the first drawing electrode 31 that enters the first coil contact hole 26 formed in the first surface insulating film 204 and that is electrically connected to the one end 25 of the coil L. The second internal electrode film 206 is arranged at the other end portion of the substrate 2. The second internal electrode film 206 includes a second drawing electrode 33 that enters the second coil contact hole 28 formed in the first surface insulating film 204 and that is electrically connected to the other end 27 of the coil L.

On the first surface insulating film 204, a second surface insulating film 207 is formed so as to cover the first internal electrode film 205 and the second internal electrode film 206. The second surface insulating film 207 is formed, in plan view, in the shape of a rectangle matching with the element formation surface 2a. The second surface insulating film 207 has a flat surface. The second surface insulating film 207 includes, for example, a USG film or an SOG film. The SOG film may be an inorganic SOG film containing $SiO_2$ and an inorganic material such as hydrogen silsesquioxane (HSQ). The SOG film may be an organic SOG film containing $SiO_2$ and an organic material such as methyl silsesquioxane (MSQ). The second surface insulating film 207 may have a thickness of 8000 to 15000 angstroms.

The second surface insulating film 207 includes a first pad opening 209 that exposes part of the first internal electrode film 205 as a first pad 208 and a second pad opening 211 that exposes part of the second internal electrode film 206 as a second pad 210.

On the second surface insulating film 207, the resistance region 15 is set. In the resistance region 15, the resistor portion R (the resistor portion conductive member film 61), a third internal electrode film 212 that is electrically connected to the one end 59 of the resistor portion R and a fourth internal electrode film 213 that is electrically connected to the other end 60 of the resistor portion R are formed. The third internal electrode film 212 is formed along the surface of the second surface insulating film 207 so as to enter the first pad opening 209. The third internal electrode film 212 is electrically connected to the first pad 208 (the first internal electrode film 205) within the first pad opening 209. The fourth internal electrode film 213 is formed along the surface of the second surface insulating film 207 so as to enter the second pad opening 211. The fourth internal electrode film 213 is electrically connected to the second pad 210 (the second internal electrode film 206) within the second pad opening 211.

As shown in FIG. 48, on the second surface insulating film 207, the passivation film 35 is formed so as to cover the resistor portion R (the resistor portion conductive member film 61), the third internal electrode film 212 and the fourth internal electrode film 213. On the passivation film 35, the resin film 36 is formed. In the passivation film 35 and the resin film 36, a first cutout portion 214 that exposes a region other than an edge portion of the third internal electrode film 212 on the side of the resistance region 15 and a second cutout portion 215 that exposes a region other than an edge portion of the fourth internal electrode film 213 on the side of the resistance region 15 are formed.

The first external electrode 202 is formed so as to fill the first cutout portion 214. The first external electrode 202 is formed so as to protrude from the resin film 36. The first external electrode 202 includes a covering portion 216 that is drawn out to the side of the resistance region 15 along the surface of the resin film 36. In this preferred embodiment, the first external electrode 202 is formed so as to cover the first pad 208 that is exposed from the first cutout portion 214, the surface of the second surface insulating film 207 and an upper end portion of the passivation film 4 on the side of one end portion of the substrate 2. The three side surfaces other than the side surface on the inner side of the first external electrode 202 are formed so as to be flush with the surface of the passivation film 4.

The second external electrode 203 is formed so as to fill the second cutout portion 215. The second external electrode 203 is formed so as to protrude from the resin film 36. The second external electrode 203 includes a covering portion 217 that is drawn out to the side of the resistance region 15 along the surface of the resin film 36. In this preferred embodiment, the second external electrode 203 is formed so as to cover the second pad 210 that is exposed from the second cutout portion 215, the surface of the second surface insulating film 207 and an upper end portion of the passivation film 4 on the side of one end portion of the substrate 2. The three side surfaces other than the side surface on the inner side of the second external electrode 203 are formed so as to be flush with the surface of the passivation film 4.

The first external electrode 202 is electrically connected through the third internal electrode film 212 to the one end 59 of the resistor portion R. The first external electrode 202 is also electrically connected through the third internal electrode film 212 and the first internal electrode film 205 to the one end 25 of the coil L. The second external electrode 203 is electrically connected through the fourth internal electrode film 213 to the other end 60 of the resistor portion R. The second external electrode 203 is also electrically connected through the fourth internal electrode film 213 and the second internal electrode film 206 to the other end 27 of the coil L.

In the arrangement described above, as shown in FIG. 49, it is possible to provide the chip part 201 in which the RL parallel circuit network where the resistor portion R and the coil L are connected in parallel is formed on the common substrate 2. The chip part 201 has a laminated structure in which the resistor portion R is laminated on the coil L through the first surface insulating film 204. In the laminated structure, as compared with, for example, a case where the coil L and the resistor portion R are aligned in a direction perpendicularly intersecting the laminated direction, it is possible to reduce the area of the substrate 2, with the result that it is possible to reduce the mounting space of the chip part 201. It is also possible to increase the number of chip parts 201 obtained from one base substrate 90 (see FIG. 27).

Seventh Preferred Embodiment

Figure 50:
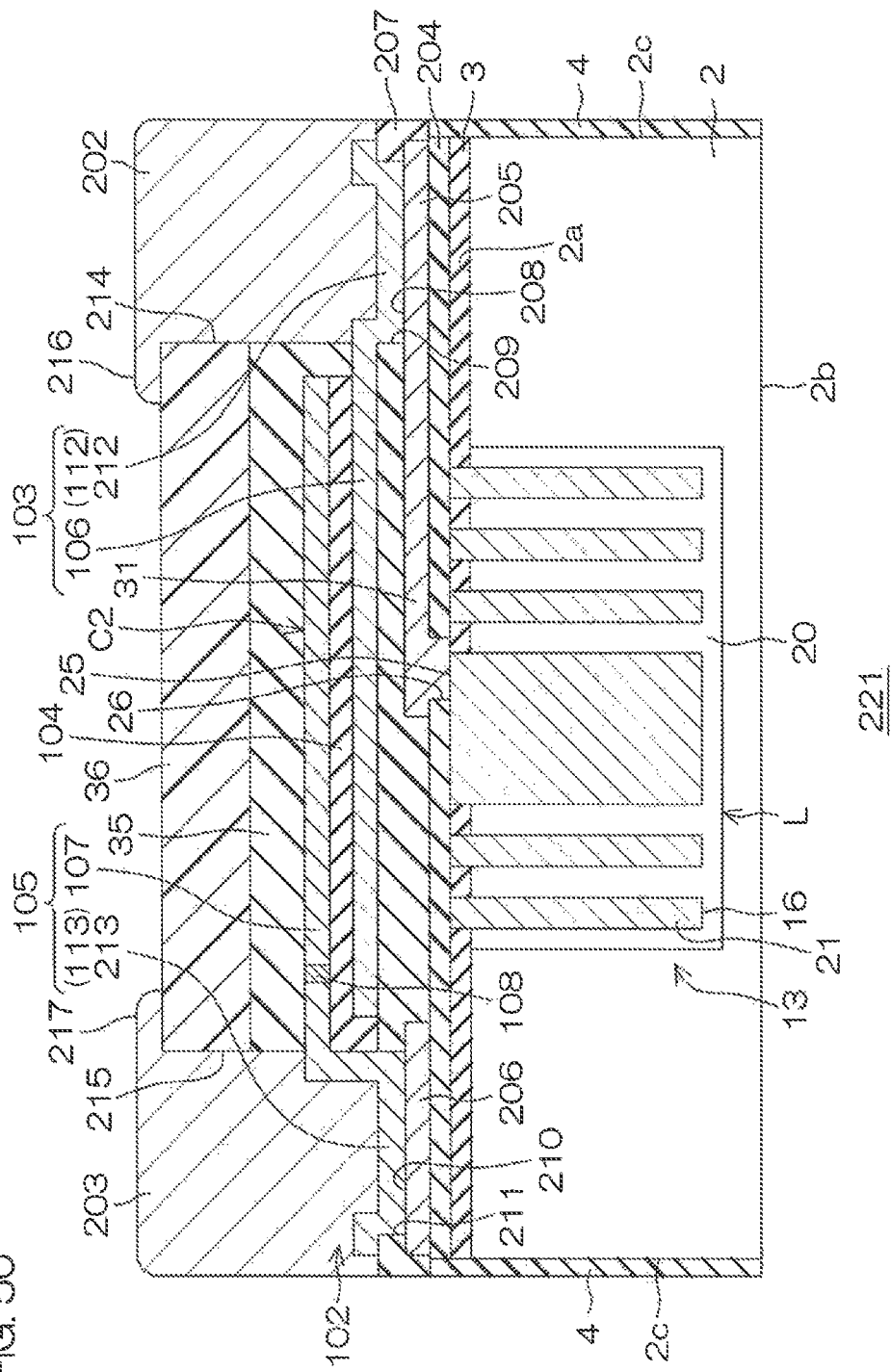
FIG. 50 is a partially cut-away perspective view of a chip part according to a seventh preferred embodiment of the present invention.
Figure 51:
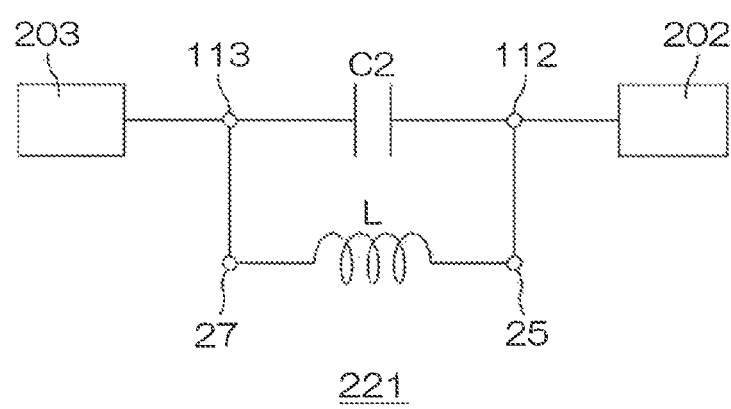
FIG. 51 is an electrical circuit diagram showing an example of an electrical structure of the chip part shown in FIG. 50.

FIG. 50 is a partially cut-away perspective view of a chip part 221 according to a seventh preferred embodiment of the present invention. FIG. 51 is an electrical circuit diagram showing an example of an electrical structure of the chip part 221 shown in FIG. 50. In FIGS. 50 and 51, portions corresponding to the individual portions shown in FIGS. 1 to 49 are identified with the same reference symbols, and their description will be omitted.

As shown in FIG. 50, in the chip part 221, on the second surface insulating film 207, instead of the resistance region 15 described previously, the second capacitor region 102 described previously is set. In the second capacitor region 102, the second capacitor C2 including the first electrode film 103, the dielectric film 104 formed on the first electrode film 103 and the second electrode film 105 formed on the dielectric film 104 is formed. The first electrode film 103 includes the third internal electrode film 212 and the first capacitor electrode film 106 that integrally communicates with the third internal electrode film 212. The third internal electrode film 212 also serves as the one end 112 of the second capacitor C2. The second electrode film 105 includes the fourth internal electrode film 213 and the second capacitor electrode film 107 that is electrically connected to the fourth internal electrode film 213 through the fuse portion 108. The fourth internal electrode film 213 also serves as the other end 113 of the second capacitor C2.

The first external electrode 202 is electrically connected through the third internal electrode film 212 (the one end 112 of the second capacitor C2) to the first capacitor electrode film 106. The first external electrode 202 is electrically connected through the third internal electrode film 212 and the first internal electrode film 205 to the one end 25 of the coil L. The second external electrode 203 is electrically connected through the fourth internal electrode film 213 (the other end 113 of the second capacitor C2) to the second capacitor electrode film 107. The second external electrode 203 is also electrically connected through the fourth internal electrode film 213 and the second internal electrode film 206 to the other end 27 of the coil L.

In the arrangement described above, as shown in FIG. 51, it is possible to provide the laminated structure-type chip part 221 in which the LC parallel circuit network where the coil L and the second capacitor C2 are connected in parallel is formed on the common substrate 2.

Eighth Preferred Embodiment

Figure 52:
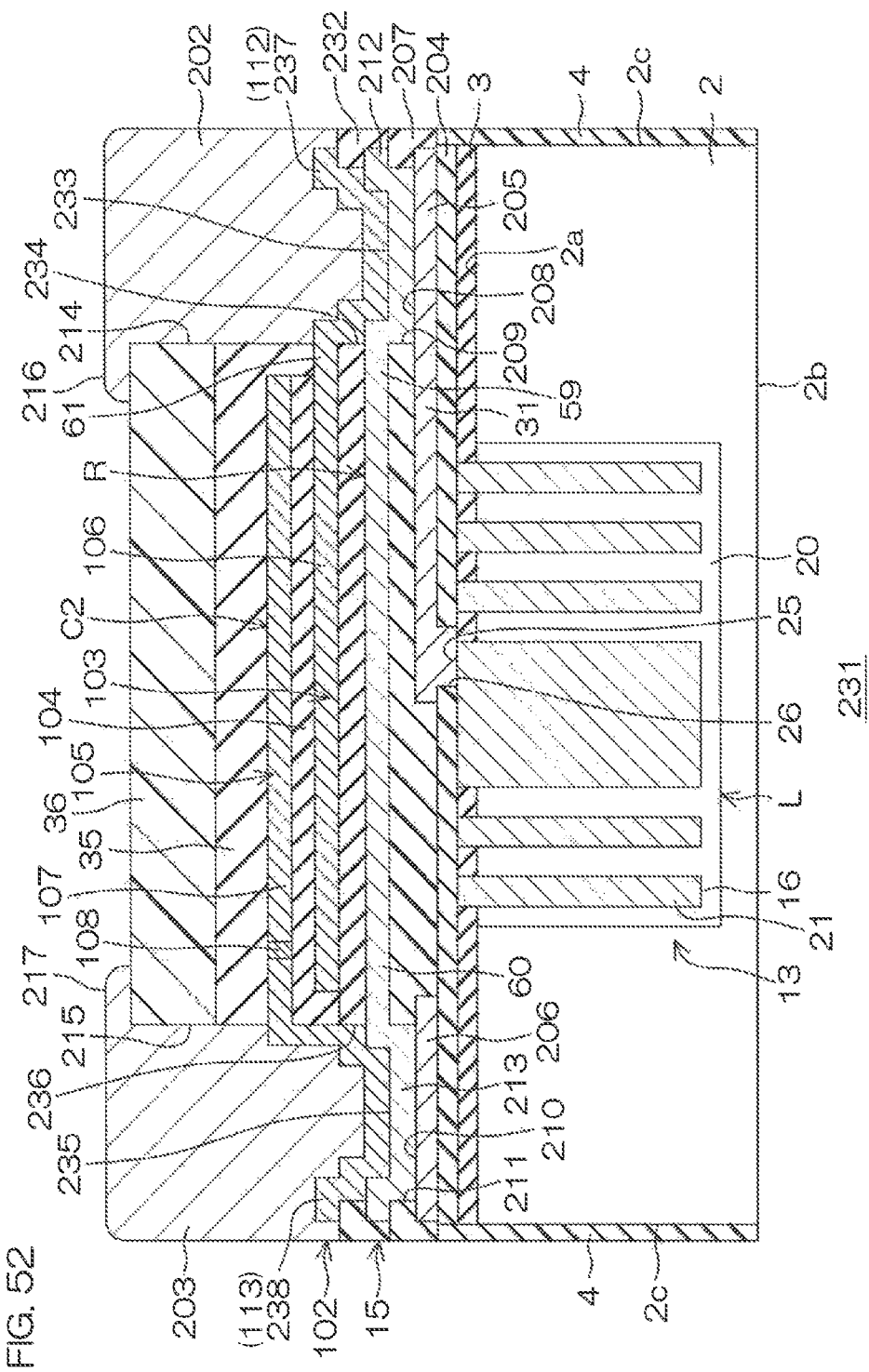
FIG. 52 is a partially cut-away perspective view of a chip part according to an eighth preferred embodiment of the present invention.
Figure 53:
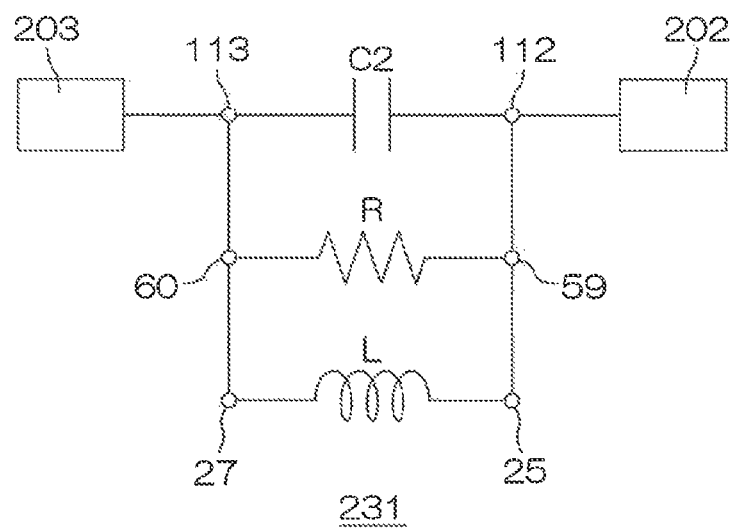
FIG. 53 is an electrical circuit diagram showing an example of an electrical structure of the chip part shown in FIG. 52.

FIG. 52 is a partially cut-away perspective view of a chip part 231 according to an eighth preferred embodiment of the present invention. FIG. 53 is an electrical circuit diagram showing an example of an electrical structure of the chip part 231. In FIGS. 52 and 53, portions corresponding to the individual portions shown in FIGS. 1 to 51 are identified with the same reference symbols, and their description will be omitted.

The chip part 231 has a laminated structure in which in the arrangement of the chip part 201 described previously, the second capacitor region 102 described previously is further laminated.

More specifically, as shown in FIG. 52, on the second surface insulating film 207, a third surface insulating film 232 covering the resistance region 15 is formed. The third surface insulating film 232 is formed, in plan view, in the shape of a rectangle matching with the element formation surface 2a. The third surface insulating film 232 has a flat surface. The third surface insulating film 232 includes, for example, a USG film or an SOG film. The SOG film may be an inorganic SOG film containing $SiO_2$ and an inorganic material such as hydrogen silsesquioxane (HSQ). The SOG film may be an organic SOG film containing $SiO_2$ and an organic material such as methyl silsesquioxane (MSQ). The third surface insulating film 232 may have a thickness of 8000 to 15000 angstroms.

The third surface insulating film 232 includes a third pad opening 234 that exposes part of the third internal electrode film 212 as a third pad 233 and a fourth pad opening 236 that exposes part of the fourth internal electrode film 213 as a fourth pad 235.

On the third surface insulating film 232, the second capacitor C2 (the second capacitor region 102) described previously is formed. The second capacitor C2 includes the first electrode film 103 formed on the third surface insulating film 232, the dielectric film 104 formed on the first electrode film 103 and the second electrode film 105 formed on the dielectric film 104.

In this preferred embodiment, the first electrode film 103 includes a fifth internal electrode film 237 and the first capacitor electrode film 106 that integrally communicates with the fifth internal electrode film 237. The fifth internal electrode film 237 also serves as the one end 112 of the second capacitor C2. The second electrode film 105 includes a sixth internal electrode film 238 and the second capacitor electrode film 107 that is electrically connected to the sixth internal electrode film 238 through the fuse portion 108. The sixth internal electrode film 238 also serves as the other end 113 of the second capacitor C2.

The fifth internal electrode film 237 is formed along the surface of the third surface insulating film 232 so as to enter the third pad opening 234. The fifth internal electrode film 237 is electrically connected to the third pad 233 (the third internal electrode film 212) within the third pad opening 234. The sixth internal electrode film 238 is formed along the surface of the third surface insulating film 232 so as to enter the fourth pad opening 236. The sixth internal electrode film 238 is electrically connected to the fourth pad 235 (the fourth internal electrode film 213) within the fourth pad opening 236.

The first external electrode 202 is electrically connected through the fifth internal electrode film 237 (the one end 112 of the second capacitor C2) to the first capacitor electrode film 106. The first external electrode 202 is electrically connected through the fifth internal electrode film 237 and the third internal electrode film 212 to the one end 59 of the resistor portion R. The first external electrode 202 is electrically connected through the fifth internal electrode film 237, the third internal electrode film 212 and the first internal electrode film 205 to the one end 25 of the coil L.

The second external electrode 203 is electrically connected through the sixth internal electrode film 238 (the other end 113 of the second capacitor C2) to the second capacitor electrode film 107. The second external electrode 203 is electrically connected through the sixth internal electrode film 238 and the fourth internal electrode film 213 to the other end 60 of the resistor portion R. The second external electrode 203 is electrically connected through the sixth internal electrode film 238, the fourth internal electrode film 213 and the second internal electrode film 206 to the other end 27 of the coil L.

In the arrangement described above, as shown in FIG. 53, it is possible to provide the laminated structure-type chip part 231 in which the LRC parallel circuit network where the second capacitor C2, the resistor portion R and the coil L are connected in parallel is formed on the common substrate 2.

Ninth Preferred Embodiment

Figure 54:
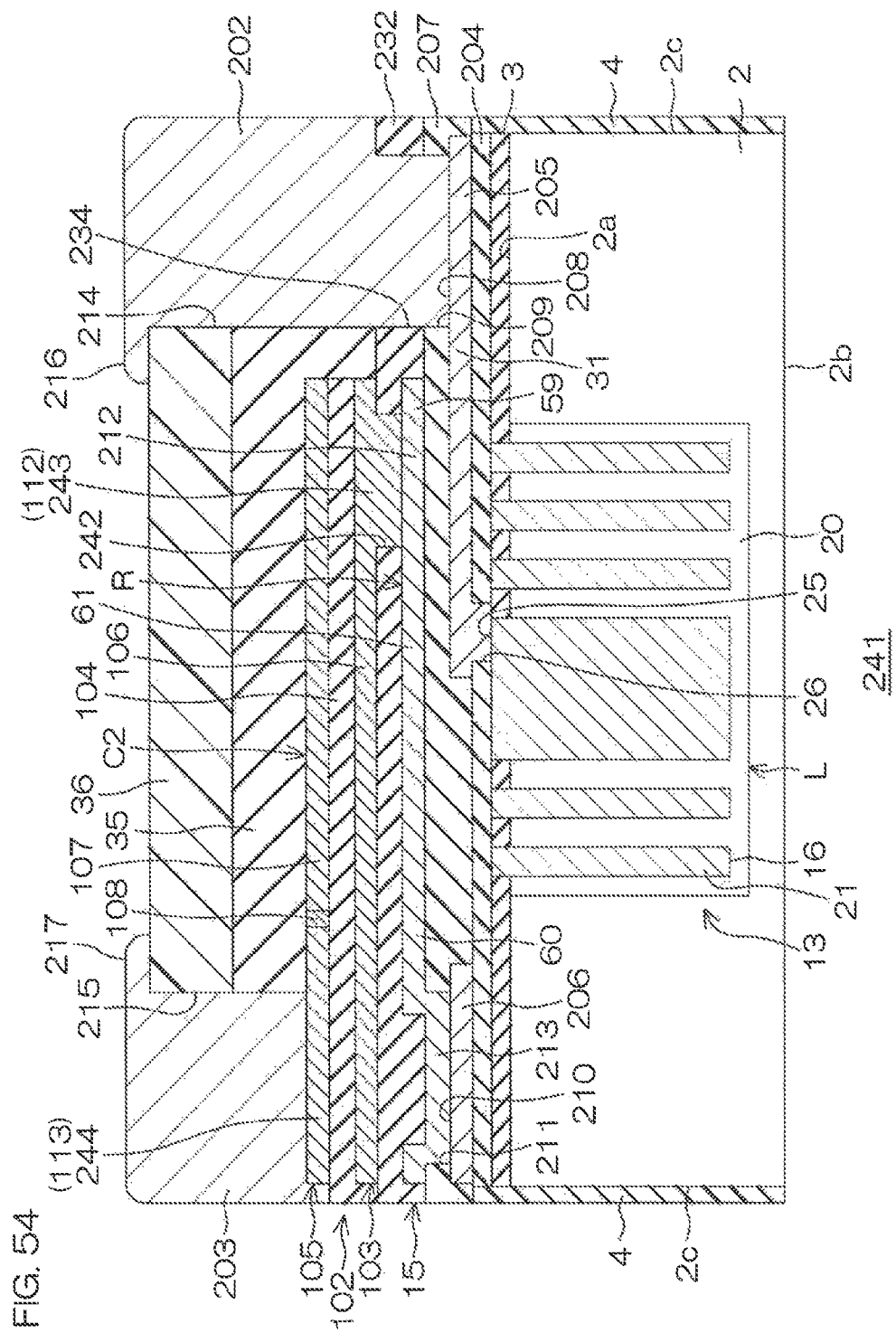
FIG. 54 is a partially cut-away perspective view of a chip part according to a ninth preferred embodiment of the present invention.
Figure 55:
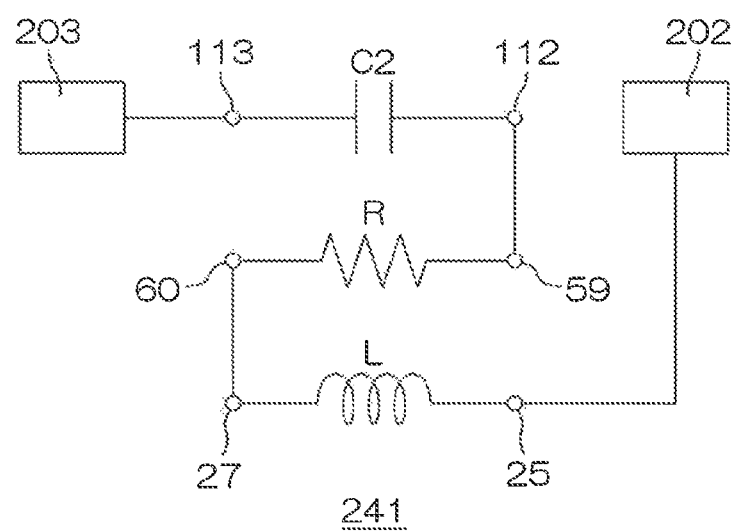
FIG. 55 is an electrical circuit diagram showing an example of an electrical structure of the chip part shown in FIG. 54.

FIG. 54 is a partially cut-away perspective view of a chip part 241 according to a ninth preferred embodiment of the present invention. FIG. 55 is an electrical circuit diagram showing an example of an electrical structure of the chip part 241. In FIGS. 54 and 55, portions corresponding to the individual portions shown in FIGS. 1 to 53 are identified with the same reference symbols, and their description will be omitted.

As shown in FIG. 54, on the second surface insulating film 207 in the chip part 241, the resistance region 15 described previously is set. In the resistance region 15, the resistor portion R (the resistor portion conductive member film 61), the third internal electrode film 212 that is electrically connected to the one end 59 of the resistor portion R and the fourth internal electrode film 213 that is electrically connected to the other end 60 of the resistor portion R are formed. The third internal electrode film 212 is formed apart from the first pad opening 209 formed in the second surface insulating film 207 to the side of the coil region 13, and is set so as to be electrically separated from the one end 25 (the first internal electrode film 205) of the coil L. The fourth internal electrode film 213 enters the second pad opening 211 formed in the second surface insulating film 207 and is electrically connected to the other end 27 (the second internal electrode film 206) of the coil L.

The third surface insulating film 232 formed on the second surface insulating film 207 includes not only the third pad opening 234 but also a contact hole 242. The contact hole 242 is formed apart from the third pad opening 234 to the side of the coil region 13, and exposes part of the third internal electrode film 212. In this preferred embodiment, the third surface insulating film 232 does not include the fourth pad opening 236 (see FIG. 52).

On the third surface insulating film 232, the second capacitor C2 (the second capacitor region 102) described previously is formed. The second capacitor C2 includes the first electrode film 103 formed on the third surface insulating film 232, the dielectric film 104 formed on the first electrode film 103 and the second electrode film 105 formed on the dielectric film 104.

In this preferred embodiment, the first electrode film 103 includes a fifth internal electrode film 243 and the first capacitor electrode film 106 that integrally communicates with the fifth internal electrode film 243. The second electrode film 105 includes a sixth internal electrode film 244 and the second capacitor electrode film 107 that is electrically connected to the sixth internal electrode film 244 through the fuse portion 108.

The fifth internal electrode film 243 is formed along the surface of the third surface insulating film 232 so as to enter the contact hole 242. The fifth internal electrode film 243 is electrically connected to the third internal electrode film 212 within the contact hole 242. The fifth internal electrode film 243 is opposite to the second capacitor electrode film 107 through the dielectric film 104. The fifth internal electrode film 243 also serves as the one end 112 of the second capacitor C2. The sixth internal electrode film 244 is arranged at the other end of the substrate 2, and is opposite to the first electrode film 103 through the dielectric film 104. The sixth internal electrode film 244 also serves as the other end 113 of the second capacitor C2.

In the passivation film 35 and the resin film 36, through the first pad opening 209 and the third pad opening 234, the first cutout portion 214 that exposes the first internal electrode film 205 (the first pad 208) and the second cutout portion 215 that exposes part of the sixth internal electrode film 244 are formed.

The first external electrode 202 is formed so as to fill the first pad opening 209, the third pad opening 234 and the first cutout portion 214. The second external electrode 203 is formed so as to fill the second cutout portion 215.

The first external electrode 202 is electrically connected through the first internal electrode film 205 to the one end 25 of the coil L. The other end 27 of the coil L is electrically connected through the second internal electrode film 206 and the fourth internal electrode film 213 to the other end 60 of the resistor portion R. The one end 59 of the resistor portion R is electrically connected through the third internal electrode film 212 and the fifth internal electrode film 243 (the one end 112 of the second capacitor C2) to the first capacitor electrode film 106. The second capacitor electrode film 107 is electrically connected through the sixth internal electrode film 244 (the other end 113 of the second capacitor C2) to the second external electrode 203.

In the arrangement described above, as shown in FIG. 55, it is possible to provide the laminated structure-type chip part 241 in which the LRC series circuit network where the second capacitor C2, the resistor portion R and the coil L are connected in series is formed on the common substrate 2.

Tenth Preferred Embodiment

Figure 56:
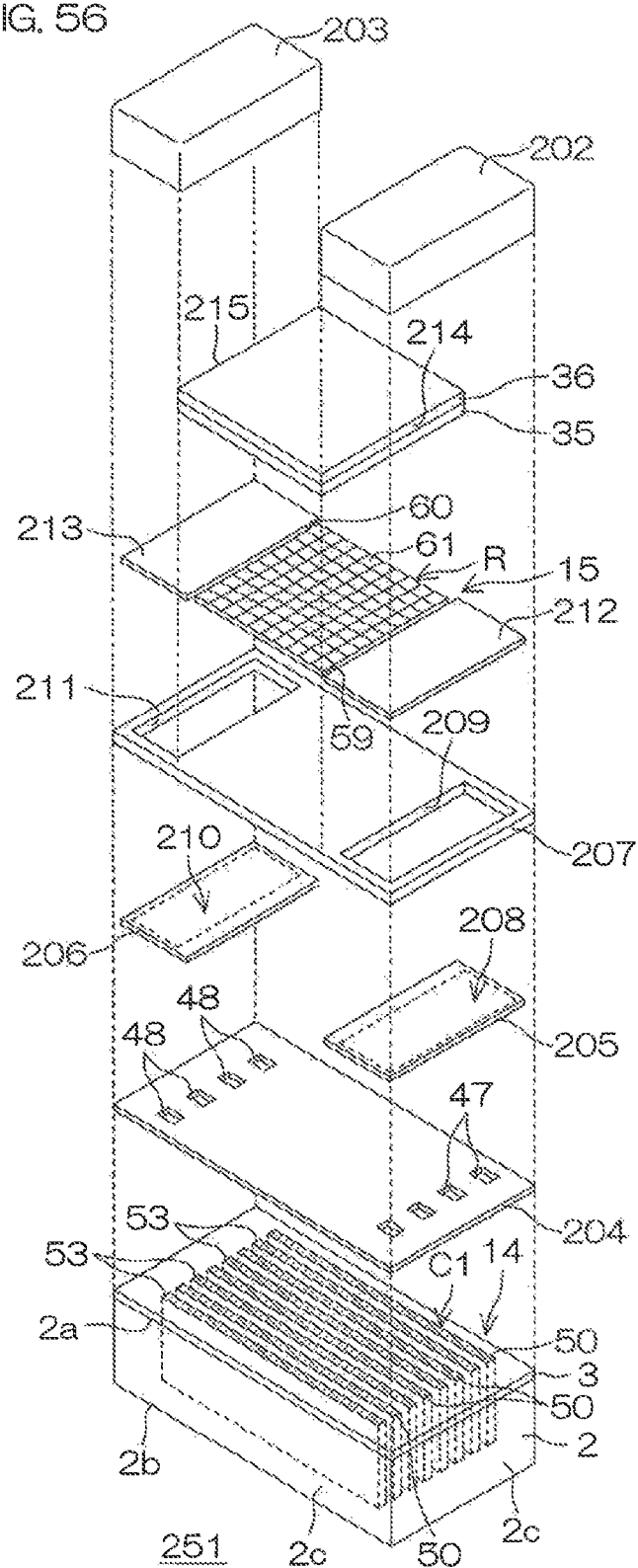
FIG. 56 is an exploded perspective view of a chip part according to a tenth preferred embodiment of the present invention.
Figure 57:
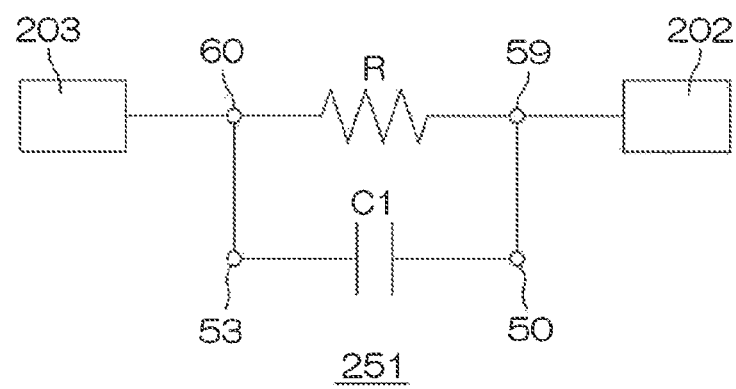
FIG. 57 is an electrical circuit diagram showing an example of an electrical structure of the chip part shown in FIG. 56.

FIG. 56 is an exploded perspective view of a chip part 251 according to a tenth preferred embodiment of the present invention. FIG. 57 is an electrical circuit diagram showing an example of an electrical structure of the chip part 251. In FIGS. 56 and 57, portions corresponding to the individual portions shown in FIGS. 1 to 55 are identified with the same reference symbols, and their description will be omitted.

In the chip part 251, unlike the chip part 201 described previously, instead of the coil L (the coil region 13), the first capacitor C1 (the first capacitor region 14) described previously is set on the substrate 2.

More specifically, the first capacitor C1 (the first capacitor region 14) is set so as to have the same arrangement as the chip part 1. On the substrate 2, the first surface insulating film 204 is formed so as to cover the first capacitor region 14. On the first surface insulating film 204, the first internal electrode film 205 and the second internal electrode film 206 are arranged. The first internal electrode film 205 enters the first capacitor contact hole 47 formed in the first surface insulating film 204, and is electrically connected to the one end 50 of the first capacitor C1. The second internal electrode film 206 enters the second capacitor contact hole 48 formed in the first surface insulating film 204, and is electrically connected to the other end 53 of the first capacitor C1.

The first external electrode 202 is electrically connected through the third internal electrode film 212 to the one end 59 of the resistor portion R. The first external electrode 202 is also electrically connected through the third internal electrode film 212 and the first internal electrode film 205 to the one end 50 of the first capacitor C1. The second external electrode 203 is electrically connected through the fourth internal electrode film 213 to the other end 60 of the resistor portion R. The second external electrode 203 is also electrically connected through the fourth internal electrode film 213 and the second internal electrode film 206 to the other end 53 of the first capacitor C1.

In the arrangement described above, as shown in FIG. 57, it is possible to provide the laminated structure-type chip part 251 in which the CR parallel circuit network where the first capacitor C1 and the resistor portion R are connected in parallel is formed on the common substrate 2.

Although a plurality of preferred embodiments of the present invention are described above, the present invention can further be practiced with other preferred embodiments.

For example, in the sixth to tenth preferred embodiments described previously, the examples of the laminated structure-type chip parts 201, 221, 231, 241 and 251 are described. The arrangements of the laminated structure-type chip parts 201, 221, 231, 241 and 251 may be combined with the arrangements of the chip parts 1, 101, 121, 131 and 151 according to the first to fifth preferred embodiments.

Figure 58:
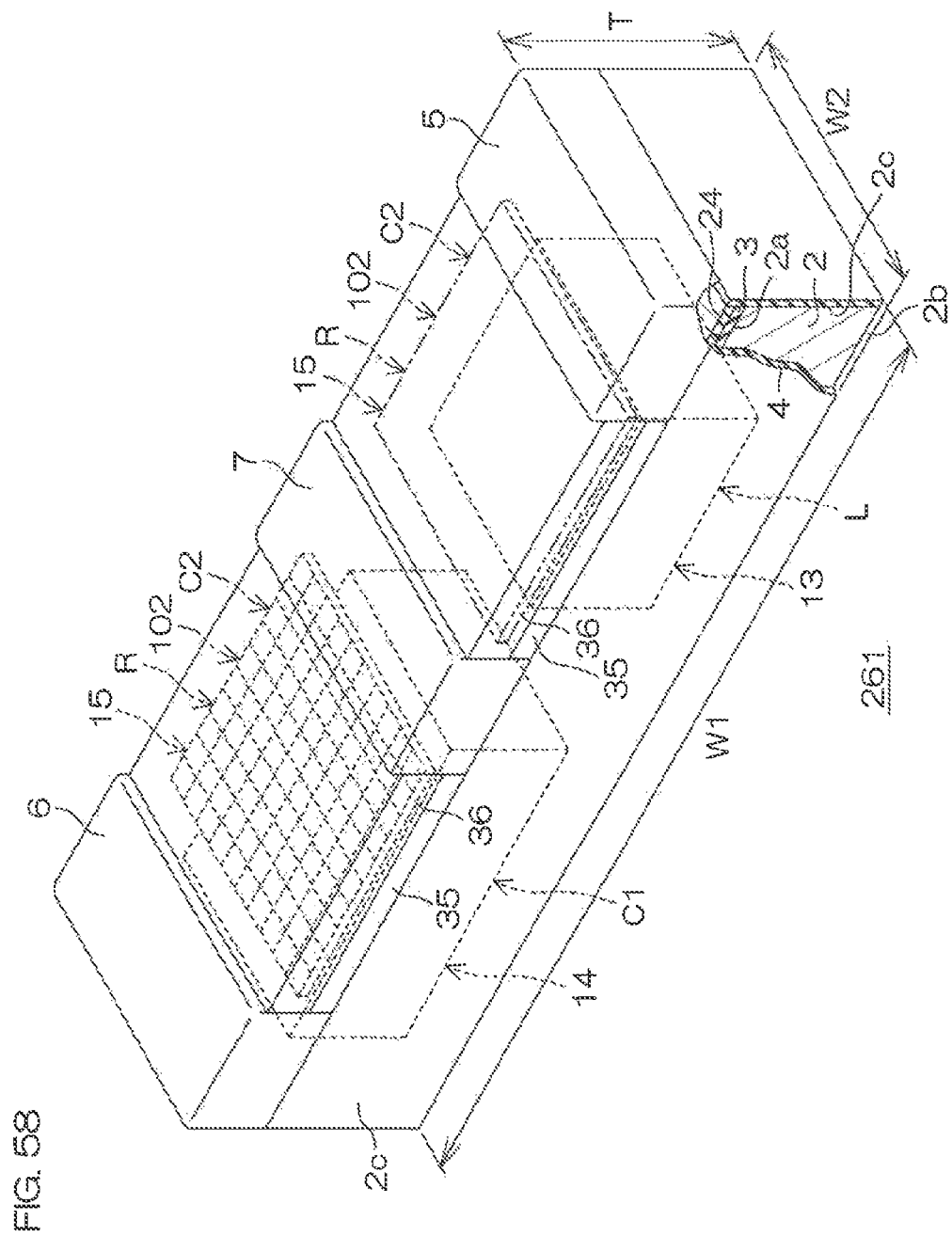
FIG. 58 is a partially cut-away perspective view of a chip part according to a first modification.

For example, when the laminated structure-type chip parts 201, 221, 231, 241 and 251 are combined with the chip parts 1, 101 and 121 according to the first to third preferred embodiments, the arrangement shown in FIG. 58 may be adopted. FIG. 58 is a partially cut-away perspective view of a chip part 261 according to a first modification. In FIG. 58, portions corresponding to the individual portions shown in FIGS. 1 to 57 are identified with the same reference symbols, and their description will be omitted.

As shown in FIG. 58, the chip part 261 is formed in the shape of a rectangular parallelepiped. The planar shape of the chip part 261 is rectangular, and a length W1 in the longitudinal direction thereof may be 0.8 to 1.0 mm, and a length W2 in the widthwise direction may be about 0.2 mm. The entire thickness T of the chip part 1 may be about 0.15 mm.

In the substrate 2, the coil L (the coil region 13) and the first capacitor C1 (the first capacitor region 14) described previously are formed. The coil L (the coil region 13) is formed between the first external electrode 5 and the first intermediate external electrode 7. The first capacitor C1 (the first capacitor region 14) is formed between the first intermediate external electrode 7 and the second external electrode 6. In this example, the second intermediate external electrode 8 is not formed.

As shown in FIG. 58, on the first capacitor region 14, the resistor portion R (the resistance region 15) described previously is laminated. Instead of the resistor portion R (the resistance region 15), the second capacitor region 102 may be laminated (see the two-dot chain lines of FIG. 58). Furthermore, on the resistor portion R (the resistance region 15), the second capacitor region 102 may be laminated (see the two-dot chain lines of FIG. 58). Hence, on the first capacitor region 14, the resistance region 15 and/or the second capacitor region 102 may be laminated.

Likewise, on the coil region 13, the resistance region 15 and/or the second capacitor region 102 may be laminated (see the two-dot chain lines of FIG. 58). Furthermore, the first intermediate external electrode 7 may be removed, and over the entire region on the first capacitor region 14 and the coil region 13, the resistance region 15 and/or the second capacitor region 102 may be laminated.

Since in the arrangement described above, it is possible to further enhance the flexibility of the design of the passive element regions, it is possible to provide the composite element-type chip part 261 in which a more complicated passive element circuit network is formed on the common substrate 2. Unlike the chip parts 1, 101 and 121 according to the first to third preferred embodiments, since it is not necessary to increase the area of the substrate 2 only for setting the resistance region 15 and/or the second capacitor region 102, it is possible to achieve the further miniaturization of the chip part 261. In this way, it is possible to reduce the mounting space of the chip part 261. It is also possible to increase the number of chip parts 261 obtained from one base substrate 90.

Figure 59:
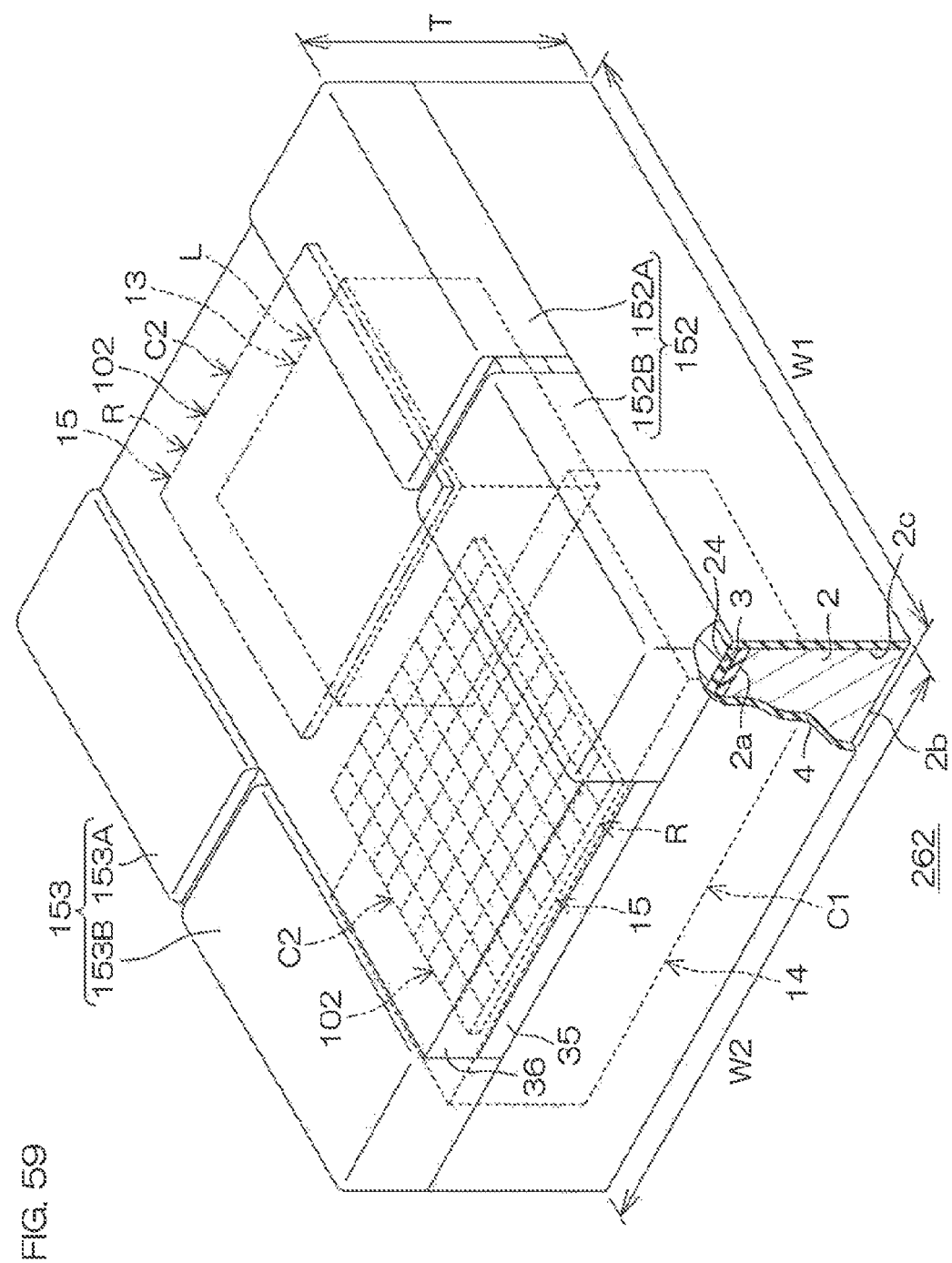
FIG. 59 is a partially cut-away perspective view of a chip part according to a second modification.

When the laminated structure-type chip parts 201, 221, 231, 241 and 251 are combined with the chip parts 131 and 151 according to the fourth and fifth preferred embodiments, the arrangement shown in FIG. 59 may be adopted. FIG. 59 is a partially cut-away perspective view of a chip part 262 according to a second modification. In FIG. 59, portions corresponding to the individual portions shown in FIGS. 1 to 58 are identified with the same reference symbols, and their description will be omitted.

As shown in FIG. 59, the chip part 262 is formed in the shape of a rectangular parallelepiped. The planar shape of the chip part 261 is formed in the shape of a rectangle in which length W1×length W2=about 0.4×0.4 mm. The entire thickness T of the chip part 262 may be about 0.15 mm.

As shown in FIG. 59, the first external electrode 152 includes the first external electrode portion 152A and the second external electrode portion 152B formed apart from each other. The second external electrode 153 includes the first external electrode portion 153A and the second external electrode portion 153B formed apart from each other.

In the substrate 2, the coil L (the coil region 13) and the first capacitor C1 (the first capacitor region 14) described previously are formed. The coil L (the coil region 13) is formed between the first external electrode portion 152A of the first external electrode 152 and the first external electrode portion 153A of the second external electrode 153. The first capacitor C1 (the first capacitor region 14) is formed between the second external electrode portion 152B of the first external electrode 152 and the second external electrode portion 153B of the second external electrode 153.

As shown in FIG. 59, on the first capacitor region 14, the resistor portion R (the resistance region 15) described previously is laminated. Instead of the resistor portion R (the resistance region 15), the second capacitor region 102 may be laminated (see the phantom line of FIG. 59). Furthermore, on the resistor portion R (the resistance region 15), the second capacitor region 102 may be laminated (see the two-dot chain lines of FIG. 59). Hence, on the first capacitor region 14, the resistance region 15 and/or the second capacitor region 102 may be laminated.

Likewise, on the coil region 13, the resistance region 15 and/or the second capacitor region 102 may be laminated (see the two-dot chain lines of FIG. 59). Furthermore, along a direction perpendicularly intersecting a direction in which the first external electrode 152 and the second external electrode 153 are opposite to each other, the resistance region 15 and/or the second capacitor region 102 may be laminated over the entire region on the first capacitor region 14 and the coil region 13.

Since in the arrangement described above, it is possible to further enhance the flexibility of the design of the passive element regions, it is possible to provide the composite element-type chip part 262 in which a more complicated passive element circuit network is formed on the common substrate 2. Unlike the chip parts 131 and 151 according to the fourth and fifth preferred embodiments, since it is not necessary to increase the area of the substrate 2 only for setting the resistance region 15 and/or the second capacitor region 102, it is possible to achieve the further miniaturization of the chip part 262. In this way, it is possible to reduce the mounting space of the chip part 262. It is also possible to increase the number of chip parts 262 obtained from one base substrate 90.

In the first to tenth preferred embodiments described previously, with respect to the arrangement of the coil region 13, the first capacitor region 14, the second capacitor region 102 and the resistance region 15, an example of the arrangement as shown in FIG. 60 may be adopted. FIG. 60 is a plan view showing an example of the arrangement of the passive element region. In FIG. 60, portions corresponding to the individual portions shown in FIGS. 1 to 59 are identified with the same reference symbols, and their description will be omitted.

As shown in FIG. 60, between the first external electrodes 5, 132, 152 and 202 (hereinafter simply referred to as a "first external electrode 265") and the second external electrodes 6, 133, 153 and 203 (hereinafter simply referred to as a "second external electrode 266"), a first passive element region 267, a second passive element region 268 and a third passive element region 269 are set. Any one of the coil region 13 described previously, the first capacitor region 14 described previously, the second capacitor region 102 described previously and the resistance region 15 described previously is formed in each of the first passive element region 267, the second passive element region 268 and the third passive element region 269.

The first passive element region 267 and the second passive element region 268 are aligned in a direction in which the first external electrode 265 and the second external electrode 266 are opposite to each other. The third passive element region 269 is arranged so as to be extended along the direction in which the first external electrode 265 and the second external electrode 266 are opposite to each other. With respect to a direction intersecting the direction in which the first external electrode 265 and the second external electrode 266 are opposite to each other, the third passive element region 269 is aligned both with the first passive element region 267 and the second passive element region 268.

The first passive element region 267 is opposite to each of the first external electrode 265, the second passive element region 268 and the third passive element region 269. Hence, the first passive element region 267 can be electrically connected to at least one of the first external electrode 265, the second passive element region 268 and the third passive element region 269. The first passive element region 267 can also be electrically connected to the second external electrode 266 by using a lead wiring.

The second passive element region 268 is opposite to each of the second external electrode 266, the first passive element region 267 and the third passive element region 269. Hence, the second passive element region 268 can be electrically connected to at least one of the second external electrode 266, the first passive element region 267 and the third passive element region 269. The second passive element region 268 can also be electrically connected to the first external electrode 265 by using a lead wiring.

The third passive element region 269 is opposite to each of the first external electrode 265, the second external electrode 266, the first passive element region 267 and the second passive element region 268. Hence, the third passive element region 269 can be electrically connected to at least one of the first external electrode 265, the second external electrode 266, the first passive element region 267 and the second passive element region 268.

With the example of the arrangement shown in FIG. 60, it is possible to provide the chip part that can correspond to various connection methods.

Instead of the example of the arrangement shown in FIG. 60, an example of the arrangement shown in FIG. 61 may be adopted. FIG. 61 is a plan view showing another example of the arrangement of the passive element region.

As shown in FIG. 61, between the first external electrode 265 and the second external electrode 266, the first passive element region 267, the second passive element region 268 and the third passive element region 269 are set.

The first passive element region 267 and the second passive element region 268 are aligned in a direction perpendicularly intersecting the direction in which the first external electrode 265 and the second external electrode 266 are opposite to each other. The third passive element region 269 is arranged so as to be extended along the direction in which the first external electrode 265 and the second external electrode 266 are opposite to each other. With respect to the direction in which the first external electrode 265 and the second external electrode 266 are opposite to each other, the third passive element region 269 is aligned both with the first passive element region 267 and the second passive element region 268.

The first passive element region 267 is opposite to each of the second external electrode 266, the second passive element region 268 and the third passive element region 269. Hence, the first passive element region 267 can be electrically connected to at least one of the second external electrode 266, the second passive element region 268 and the third passive element region 269. The first passive element region 267 can also be electrically connected to the first external electrode 265 by using a lead wiring.

The second passive element region 268 is opposite to each of the second external electrode 266, the first passive element region 267 and the third passive element region 269. Hence, the second passive element region 268 can be electrically connected to at least one of the second external electrode 266, the first passive element region 267 and the third passive element region 269. The second passive element region 268 can also be electrically connected to the first external electrode 265 by using a lead wiring.

The third passive element region 269 is opposite to each of the first external electrode 265, the first passive element region 267 and the second passive element region 268. Hence, the third passive element region 269 can be electrically connected to at least one of the first external electrode 265, the first passive element region 267 and the second passive element region 268. The third passive element region 269 can also be electrically connected to the second external electrode 266 by using a lead wiring.

With the example of the arrangement shown in FIG. 61, it is possible to provide the chip part that can correspond to various connection methods.

The examples of the arrangement of the passive element region shown in FIGS. 60 and 61 may be adopted on the surface insulating film 24 (the first surface insulating film 204), the second surface insulating film 207 and the third surface insulating film 232 in which the resistor portion R (the resistance region 15) and the second capacitor C2 (the second capacitor region 102) can be formed.

In the first to tenth preferred embodiments described previously, the substrate 2 may be an insulating substrate or a silicon substrate (semiconductor substrate). When the substrate 2 includes a silicon substrate (semiconductor substrate), the insulating film 3, the inner surface insulating film 19 and the like formed on the surface of the substrate 2 can easily be formed by a thermal oxidation method. Moreover, when the substrate 2 includes a silicon substrate, the chip parts 1, 101, 121, 131, 151, 201, 221, 231, 241 and 251 may further include a semiconductor element (semiconductor element region) formed in the substrate 2.

In the fifth preferred embodiment described previously, as shown in FIG. 41, the first passive element 161A, the second passive element 161B and the third passive element 161C are used to give the description of the connection example of the passive element (the passive element region). As a matter of course, the connection example of the passive element (the passive element region) using the first passive element 161A, the second passive element 161B and the third passive element 161C can be applied to the preferred embodiments other than the fifth preferred embodiment.

The chip parts described previously can be incorporated, as, for example, passive elements such as for a power supply circuit, a high-frequency circuit and a digital circuit, into mobile terminals such as an electronic device and a portable electronic device. In this case, the electronic device includes a housing that holds the circuit assembly 82 on which the chip parts 1, 101, 121, 131, 151, 201, 221, 231, 241 and 251 are mounted.

Although the preferred embodiments of the present invention are described in detail, these are simply specific examples used for clarifying the technical details of the present invention, the present invention should not be interpreted to be limited to these specific examples and the scope of the present invention is limited only by the scope of claims attached.

This application corresponds to Japanese Patent Application No. 2014-262842 filed in the Japan Patent Office on Dec. 25, 2014, and the entire disclosure of the application is incorporated herein by reference.

What is claimed is:

1. A chip part comprising:
   a semiconductor substrate, made of silicon, having an element formation surface and a back surface opposite to the element formation surface, and including a first trench formed in the element formation surface, the back surface of the substrate being a ground surface:
   a surface protective insulation film covering the element formation surface, having a first opening and a second opening which are formed apart from each other:
   a first electrode and a second electrode which are formed apart from each other on the element formation surface of the substrate, the first electrode filling the first opening and having a first extending portion extending out of the first opening over the surface protective insulation film, the second electrode filling the second opening and having a second extending portion extending out of the second opening over the surface protective insulation film: and
   a circuit network which is formed between the first electrode and the second electrode, the circuit network including
   a first passive element including a first conductive member embedded in the first trench, the first trench being formed between the first electrode and the second electrode, and
   a second passive element including a second conductive member formed on the substrate outside the first trench, wherein no electrode is formed on a surface other than the element formation surface of the substrate.

2. The chip part according to claim 1, wherein
   the first trench includes a first coil formation trench which is formed, in plan view, in a spiral shape, and
   the first passive element is a first coil including the first conductive member embedded in the first coil formation trench.

3. The chip part according to claim 1, wherein
   the first trench includes a first internal electrode formation trench and a second internal electrode formation trench which is formed, in plan view, apart from the first internal electrode formation trench, and
   the first passive element is a first capacitor which includes a first internal electrode formed with the first conductive member embedded in the first internal electrode formation trench and a second internal electrode formed with the first conductive member embedded in the second internal electrode formation trench.

4. The chip part according to claim 3, wherein
   the first internal electrode and the second internal electrode include opposite surfaces parallel to each other.

5. The chip part according to claim 1, wherein
   the second conductive member includes a resistor portion conductive member film, and
   the second passive element is a resistor portion.

6. The chip part according to claim 5, wherein
   the resistor portion conductive member film includes a resistive film formed on the substrate, and a plurality of conductor films formed apart on the resistive film, and
   a portion of the resistive film that is exposed between the conductor films adjacent to each other forms one resistor body.

7. The chip part according to claim 6, wherein
   a plurality of the resistor bodies having an equal resistance value are aligned in a matrix on the substrate, and
   the resistor portion conductive member film further includes a fuse portion which can be blown so as to electrically connect at least one of a plurality of the resistor bodies to the first electrode and the second electrode or so as to electrically separate the at least one of a plurality of the resistor bodies from the first electrode and the second electrode.

8. The chip part according to claim 1, wherein
   the second conductive member includes a first electrode film, and
   the second passive element is a second capacitor which includes the first electrode film, a first dielectric film formed on the first electrode film and a second electrode film formed on the first dielectric film.

9. The chip part according to claim 1, wherein the first passive element and the second passive element are aligned in a direction in which the first electrode and the second electrode are opposite to each other.

10. The chip part according to claim 1, wherein the first passive element and the second passive element are aligned in a direction intersecting a direction in which the first electrode and the second electrode are opposite to each other.

11. The chip part according to claim 1, wherein the circuit network further includes a third passive element which includes a third conductive member embedded in a second trench formed in the substrate.

12. The chip part according to claim 11, wherein
   the second trench includes a second coil formation trench which is formed, in plan view, in a spiral shape, and
   the third passive element is a second coil which includes the third conductive member embedded in the second coil formation trench.

13. The chip part according to claim 11, wherein
   the second trench includes a third internal electrode formation trench and a fourth internal electrode formation trench which is formed, in plan view, apart from the third internal electrode formation trench, and
   the third passive element is a third capacitor which includes a third internal electrode formed with the third conductive member embedded in the third internal electrode formation trench and a fourth internal electrode formed with the third conductive member embedded in the fourth internal electrode formation trench.

14. The chip part according to claim 11, wherein the first passive element, the second passive element and the third passive element are aligned in a direction in which the first electrode and the second electrode are opposite to each other.

15. The chip part according to claim 14, wherein the first passive element, the second passive element and the third passive element are connected in series.

16. The chip part according to claim 11, wherein the first passive element, the second passive element and the third passive element are aligned in a direction intersecting a direction in which the first electrode and the second electrode are opposite to each other.

17. The chip part according to claim 16, wherein
the first passive element includes one end which can be electrically connected to the first electrode and the other end which can be electrically connected to the second electrode,
the second passive element includes one end which can be electrically connected to the first electrode and the other end which can be electrically connected to the second electrode,
the third passive element includes one end which can be electrically connected to the first electrode and the other end which can be electrically connected to the second electrode, and
the chip part includes
a first internal connection portion which connects, on the substrate, at least two of the one ends of the first passive element, the second passive element and the third passive element and which is electrically connected to the first electrode and
a second internal connection portion which connects, on the substrate, at least two of the other ends of the first passive element, the second passive element and the third passive element and which is electrically connected to the second electrode.

18. The chip part according to claim 1, further comprising:
an insulating film which is formed on the substrate so as to cover the first passive element,
wherein the second passive element is formed on the insulating film.

19. The chip part according to claim 18, wherein the insulating film includes a flat surface.

20. The chip part according to claim 18, wherein the insulating film includes a USG film or an SOG film.

21. The chip part according to claim 18, wherein the insulating film has a thickness of 8000 to 15000 angstroms.

22. The chip part according to claim 18, wherein at least a part of the second passive element is formed, in plan view, in a region overlapping a region where the first passive element is formed.

* * * * *